(12) United States Patent
Tsukagoshi

(10) Patent No.: US 11,115,689 B2
(45) Date of Patent: *Sep. 7, 2021

(54) TRANSMISSION APPARATUS, TRANSMISSION METHOD, RECEPTION APPARATUS, AND RECEPTION METHOD

(71) Applicant: SONY CORPORATION, Tokyo (JP)

(72) Inventor: Ikuo Tsukagoshi, Tokyo (JP)

(73) Assignee: SONY CORPORATION, Tokyo (JP)

( * ) Notice: Subject to any disclaimer, the term of this patent is extended or adjusted under 35 U.S.C. 154(b) by 122 days.

This patent is subject to a terminal disclaimer.

(21) Appl. No.: 15/765,898

(22) PCT Filed: Oct. 11, 2016

(86) PCT No.: PCT/JP2016/080085
§ 371 (c)(1),
(2) Date: Apr. 4, 2018

(87) PCT Pub. No.: WO2017/065128
PCT Pub. Date: Apr. 20, 2017

(65) Prior Publication Data
US 2019/0116386 A1    Apr. 18, 2019

(30) Foreign Application Priority Data

Oct. 13, 2015 (JP) .............................. JP2015-202464

(51) Int. Cl.
*H04N 21/2343* (2011.01)
*H03M 7/30* (2006.01)
(Continued)

(52) U.S. Cl.
CPC .......... *H04N 21/2343* (2013.01); *H03M 7/30* (2013.01); *H04N 21/2356* (2013.01);
(Continued)

(58) Field of Classification Search
CPC ........... H04L 29/08792; H04L 29/0651; H04L 65/4084
(Continued)

(56) References Cited

U.S. PATENT DOCUMENTS

2002/0090138 A1    7/2002  Hamanaka
2008/0082482 A1*   4/2008  Amon ................ H04N 21/2662
(Continued)

FOREIGN PATENT DOCUMENTS

EP       2 903 268 A1    8/2015
JP       H11-266457 A    9/1999
(Continued)

OTHER PUBLICATIONS

ISO/IEC 2010, "Text of ISO/IEC 23001-6: Dynamic adaptive streaming over HTTP (DASH)", MPEG-B Systems, International Organization for Standardization Organisation Internationale De Normalisation ISO/IEC JTC1/SC29/WG11 Coding of Moving Pictures and Audio, Oct. 2010, 10 pages.

(Continued)

*Primary Examiner* — Mahran Y Abu Roumi
(74) *Attorney, Agent, or Firm* — Oblon, McClelland, Maier & Neustadt, L.L.P.

(57) ABSTRACT

Image data having ultra-high definition at a high frame rate is processed to obtain image data, having a basic format, from which an image having high definition at a basic frame rate is to be obtained, image rate, having a first enhancement format, from which an image having high definition at a high frame rate is to be obtained, image data, having a second enhancement format, from which an image having ultra-high definition at a basic frame rate is to be obtained, and image data, having a third enhancement format, from which an image having ultra-high definition at a high frame rate is to be obtained. A basic video stream containing an encoded (Continued)

image data of the image data having the basic format, and a predetermined number of enhancement video streams containing the encoded image data of the image data having the first, second, and third enhancement formats are produced.

20 Claims, 33 Drawing Sheets

(51) Int. Cl.

| | | |
|---|---|---|
| H04N 21/462 | (2011.01) | |
| H04N 21/266 | (2011.01) | |
| H04N 21/262 | (2011.01) | |
| H04N 21/845 | (2011.01) | |
| H04N 21/81 | (2011.01) | |
| H04N 21/854 | (2011.01) | |
| H04N 21/235 | (2011.01) | |
| H04N 21/236 | (2011.01) | |
| H04N 21/2662 | (2011.01) | |
| H03M 7/40 | (2006.01) | |

(52) U.S. Cl.
CPC ........... *H04N 21/23614* (2013.01); *H04N 21/234327* (2013.01); *H04N 21/234363* (2013.01); *H04N 21/234381* (2013.01); *H04N 21/266* (2013.01); *H04N 21/2662* (2013.01); *H04N 21/26258* (2013.01); *H04N 21/462* (2013.01); *H04N 21/4621* (2013.01); *H04N 21/816* (2013.01); *H04N 21/8456* (2013.01); *H04N 21/85406* (2013.01); *H03M 7/4018* (2013.01)

(58) Field of Classification Search
USPC ........................................................ 709/219
See application file for complete search history.

(56) References Cited

U.S. PATENT DOCUMENTS

| | | | | |
|---|---|---|---|---|
| 2013/0215975 | A1* | 8/2013 | Samuelsson | H04N 19/31 375/240.25 |
| 2014/0168366 | A1* | 6/2014 | Ichiki | H04N 19/31 348/43 |
| 2014/0366070 | A1 | 12/2014 | Lee et al. | |
| 2015/0229878 | A1* | 8/2015 | Hwang | H04N 7/0125 348/446 |
| 2015/0245046 | A1* | 8/2015 | Tsukuba | H04N 19/46 375/240.25 |
| 2016/0134902 | A1* | 5/2016 | Tsukagoshi | H04N 21/2362 725/116 |

FOREIGN PATENT DOCUMENTS

| | | |
|---|---|---|
| JP | 2008-543142 A | 11/2008 |
| JP | 2015-525008 A | 8/2015 |
| WO | 2008/086423 A2 | 7/2008 |
| WO | 2014/050597 A1 | 4/2014 |
| WO | 2014/203515 A1 | 12/2014 |
| WO | 2015/076277 A1 | 5/2015 |
| WO | 2015/095361 A1 | 6/2015 |
| WO | 2017/043504 A1 | 3/2017 |

OTHER PUBLICATIONS

International Search Report dated Nov. 15, 2016 in PCT/JP2016/080085 filed Oct. 11, 2016.

Stockhammer, et al., "Text of ISO/IEC 23001-6: Dynamic adaptive streaming over HTTP (DASH)", International Organization for Standardization, ISO/IEC JTC1/SC29/WG11, Guangzhou, China, Oct. 2010, https://www.itscj.ipsj.or.jp/sc29/open/29view/29n11662c.htm.

* cited by examiner

F I G. 9

HEVC SPS (Sequence Parameter Set)

| SPS elements | VALUE | |
|---|---|---|
| general_level_idc | 156 | → Level 5.2 |
| general_profile_idc | 7 | → Scalable Main 10 Profile |
| sps_max_sublayer_minus1 (=j) | 3 | |
| sublayer_level_present_flag[j-1] | 1 | |
| sublayer_level_idc[j-1] | 153 | → Level 5.1 |
| sublayer_profile_idc[j-1] | 7 | → Scalable Main 10 Profile |
| sublayer_level_present_flag[j-2] | 1 | |
| sublayer_level_idc[j-2] | 126 | → Level 4.2 |
| sublayer_profile_idc[j-2] | 2 | → Main 10 Profile |
| sublayer_level_present_flag[j-3] | 1 | |
| sublayer_level_idc[j-3] | 123 | → Level 4.1 |
| sublayer_profile_idc[j-3] | 2 | → Main 10 Profile |

| Syntax | No. of bits | format |
|---|---|---|
| video_scalability_SEI ( ) { | | |
| video_scalability_id | 16 | uimsbf |
| video_scalability_length | 8 | uimsbf |
| temporal_scalable_flag | 1 | bslbf |
| spatial_scalable_flag | 1 | bslbf |
| if (spatial_scalable_flag ){ | | |
| scaling_ratio | 3 | uimsbf |
| reserved | 3 | bslbf |
| } | | |
| else { | | |
| reserved | 6 | bslbf |
| } | | |
| if (temporal_scalable_flag) { | | |
| picture_blending_flag | 1 | bslbf |
| if ( picture_blending_flag ){ | | |
| blend_coef_alpha_alternate_picture | 3 | uimsbf |
| blend_coef_beta_alternate_picture | 3 | uimsbf |
| blend_coef_alpha_current_picture | 3 | uimsbf |
| blend_coef_beta_current_picture | 3 | uimsbf |
| reserved | 2 | bslbf |
| } | | |
| else { | | |
| reserved | 15 | bslbf |
| } | | |
| } | | |

| | | |
|---|---|---|
| temporal_scalable_flag (1bit) | | WHETHER OR NOT STREAM IS TEMPORAL SCALABLE STREAM IS INDICATED. |
| | "1" | TEMPORAL SCALABLE |
| | "0" | NOT TEMPORAL SCALABLE |
| spatial_scalable_flag (1bit) | | WHETHER OR NOT STREAM IS SPATIAL SCALABLE STREAM IS INDICATED. |
| | "1" | SPATIAL SCALABLE |
| | "0" | NOT SPATIAL SCALABLE |
| scaling_ratio (3bits) | | RATIO OF SPATIAL SCALABLE (ENLARGEMENT RATIO IN ONE-DIMENSIONAL DIRECTION OF ENLARGEMENT TO BASIS) IS INDICATED. |
| | 000 | reserved |
| | 001 | TWICE |
| | 010 | THREE TIMES |
| | 011 | FOUR TIMES |
| picture_blending_for_base_stream_flag (1bit) | | WHETHER OR NOT PICTURE MIXING PROCESSING IS EXECUTED FOR BASIC STREAM IS INDICATED. |
| | "1" | MIXING PROCESSING IS EXECUTED |
| | "0" | NO MIXING PROCESSING IS EXECUTED |
| blend_coef_alpha_alternate_picture (8bits) | | COEFFICIENT (p) BY WHICH PICTURE OF BASIC LAYER IS MULTIPLIED |
| blend_coef_alpha_current_picture (8bits) | | (COEFFICIENT (r) BY WHICH CURRENT PICTURE (IN ENHANCEMENT STREAM) IS MULTIPLIED |
| | 0x0 | 0 |
| | 0x1 | 0.2 |
| | 0x2 | 0.25 |
| | 0x3 | 0.33 |
| | 0x4 | 0.5 |
| | 0x5 | 0.67 |
| | 0x6 | 0.75 |
| | 0x7 | 0.8 |
| | 0x8 | 1 |
| blend_coef_beta_alternate_picture (8bits) | | COEFFICIENT (q) BY WHICH PICTURE OF ENHANCEMENT LAYER IS MULTIPLIED |
| blend_coef_beta_current_picture (8bits) | | COEFFICIENT (s) BY WHICH CURRENT PICTURE (IN ENHANCEMENT STREAM) IS MULTIPLIED |
| | 0x0 | 0 |
| | 0x1 | 0.2 |
| | 0x2 | 0.25 |
| | 0x3 | 0.33 |
| | 0x4 | 0.5 |
| | 0x5 | 0.67 |
| | 0x6 | 0.75 |
| | 0x7 | 0.8 |
| | 0x8 | 1 |

FIG. 13

| Syntax | No. of Bits | Format |
|---|---|---|
| video_scalability_information_descriptor () { | | |
| video_scalability_information_descriptor_tag | 8 | uimsbf |
| video_scalability_information_descriptor_length | 8 | uimsbf |
| temporal_scalable_flag | 1 | bslbf |
| spatial_scalable_flag | 1 | bslbf |
| if (spatial_scalable_flag) { | | |
| scaling_ratio | 3 | uimsbf |
| reserved | 5 | 0x0 |
| } | | |
| else { | | |
| reserved | 6 | 0x0 |
| } | | |
| if (temporal_scalable_flag) { | | |
| picture_blending_flag | 1 | bslbf |
| if ( picture_blending_flag ){ | | |
| blend_coef_alpha_alternate_picture | 3 | uimsbf |
| blend_coef_beta_alternate_picture | 3 | uimsbf |
| blend_coef_alpha_current_picture | 3 | uimsbf |
| blend_coef_beta_current_picture | 3 | uimsbf |
| reserved | 4 | 0x0 |
| } | | |
| else { | | |
| reserved | 15 | 0x0 |
| } | | |
| } | | |

```
MPD

<AdaptationSet
  <Representation
    frameRate="60"
    codecs="hev1.A.L123.xx"
    id= "tag0"  >
    <BaseURL>video-basesubbitstream.mp4</BaseURL>
  </Representation>
  <Representation
    <Subrepresentation
      frameRate="120"
      codecs="hev1.B.L126.xx"
      id= "tag1"  >
      dependencyid= "tag0" >
    </Subrepresentation>
    <Subrepresentation
      frameRate="60"
      codecs="hev1.C.L153.xx"
      id= "tag2"  >
      dependencyid= "tag0" >
    </Subrepresentation>
    <Subrepresentation
      frameRate="120"
      codecs="hev1.D.L156.xx"
      id= "tag3"
      dependencyid= "tag0,tag1,tag2" >
    </Subrepresentation>
    <BaseURL>video-enhancedsubset.mp4</BaseURL>
  </Representation>
</AdaptationSet>
```

FIG.18

FIG. 28
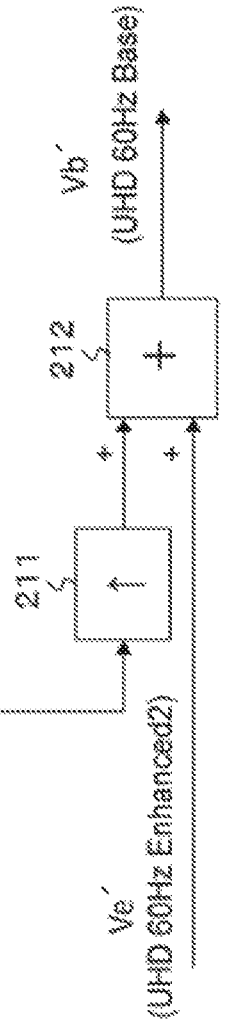
(a)
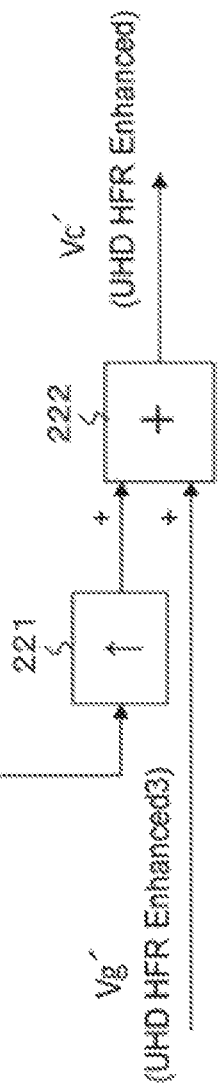
(b)

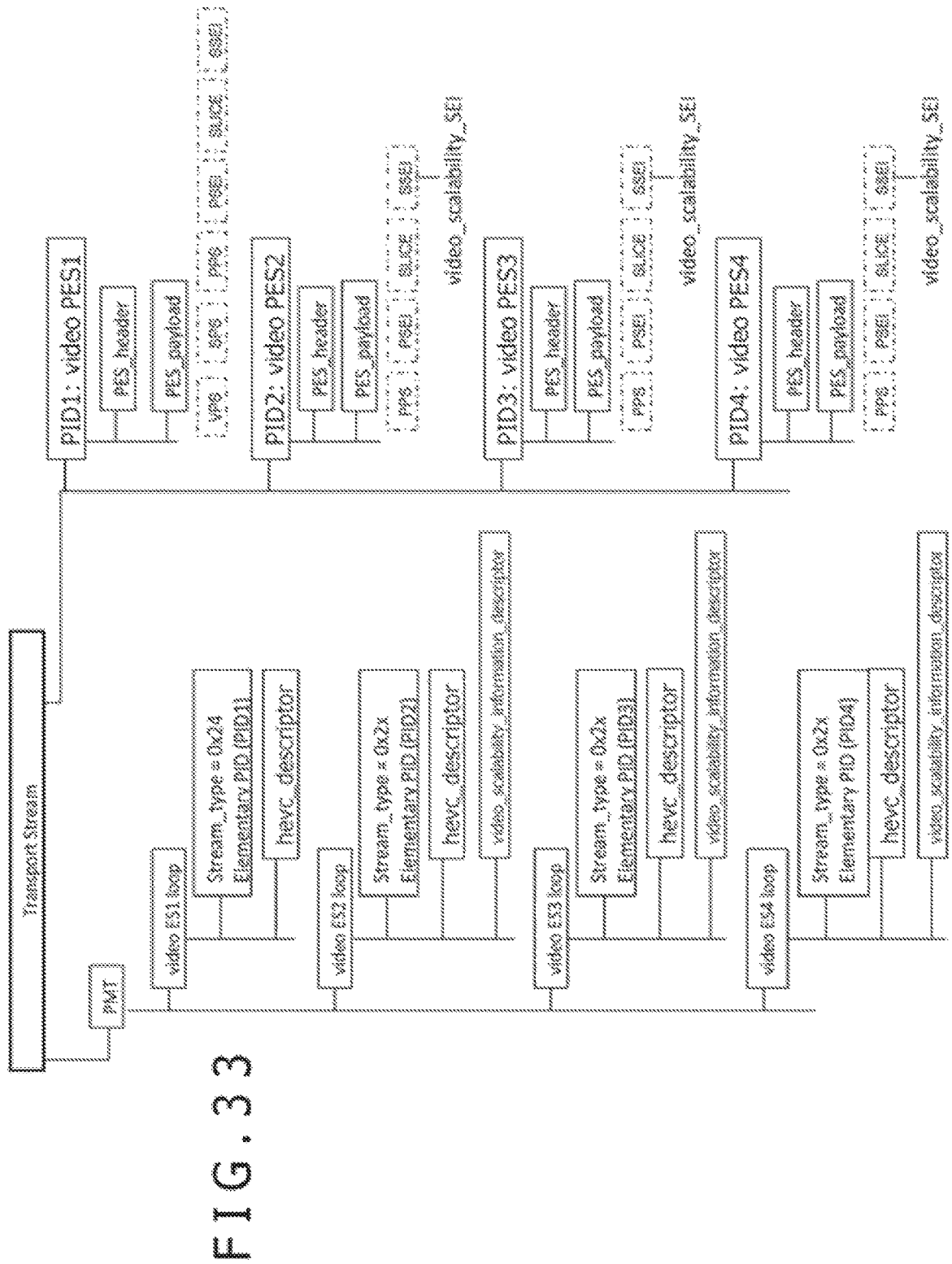
F I G. 33

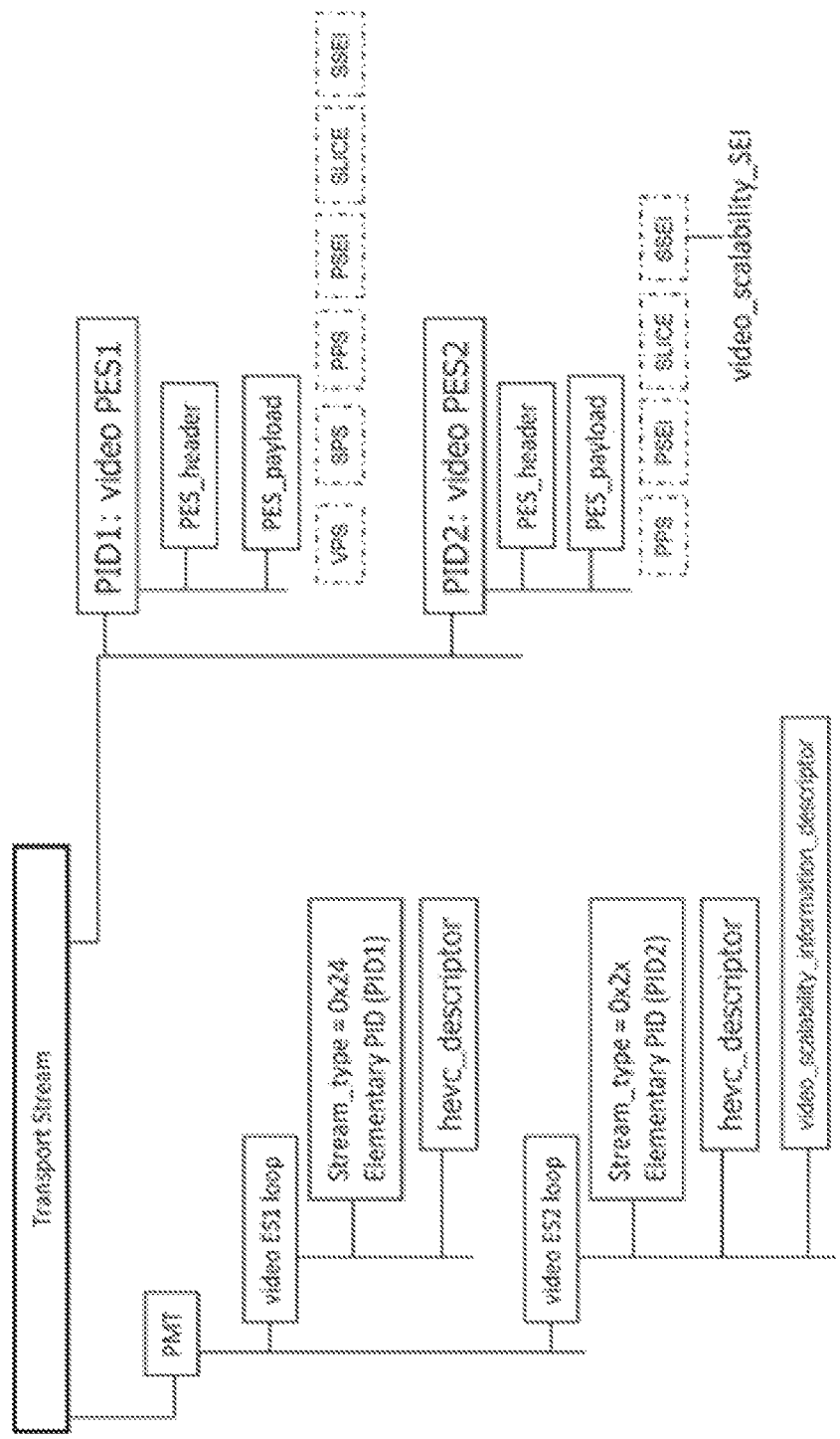
F I G. 34

TRANSMISSION APPARATUS, TRANSMISSION METHOD, RECEPTION APPARATUS, AND RECEPTION METHOD

TECHNICAL FIELD

The present technique relates to a transmission apparatus, a transmission method, a reception apparatus, and a reception method, and more particularly to a transmission apparatus and the like each of which transmits image data exhibiting ultra-high definition at a high frame rate.

BACKGROUND ART

In a reception environment in which a fixed receiver and a mobile receiver hold the same transmission band in common, for the purpose of efficiently utilizing a transmission bit rate, an image service (video service) for the fixed receiver in which definition is considered to be high, and an image service for a mobile receiver in which definition is considered to be middle hold a stream in common. In this case, it is considered that the whole bit rate can be reduced as compared with a so-called simulcast service for separately carrying out a service for the fixed receiver and a service for the mobile receiver. For example, patent literary document 1 describes that the media encoding is scalably carried out to produce a stream of a basic layer for an image service providing low definition, and a stream of an enhancement layer for an image service providing high definition, and a broadcasting signal containing these streams is transmitted.

On the other hand, when the smoothness or sharpness of the motion in a sport scene or the like is required, a so-called video service at a high frame rate is required in which a shutter speed is set at a high speed to increase a frame rate. When the service at the high frame rate is carried out, it is considered that a moving image which is captured with a camera using at a high speed frame shutter is converted into a moving image sequence having a lower frequency than that in case of the moving image to transmit the resulting moving image sequence. The image obtained by using the high speed frame shutter offers an effect in which the motion blur is improved to realize an image quality having the high sharpness. On the other hand, the image obtained by using the high speed frame shutter involves a problem about strobing effect by not displaying the whole video at the high frame rate, but displaying only a part thereof when the compatibility with the pass receiver at the normal frame rate is intended to be obtained. The present applicant previously proposed the technique with which the past receiver for converting a material by an image captured with a high speed frame shutter to carry out the decoding at the normal frame rate is made to display an image above a certain image quality (refer to patent literary document 2).

CITATION LIST

Patent Literature

[PTL 1]
JP-T-2008-543142
[PTL 2]
PCT Patent Publication No. WO2015/076277

SUMMARY

Technical Problem

It is an object of the present technique to transmit image data exhibiting ultra-high definition at a high frame rate so that backward compatibility is satisfactorily feasible to be obtained on a reception side.

Solution to Problem

A concept of the present technique lies in: a transmission apparatus provided with an image processing portion, an image encoding portion, and a transmission portion. In this case, the image processing portion serves to process image data, having a basic format, from which an image having high definition at a basic frame rete is to be obtained, image data, having a first enhancement format, from which an image having high definition at a high frame rate is to be obtained, image data, having a second enhancement format, from which an image having ultra-high definition at a basic frame rate is to be obtained, and image data, having a third second enhancement format, from which an image having ultra-high definition at a high frame rate is to be obtained by processing image data having ultra-high definition at a high frame rate. The image encoding portion serves to produce a basic video stream containing encoded image data of the image data having the basic format, and a predetermined number of enhancement video streams containing encoded image data of the image data having the first to third enhancement formats. The transmission portion serves to transmit a container having a predetermined format containing the basic stream and the predetermined number of enhancement video streams.

The image processing portion executes mixing processing at a first ratio in units of temporally continuous two pictures for the image data having the ultra-high definition at the high frame rate to obtain first image data as image data having a basic frame rate, and executes mixing processing at a second ratio in units of the temporally continuous two pictures to obtain second image data as image data having an enhancement frame at a high frame rate.

The image processing portion executes down-scale processing for the first image data to obtain the image data having the basic format, and obtains a difference between third image data obtained by executing up-scale processing for the image data having the basic format, and the first image data to obtain the image data having the second enhancement format.

In addition, the image processing portion executes down-scale processing for the second image data to obtain the image data having the first enhancement format, and obtains a difference between fourth image data obtained by executing up-scale processing for the image data having the first enhancement format, and the second image data to obtain the image data having the third enhancement format.

With the present technique, the image processing portion processes image data having the high frame rate and the ultra-high definition. As a result, there are obtained the image data, having the basic format, from which the image having the high definition at the basic frame rate is to be obtained, the image data, having the first enhancement format, from which the image having the high definition at the high frame rate is to be obtained, the image data, having the second enhancement format, from which the image having the ultra-high definition at the basic frame rate is to be obtained, and image data, having the third enhancement format from which the image having the ultra-high definition at the high frame rate is to be obtained.

Here, the down-scale processing is executed for the first image data obtained by executing the mixing processing at the first ratio in units of the temporally continuous two pictures in image data having the ultra-high definition at the high frame rate, thereby obtaining the image data having the basic format. The difference between the third image data obtained by executing the up-scale processing for the image data having the basic format, and the first image data is obtained, thereby obtaining the image data having the second enhancement format. The down-scale processing is executed for the second image data obtained by executing the mixing processing at the second ratio in units of the temporally continuous two pictures, thereby obtaining the image data having the first enhancement format. The difference between the fourth image data obtained by executing the up-scale processing for the image data having the first enhancement format, and the second image data is obtained, thereby obtaining the image data having the third enhancement format.

The image encoding portion produces the basic video stream containing the encoded image data of the image data having the basic format, and a predetermined number of enhancement video streams containing the encoded image data of the image data having the first to third enhancement formats. For example, the image encoding portion may also be configured to produce the basic video stream containing encoded image data of the image data having the basic format, three enhancement video streams containing each pieces of encoded image data of the image data having the first to third enhancement formats or one enhancement video stream containing the whole of encoded image data of the image data having the first to third enhancement format. Then, the transmission portion transmits the container having the predetermined format and containing the basic stream and the predetermined number of enhancement video streams.

In such a way, with the present technique, there are transmitted the basic video stream containing the encoded image data of the image data, having the basic format from which the image having the high definition at the basic frame rate is to be obtained, and a predetermined number of enhancement video streams. In this case, a predetermined number of enhancement video streams contain the image data having the first enhancement format from which the image having the high definition at the high frame rate is to be obtained, the image data, having the second enhancement format, from which the image having the ultra-high definition at the basic frame rate is to be obtained, and the encoded image data of the image data, having the third enhancement format, from which the image having the ultra-high definition at the high frame rate is to be obtained. For this reason, the image data exhibiting the ultra-high definition is transmitted so that the backward compatibility is satisfactorily feasible to be obtained on the reception side.

For example, in case of the receiver having the decoding ability to be able to process the image data having the high definition at the basic frame rate, by processing only the basic video stream, the image having the high definition at the basic frame rate can be displayed. In addition, for example, in case of the receiver having the decoding ability to be able to process the image data having the high definition at the high frame rate, by processing both the basic video stream and the enhancement stream, the image having the high definition at the high frame rate can be displayed. In addition, for example, in case of the receiver having the decoding ability to be able to process the image data having the ultra-high definition at the basic frame rate, by processing both the basic video stream and the enhancement stream, the image having the ultra-high definition can be displayed at the basic frame rate. In addition, for example, in case of the receiver having the decoding ability to be able to process the image data having the ultra-high definition at the high frame rate, by processing both the basic video stream and the enhancement stream, the image having the ultra-high definition at the high frame rate can be displayed.

In addition, with the present technique, the down-scale processing is executed for first image data which is obtained by executing the mixing processing at the first ratio in units of the temporally continuous two pictures for the image data exhibiting the ultra-high definition at the high frame rate, thereby obtaining the image data having the basic format. For this reason, the image having the high definition at the basic frame rate, which is displayed by processing only the video stream on the reception side becomes a smooth image in which the strobing effect is suppressed.

It should be noted that with the present technique, for example, the transmission apparatus may further include an information inserting portion. The information inserting portion serves to insert identification information exhibiting temporal scalable into the encoded image data of the image data having the first enhancement format, and/or a container position corresponding to the encoded image data, insert identification information exhibiting spatial scalable into the encoded image data of the image data having the second enhancement format, and/or a container position corresponding to the encoded image data, and insert identification information exhibiting the temporal scalable and the spatial scalable into the encoded image data of the image data having the third enhancement format, and/or the container position corresponding to the encoded image data. By the insertion of the identification information, the reception side can readily grasp whether the pieces of image data having the respective enhancement formats pertain to the spatial scalable or the temporal scalable.

In this case, for example, the information inserting portion may be configured to further insert information exhibiting a ratio of the spatial scalable into the encoded image data of the image data having the second and third enhancement formats, and/or the container position corresponding to the encoded image data. The reception side can suitably execute the processing for the spatial scalable by using the information exhibiting the ratio of the spatial scalable, and can satisfactorily obtain the image data having the ultra-high definition.

In addition, in this case, the information inserting portion may be configured to further insert identification information exhibiting that the image data having the basic format is image data obtained by executing the mixing processing into the pieces of encoded image data of the image data having the first and third enhancement formats, and/or the container position corresponding to the encoded image data. By the insertion of the identification information, the reception side can readily grasp that the image data having the basic format is image data obtained by executing the mixing processing.

In addition, in this case, the information inserting portion may be configured to further insert ratio information in the mixing processing (first ratio information and second ratio information) into the pieces of encoded image data of the image data having the first and third enhancement formats, and/or the container position corresponding to the encoded image data. The reception side can suitably execute the processing for the temporal scalable and can satisfactorily obtain the image data at the high frame rata by using the ratio information in the mixing processing.

In addition, with the present technique, for example, the transmission apparatus may be configured to further include a transmission portion for transmitting a metafile having meta information with which a reception apparatus acquires a basic video stream and a predetermined number of enhancement video streams. In this case, the information exhibiting a response of scalability may be inserted into the metafile. The reception side can readily recognize the response of the scalability and can efficiently acquire only the necessary stream or the encoded image data to efficiently process only the necessary stream or the encoded image data from the information exhibiting the response of the scalability which is inserted into the metafile in such a way.

In addition, other concept of the present technique lies in a reception apparatus including a reception portion. In this case, the reception portion serves to receive a container having a predetermined format containing a basic video stream having encoded image data of image data, having a basic format, from which an image having high definition at a basic frame rate is to be obtained, and a predetermined number of enhancement video streams containing image data, having a first enhancement format, from which image having high definition at a high frame rate is to be obtained, image data, having a second enhancement format, from which image having ultra-high definition at a basic frame rate is to be obtained, and encoded image data of image data, having a third enhancement format, from which image having ultra-high definition at a high frame rate is to be obtained.

Down-scale processing is executed for first image data which is obtained by executing mixing processing at a first ratio in units of temporally continuous two pictures in the image data having the ultra-high definition at the high frame, thereby obtaining the image data having the basic format.

A difference between third image data which is obtained by executing up-scale processing for the image data having the basic format, and the first image data is obtained, thereby obtaining the image data having the second enhancement format.

Down-scale processing is executed for second image data which is obtained by executing mixing processing at a second ratio in units of the temporally continuous two pictures, thereby obtaining the image data having the first enhancement format.

A difference between fourth image data which is obtained by executing up-scale processing for the image data having the first enhancement format, and the second image data is obtained, thereby obtaining the image data having the third enhancement format.

The reception apparatus further includes a processing portion. The processing portion serves to obtain image data having high definition at the basic frame rate by executing only the basic video stream, or obtain image data having high resolution at the high frame rate by executing a part of or the whole of the predetermined number of enhancement video streams, image data having the ultra-high definition at the basic frame rate, or image data having the ultra-high definition at the high frame rate.

With the present technique, the reception portion receives a container having a predetermined format containing the basic video stream and the predetermined number of enhancement video streams. The basic video stream has encoded image data of the image data, having the basic format, from which image having the high definition at the basic frame rate is to be obtained. The predetermined number of enhancement video streams have the encoded image data of the image data, having the first enhancement format, from which the image having the high definition at the high frame rate is to be obtained, the image data, having the second enhancement format, from which the image having the ultra-high definition at the basic frame rate is to be obtained, and the image data, having the third enhancement format, from which the image having the ultra-high definition at the high frame rate is to be obtained.

Here, the down-scale processing is executed for the first image data which is obtained by executing the mixing processing having the first ratio in units of temporally continuous two pictures in the image data having ultra-high definition at the high frame rate, thereby obtaining the image data having the basic format. A difference between the third image data which is obtained by executing the up-scale processing for the image data having the basic format, and the first image data is obtained, thereby obtaining the image data having the second enhancement format. The down-scale processing is executed for the second image data which is obtained by executing the mixing processing having the second ratio in units of the temporally continuous two pictures, thereby obtaining the image data having the first enhancement format. A difference between the fourth image data which is obtained by executing the up-scale processing for the image data having the first enhancement format, and the second image data is obtained, thereby obtaining the image data having the third enhancement format.

The processing portion obtains the image data having the high definition at the basic frame rate by executing only the basic video stream, or obtains the image data having the high resolution at the high frame rate by executing a part of or the whole of the predetermined number of enhancement video streams, the image data having the ultra-high definition at the basic frame rate, or the image data having the ultra-high definition at the high frame rate.

In such a way, with the present technique, the image data having the high definition at the basic frame rate can be obtained by executing only the basic video stream containing the encoded image data of the image data, having the basic format, from which the image having the high definition at the basic frame rate is to be obtained. That is to say, in case of the receiver having the decoding ability to be able to process the image data having the high definition at the basic frame rate, the image having the high definition at the basic frame rate can be displayed by processing only the basic video stream. As a result, the backward compatibility can be realized.

Here, the down-scale processing is executed for the first image data which is obtained by executing the mixing processing having the first ratio in units of temporally continuous two pictures in the image data having the ultra-high definition at the high frame rate, thereby obtaining the image data having the basic format. For this reason, the image having the high definition at the basic frame rate which is displayed by processing only the basic video stream becomes a smooth image in which the strobing effect is suppressed.

In addition, the image data having the high definition at the high frame rate, the image data having the ultra-high definition at the basic frame rate, or the image data having the ultra-high definition at the high frame rate can be obtained by processing a part of or the whole of the basic video stream and the predetermined number of enhancement video streams. That is to say, in case of the receiver having the decoding ability to be able to process the image data having the high definition at the high frame rate, the image having the high definition at the high frame rate can be displayed by processing both the basic video stream and the enhancement stream.

In addition, in case of the receiver having the decoding ability to be able to process the image data having the ultra-high definition at the basic frame rate, the image having the ultra-high definition at the basic frame rate can be displayed by processing both the basic video stream and the enhancement stream. In addition, in case of the receiver having the decoding ability to be able to process the image data having the ultra-high definition at the high frame rate, the image having the ultra-high definition at the high frame rate can be displayed by processing both the basic video stream and the enhancement stream.

It should be noted that when with the present technique, for example, the information exhibiting the ratio of the spatial scalable is inserted into the pieces of encoded image data of the image data having the second and third enhancement formats, and/or the container position corresponding to the encoded image data, and the processing portion obtains the image data having the ultra-high definition at the basic frame rate or the image data having the ultra-high definition at the high frame rate, the information exhibiting the ratio of the inserted spatial scalable may be used. In this case, the processing of the spatial scalable can be suitable executed, and the image data having the ultra-high definition can be satisfactorily obtained.

In addition, with the present technique, when, for example, the information associated with the first ratio and the information associated with the second ratio are inserted into the encoded image data of the pieces of image data having the first and third enhancement formats, and/or the container positions corresponding to the encoded image data, and when the processing portion obtains the image data having the high definition at the high frame rate or the image data having the ultra-high definition at the high frame rate, the processing portion may use the inserted information associated with the first ratio and the inserted information associated with the second ratio. In this case, the processing of the temporal scalable can be suitable executed, and the image data at the high frame rate can be satisfactorily obtained.

Advantageous Effects of Invention

According to the present technique, the image data exhibiting the ultra-high definition at the high frame rate can be transmitted so that the backward compatibility is satisfactorily feasible to be obtained on the reception side. It should be noted that the effect described in the present description is merely an exemplification and is by no means limited, and any of the additional effects may also be offered.

BRIEF DESCRIPTION OF DRAWINGS

FIG. 9 is a diagram depicting an example of elements of SPS (VPS).

FIG. 11 is a diagram depicting an example of a structure of video scalability SEI.

FIG. 12 is a view depicting contents of main information in the example of the structure of the video scalability SEI.

FIG. 13 is a diagram depicting an example of a structure of a video scalability information descriptor.

FIG. 18 is a view depicting an example of a description of an MPD file in case of transmission of 2 stream structures.

FIG. 28 is a block diagram depicting an example of a configuration of the signal processing portions for executing the processing of the inverse processes 2, 3.

FIG. 33 is a diagram depicting an example of a configuration of a transport stream in case of transmission of 4 stream structures.

FIG. 34 is a diagram depicting an example of a configuration of a transport stream in case of transmission of 2 stream structures.

DESCRIPTION OF EMBODIMENT

Hereinafter, a mode for carrying out the invention (hereinafter referred to as "an embodiment") will be described. It should be noted that the description will be given in the following order.
1. Embodiment
2. Modified Changes 1. Embodiment

[Outline of MPEG-DASH Based Stream Delivery System]

Firstly, a description will be given with respect to an outline of an MPEG-DASH based stream delivery system to which the present technique can be applied.

Figure 1:
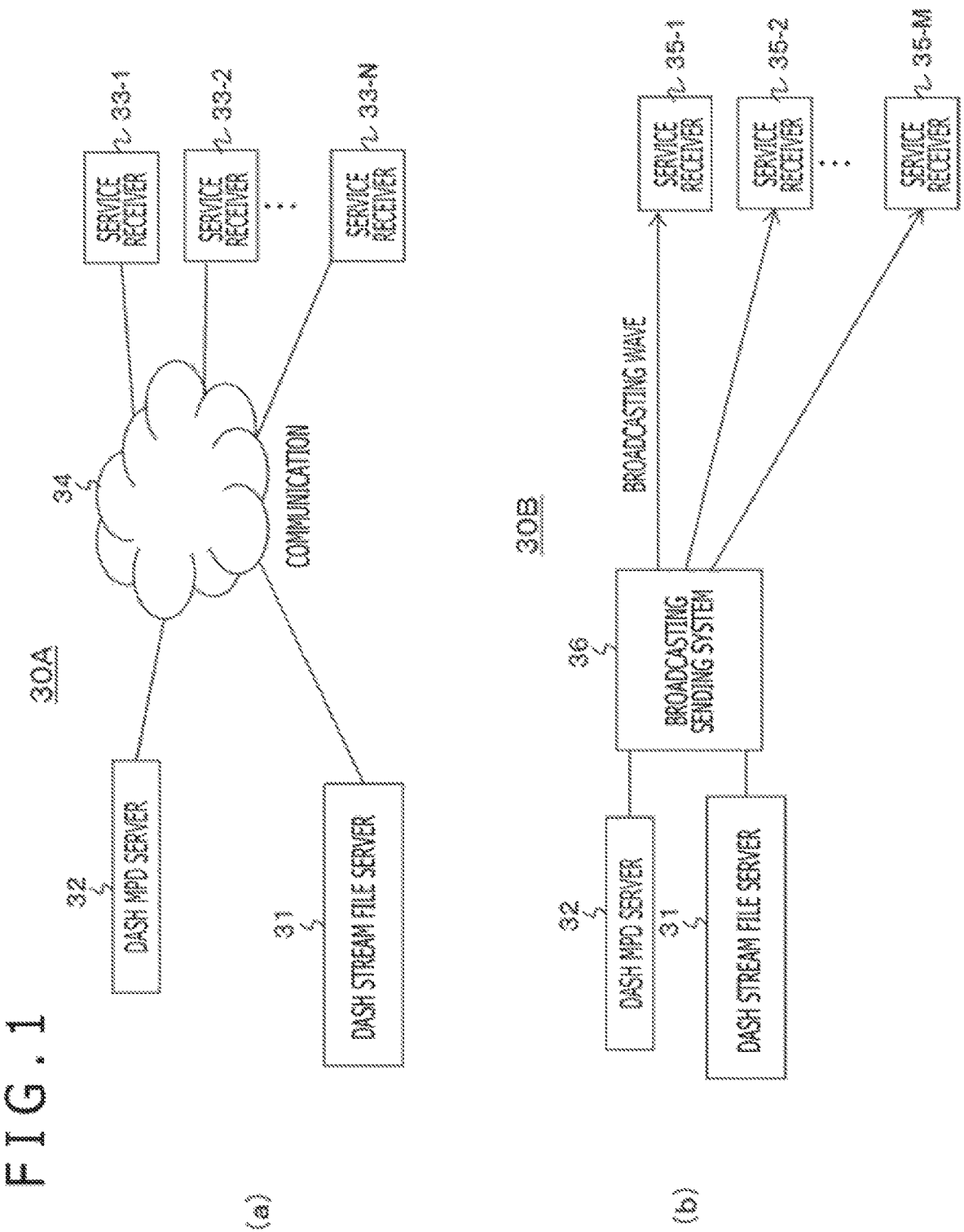
FIG. 1 is a block diagram depicting an example of a configuration of an MPEG-DASH based stream delivery system.

FIG. 1(a) depicts an example of a configuration of an MPEG-DASH based stream delivery system 30A. In this example of the configuration, a media stream and an MPD file are transmitted through a communication network transmission path (communication transmission path). The MPEG-DASH based stream delivery system 30A is configured in such a way that N service receivers 33-1, 33-2, . . . , 33-N are connected to a DASH stream file server 31 and a DASH MPD server 32 through a Content Delivery Network (CDN) 34.

The DASH stream file server 31 produces a stream segment complying with a DASH specification (hereinafter suitably referred to as "a DASH segment") on the basis of media data (such as video data, audio data, or caption data) of predetermined contents, and sends the segment in response to an HTTP request sent from the service receiver. The DASH stream file server 31 may be a streaming dedicated server, or may be shared among Web servers in some cases.

Further, in response to a request of a segment of the predetermined stream sent from the service receiver (33-1, 33-2, . . . , 33-N), the DASH stream file server 31 transmits the segment of that stream to the receiver as a requestor through the CDN 34. In this case, the service receiver 33 selects the stream of an optimal rate and makes a request in response to a state of a network environment in which a client is placed by referring to a value of a rate described in a Media Presentation Description (MPD) file.

The DASH MPD server 32 is a server for producing an MPD file for acquiring a DASH segment produced in the DASH stream file server 31. The DASH MPD server 32 produces the MPD file based on contents metadata from a contents management server (not depicted), and an address (url) of a segment produced in the DASH stream file server 31. It should be noted that the DASH stream file server 31 and the DASH MPD server 32 may be physically identical to each other.

Respective attributes are described in the format of the MPD by utilizing an element of representation every stream of the video, the audio and the like. For example, the respective rates are described with the representation being divided every a plurality of video data streams different in rate from one another in the MPD file. In the service receiver 33, as described above, the optimal stream can be selected in response to the state of the network environment in which the service receiver 33 is placed by referring to the value of the rate.

FIG. 1(b) depicts an example of a configuration of an MPEG-DASH based stream delivery system 30B. In the example of the configuration, the media stream and the MPD file are transmitted through an RF transmission path (broadcasting transmission path). The stream delivery system 30B is constituted by a broadcasting sending system 36 to which the DASH stream file server 31 and the DASH MPD server 32 are connected, and M service receivers 35-1, 35-2, . . . , 35-M.

In case of the stream delivery system 30B, the broadcasting sending system 36 transmits the stream segment (DASH segment), complying with the DASH specification, which is produced in the DASH stream file server 31, and an MPD file produced in the DASH MPD server 32 with the stream segment (DASH segment) and the HPD file being placed on a broadcasting wave.

Figure 2:
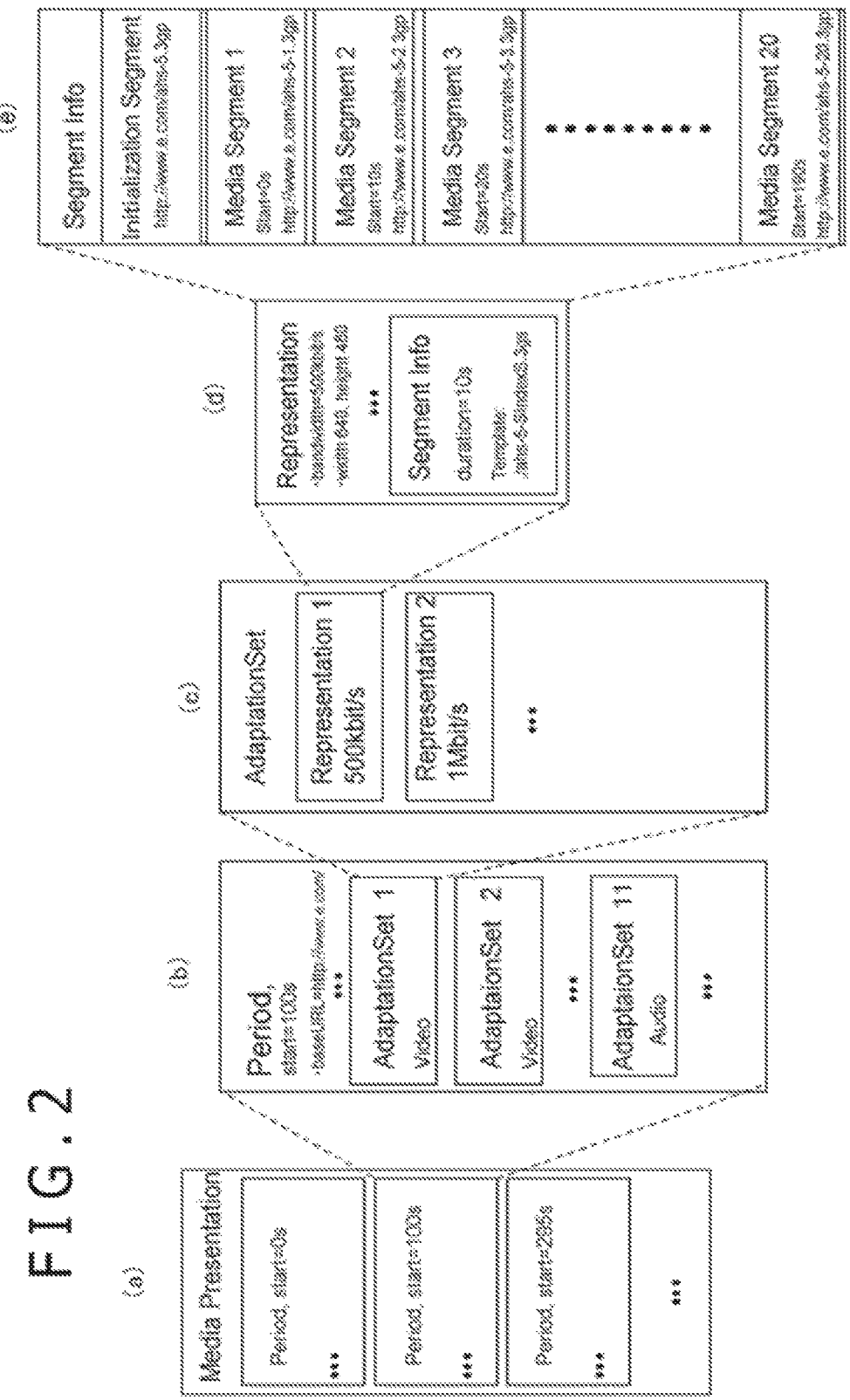
FIG. 2 is a diagram depicting an example of a relationship among respective structures hierarchically arranged in an MPD file.

FIG. 2 depicts an example of a relationship among respective structures hierarchically arranged in the MPD file. As depicted in FIG. 2(a), a plurality of periods partitioned at time intervals is present in Media Presentation as the whole MPD file. For example, a first period starts from 0 seconds, a next period starts from 100 seconds, and so forth.

As depicted in FIG. 2(b), a plurality of Adaptation Sets is present in a period. The respective adaptation sets depend on a difference in media type such as the video and the audio, a difference in language even in the same media type, a difference in point of view, and the like. As depicted in FIG. 2(c), a plurality of Representations is present in the adaptation set. The representation depends on the stream attributes, for example, a difference in a rate.

As depicted in FIG. 2(d), SegmentInfo is contained in the representation. As depicted in FIG. 2(e), Initialization segment, and a plurality of Media Segments in which information for each segment obtained by more finely separating the period is described are present in SegmentInfo. Information associated with an address (url) in accordance with which the segment data on the video, the audio or the like is actually acquired, and the like are present in the media segment.

It should be noted that the switching of the stream can be freely carried out among a plurality of representations contained in the adaptation set. As a result, the stream of the optimal rate can be selected and the video delivery can be carried out without interruption depending on the state of the network environment on the reception side.

[Example of Configuration of Transmission/Reception System]

Figure 3:
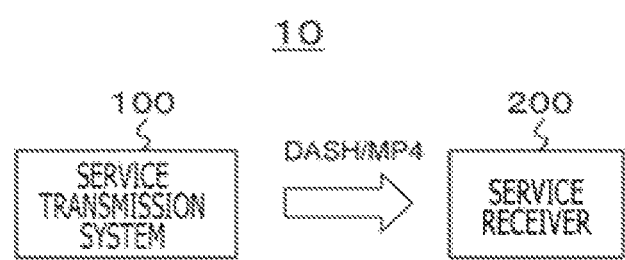
FIG. 3 is a block diagram depicting an example of a configuration of a transmission/reception system as an embodiment.

FIG. 3 depicts an example of a configuration of a transmission/reception system 10 as an embodiment. The transmission/reception system 10 is constituted by a service transmission system 100 and a service receiver 200. In the transmission/reception system 10, the service transmission system 100 corresponds to the DASH stream file server 31 and the DASH MPD server 32 of the stream delivery system 30A depicted in FIG. 1(a) described above. In addition, in the transmission/reception system 10, the service transmission system 100 corresponds to the DASH stream file server 31, the DASH MPD server 32, and the broadcasting sending system 36 of the stream delivery system 30B depicted in FIG. 1(b) described above.

In addition, in the transmission/reception system 10, the service receiver 200 corresponds to the service receiver 33 (33-1, 33-2, . . . , 33-N) of the stream delivery system 30A depicted in FIG. 1(a) described above. In addition, in the transmission/reception system 10, the service receiver 200 corresponds to the service receiver 35 (35-1, 35-2, . . . , 35-M) of the stream delivery system 30B depicted in FIG. 1(b) described above.

The service transmission system 100 transmits DASH/MP4, in a word, MP4 in which the MPD file as the metafile, and the media stream (media segment) of the video, the audio or the like are contained through the communication network transmission path (refer to FIG. 1(a)) or the RF transmission path (refer to FIG. 1(b)).

In this embodiment, the media stream is the basic video stream which is obtained by processing the image data (moving image data) exhibiting Ultra-High Definition (UHD) at a High Frame Rate (HFR), and a predetermined number of enhancement video streams, for example, three or one enhancement video stream. The image data exhibiting the ultra-high definition at the high frame rate, for example, is image data exhibiting 4K/8K at 120 fps.

The basic video stream has encoded image data of the image data, having the basic format, from which the image having the high definition at the basic frame rate (normal frame rate) is to be obtained. The predetermined number of enhancement video streams have the encoded image data of the image data, having the first enhancement format, from which the image having the high definition at the high frame rate is to be obtained, the encoded image data of the image data, having the second enhancement format, from which the image having the ultra-high definition at the basic frame rate is to be obtained, and the encoded image data of the image data, having the third enhancement format, from which the image having the ultra-high definition at the high frame rate is to be obtained.

Here, the image data having the basic format is obtained by executing the down-scale processing for the first image data obtained by executing the mixing processing having the first ratio in units of temporally continuous two pictures in the image data exhibiting the ultra-high definition at the high frame rate. The image data having the second enhancement format is obtained by obtaining a difference between the third image data obtained by executing the up-scale processing for the image data having the basic format, and the first image data described above.

In addition, the image data having the first enhancement format is obtained by executing the down-scale processing for the second image data obtained by executing the mixing processing having the second ratio in units of the temporally continuous two pictures. The image data having the third enhancement format is obtained by obtaining a difference between the fourth image data obtained by executing the up-scale processing for the image data having the first enhancement format, and the second image data described above.

Figure 4:
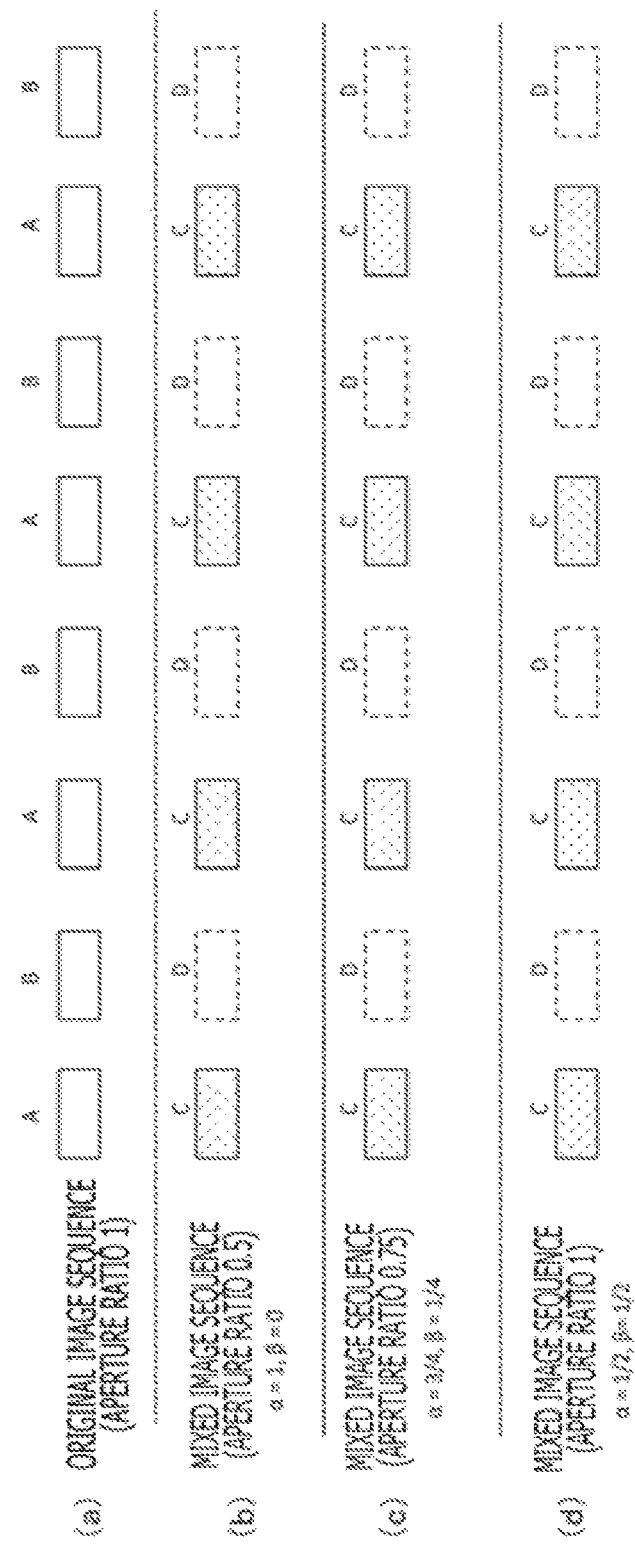
FIG. 4 is a view explaining a shutter aperture ratio which is changed depending on a mixing ratio.

Here, as depicted in FIG. 4(a), the image data at the high frame rate is assumed to be an original image sequence (high speed shutter image sequence). In the figure, "A" and "B" indicate the image data of the first picture in units of the temporally continuous two pictures, and the image data of the second picture, respectively. A shutter aperture ratio of the original image sequence is 1 (100%). Although not illustrated, the shutter aperture ratio of the image sequence of "A" or "B" which is simply extracted from the image data at this high frame rate is ½ (50%).

On the other hand, as depicted in FIG. 4(b) to (d), the shutter aperture ratio of the mixed image sequence which is obtained by executing the mixing processing in units of the temporally continuous two pictures ranges from ½ (50%) to 1 (100%). In the figure, "C" indicates the image data at the basic frame rate which is obtained by executing the mixing processing at the first ratio in units of the two pictures, and "D" indicates the image data of the enhancement frame at the high frame rate which is obtained by executing the mixing processing at the second ratio in units of the two pictures. In this case, attention is paid to the mixed image sequence of "C."

For example, as depicted in FIG. 4(b), when a coefficient α of the first picture is 1, and a coefficient β of the second picture is 0, the shutter aperture ratio of the mixed image sequence is ½ (50%). In addition, for example, as depicted in FIG. 4(c), when the coefficient α of the first picture is ¾, and the coefficient β of the second picture is ¼, the shutter aperture ratio of the mixed image sequence is ¾ (75%). In addition, for example, as depicted in FIG. 4(d), when the coefficient α of the first picture is ½, and the coefficient β of the second picture is ½, the shutter aperture ratio of the mixed image sequence is 1 (100%).

Identification information exhibiting that the stream is the spatial scalable stream, and information exhibiting a ratio of the spatial scalable stream are inserted into one of or both of the encoded image data of the image data having the second and third enhancement formats, and the container position corresponding to the encoded image data, both of them in this embodiment. In this embodiment, an SEI NAL unit having these pieces of information is inserted into the encoded image data (access unit) of the image data having the second and third enhancement formats. In addition, the descriptor having these pieces of information is inserted into a box of "moof" corresponding to the image data having the second and third enhancement formats of MP4. The reception side can readily recognize that the image data having the second and third enhancement formats is the image data pertaining to the spatial scalable stream, and the ratio of the spatial scalable stream from these pieces of information.

Identification information exhibiting the temporal scalable stream, identification information exhibiting that the image data having the basic format is the image data obtained by executing the mixing processing, and information associated with mixing ratios (first, second ratios) are inserted into one of or both of the encoded image data of the image data having the first and third enhancement formats, and the container position corresponding to the encoded image data, both of them in this embodiment.

In this embodiment, the SEI NAL unit having the pieces of information is inserted into the encoded image data (access unit) of the image data having the first and third enhancement formats. In addition, the descriptor having these pieces of information is inserted into the box of "moof" corresponding to the image data having the second enhancement format of MP4. The reception side can readily recognize that the image data having the first and third enhancement formats is the image data pertaining to the temporal scalable stream, and the image data having the basic format is the image data obtained by executing the mixing processing, and the mixing ratios (first, second ratios) from these pieces of information.

In addition, in this embodiment, information exhibiting the response of the scalability is inserted into the MPD file. That is to say, it is represented that the image data exhibiting the high definition at the high frame rate is obtained by the enhancement in which the image data having the first enhancement format is used on the image data having the basic format. In addition, it is represented that the image data exhibiting the ultra-high definition at the basic frame rate is obtained by the enhancement in which the image data having the second enhancement format is used on the image data having the basic format. In addition, it is represented that the image data exhibiting the ultra-high definition at the high frame rate is obtained by the enhancement in which the image data having the first, second and third enhancement formats is used on the image data having the basic format. The reception side can readily recognize the response of the scalability, and can acquire only the necessary stream or the encoded image data and efficiently process the same from the information.

The service receiver 200 receives the MP4 described above which is sent thereto from the service transmission system 100 through the communication network transmission path (refer to FIG. 1(a)) or the RF transmission path (refer to FIG. 1(b)). In case of the receiver having the decoding ability to be able to process the image data having the high definition at the basic frame rate, the service receiver 200 processes only the basic video stream, and obtains the image data having the high definition at the basic frame rate to carry out the image reproduction. In addition, in case of the receiver having the decoding ability to be able to process the image data having the high definition at the high frame rate, the service receiver 200 processes both the basic video stream and the enhancement video stream (the image data having the first enhancement format), and obtains the image data having the high definition at the high frame rate to carry out the image reproduction.

In addition, in case of the receiver having the decoding ability to be able to process the image data having the ultra-high definition at the high frame rate, the service receiver 200 processes both the basic video stream and the enhancement video stream (the image data having the second enhancement format), and obtains the image data having the ultra-high definition at the basic frame rate to carry out the image reproduction. Moreover, in case of the receiver having the decoding ability to be able to process the image data having the ultra-high definition at the basic frame rate, the service receiver 200 processes both the basic video stream and the enhancement video stream (the image data having the first, second, third enhancement formats), and obtains the image data having the ultra-high definition at the high frame rate to carry out the image reproduction.

When the service receiver 200 executes the processing for the spatial scalable stream using the image data having the second, third enhancement formats, the service receiver 200 uses the information exhibiting the ratio of the spatial scalable stream which is inserted into the encoded image data of the image data having the second, third enhancement formats or the container position corresponding to the encoded image data. As a result, the service receiver 200 can suitably execute the processing for the spatial scalable stream.

In addition, when the service receiver 200 executes the processing for the temporal scalable stream using the image data having the first, third enhancement formats, the service receiver 200 uses the information associated with the mixing ratio (first, second ratios) which is inserted into the encoded image data of the image data having the first, third enhancement formats or the container position corresponding to the encoded image data. As a result, the service receiver 200 can suitably execute the processing for the temporal scalable stream.

Figure 5:
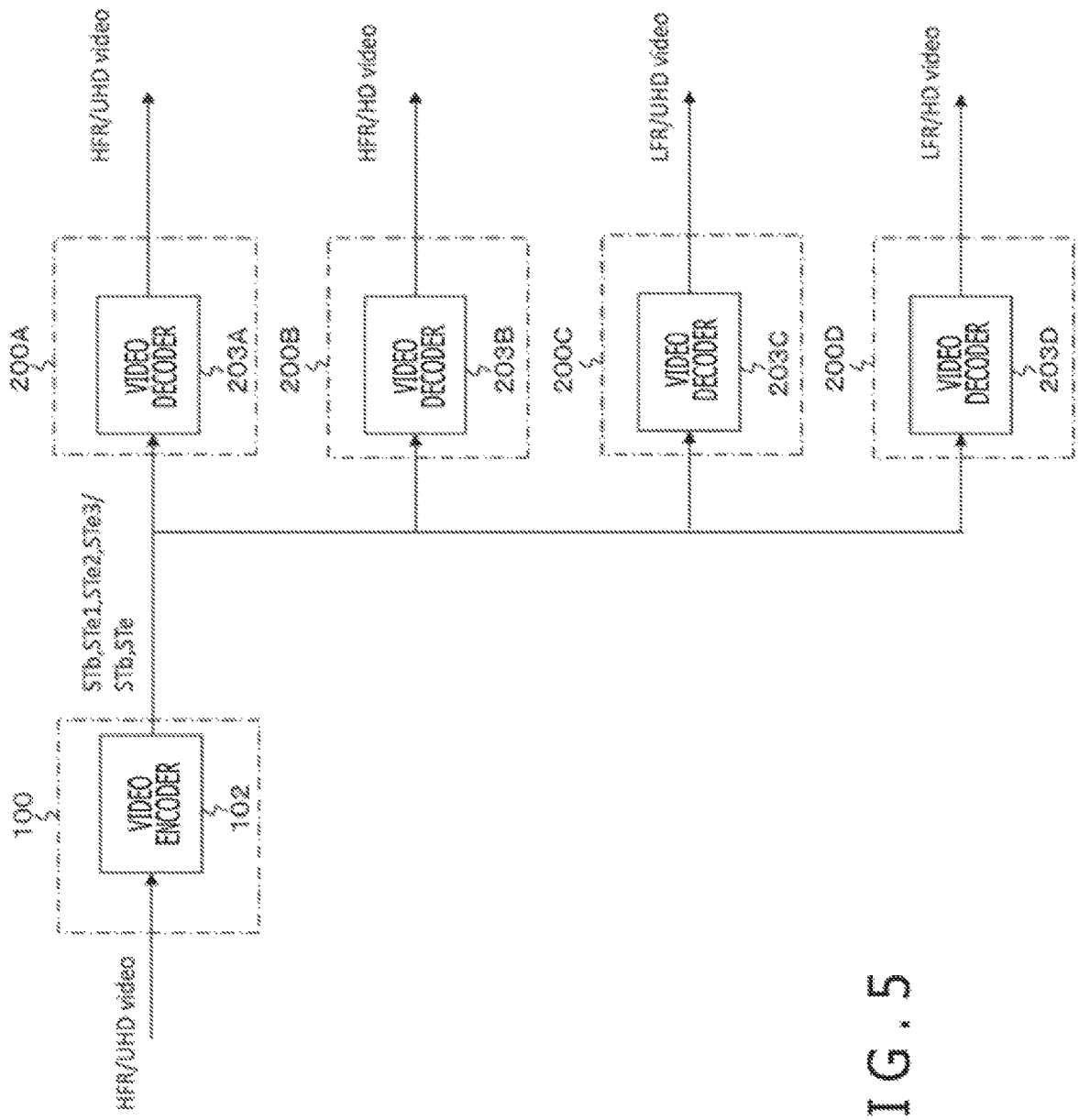
FIG. 5 is a block diagram depicting an outline of processing in a service transmission system and a service receiver.

FIG. 5 depicts an outline of processing in the service transmission system 100 and the service receiver 200. Image data "HFR/UHD video" exhibiting ultra-high definition (UHD) at the high frame rate (HFR) is inputted to the service transmission system 100. In the service transmission system 100, the image data "HFR/UHD video" is processed in a video encoder 102, and a basic video stream STb, and three enhancement video streams STe1, STe2, STe3, or the basic video stream STb and one enhancement video stream STe are obtained to be transmitted.

Here, the basic video stream STb has the encoded image data of the image data, having the basic format, from which an image having the high deformation (HD) at the basic frame rate (LFR) is to be obtained. The enhancement video stream STe1 has the encoded image data of the image data, having a first enhancement format, from which an image having the high definition (HD) at the high frame rate (HFR) is to be obtained. The enhancement video stream STe2 has the encoded image data of the image data, having a second enhancement format, from which an image having the ultra-high definition (UHD) at the basic frame rate (LFR) is to be obtained. The enhancement video stream STe3 has the encoded image data of the image data, having a third enhancement format, from which an image having the ultra-high definition (UHD) at the high frame rate (HFR) is to be obtained. The enhancement video stream STe has the encoded image data of the image data having first, second, third enhancement formats.

In a service receiver 200A having the decoding ability to be able to process the image data having the ultra-high definition at the high frame rate, in a video decoder 203A, the basic video stream STb and the enhancement video streams STe1, STe2, STe3, or the basic video stream STb and one enhancement video stream STe are processed, and the image data "HFR/UHD video" exhibiting the ultra-high definition at the high frame rate is obtained to carry out the image reproduction.

In addition, in a service receiver 200B having the decoding ability to be able to process the image data having the high definition at the high frame rate, in a video decoder 203B, the basic video stream STb and the enhancement video stream STe1, or the basic video stream STb and the enhancement video stream STe are processed, and the image data "HFR/HD video" exhibiting the high definition at the high frame rate is obtained to carry out the image reproduction.

In addition, in a service receiver 200C having the decoding ability to be able to process the image data having the ultra-high definition at the basic frame rate, in a video decoder 203C, the basic video stream STb and the enhancement video stream STe2, or the basic video stream STb and the enhancement video stream STe is processed, and the image data "LFR/UHD video" exhibiting the ultra-high definition at the basic frame rate is obtained to carry out the image reproduction.

In addition, in a service receiver 200D having the decoding ability to be able to process the image data having the high definition at the basic frame rate, in a video decoder 203D, the basic video stream STb is processed, and the image data "LFR/HD video" exhibiting the high definition at the basic frame rate is obtained to carry out the image reproduction.

Figure 6:
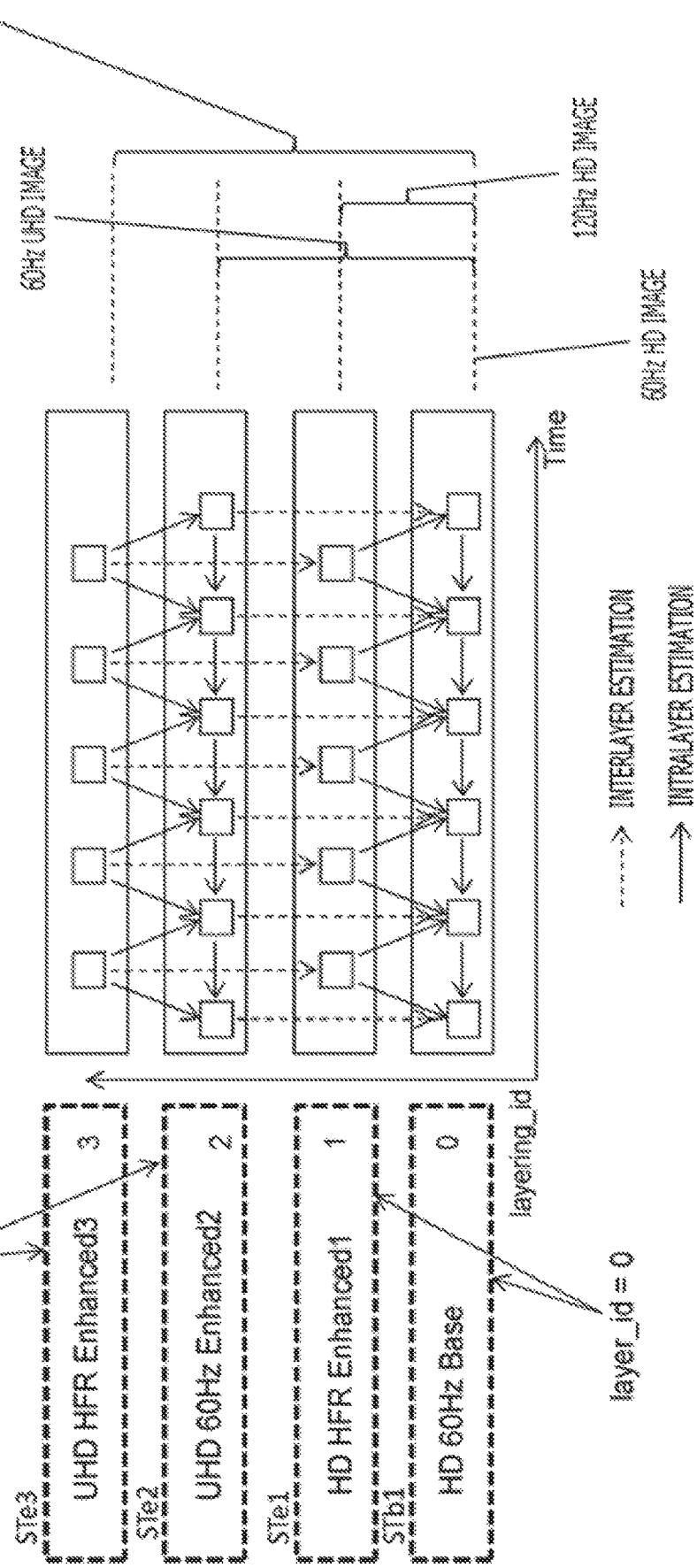
FIG. 6 is a view depicting an example of a stream structure in case of transmission of 4 stream structures: a basic video stream STb; and enhancement streams STe1, STe2, STe3.

FIG. 6 depicts an example of a stream structure in case of transmission in 4 stream structures: the basic video stream STb and the enhancement video streams STe1, STe2, STe3. The illustrated example indicates the case where the high frame rate is 120 Hz. An axis of abscissa represents picture order of composition (POC). In this case, the display time is temporally earlier on the left side and the display time is temporally later on the right side. Rectangular frames each indicate the pictures, and an arrow indicates an example of a reference relationship between the postures in estimation encoding processing. In both the interlayer and the intralayer, for the estimation, the objective picture changes every block. In addition, a direction of the estimation, and the number of references are by no means limited to the illustrated example.

A sequence of the image data "HD 60 Hz Base" having the basic format and contained in the basic video stream STb in which a layering ID (layering_id) "0" is present in the lowermost stage. The layer ID (Layer_id) of the image data "HD 60 Hz Base" is "0."

A sequence of the image data "HD HFR Enhanced1" having the first enhancement format and contained in the enhancement video stream STe1 in which the layering ID (layering_id) is "1" is present in the upper stage of the lowermost stage. The "HD HFR Enhanced1" is the scalability in the temporal direction for the image data "HD 60 Hz Base." The layer ID (Layer_id) of the image data "HD HFRR Enhanced1" is "0."

A sequence of the image data "UHD 60 Hz Enhanced2" having the second enhancement format and contained in the enhancement video stream STe2 in which the layering ID (layering_id) is "2" is "1" is present in the upper stage of that previous stage. The "UHD 60 Hz Enhanced2" is the scalability in the spatial direction for the image data "HD 60 Hz Base." The layer ID (Layer_id) of the image data "UHD 60 Hz Enhanced 2" is "1."

A sequence of the image data "UHD HFR Enhanced3" having the third enhancement format and contained in the enhancement video stream STe3 in which the layering ID (layering_id) is "3" is present in the upper stage of that previous stage. The "UHD HFR Enhanced3" is the scalability in the temporal direction for the image data "UHD 60 Hz Enhanced2," and is also the scalability in the spatial direction for the image data "HD HFR Enhanced1." The layer ID (Layer_id) of the image data "UHD HFR Enhanced3" is "1."

The reproduction of the image (60 Hz, HD image) having the high definition (HD) at the basic frame rate can be carried out on the basis of the image data "HD 60 Hz Base" having the basic format. In addition, the reproduction of the image (120 Hz, HD image) having the high definition (HD) at the high frame rate can be carried out on the basis of the image data "HD 60 Hz Base" having the basic format and the image data "HD HFR Enhanced1" having the first enhancement format.

In addition, the reproduction of the image (60 Hz, UHD image) having the ultra-high definition (UHD) at the basic frame rate can be carried out on the basis of the image data "HD 60 Hz Base" having the basic format, and the image data "UHD 60 Hz Enhanced2" having the second enhancement format. In addition, the reproduction of the image (120 Hz, UHD image) having the ultra-high definition (UHD) at the high frame rate can be carried out on the basis of the image data "HD 60 Hz Base" having the basic format, the image data "HD HFR Enhanced1" having the first enhancement format, the image data "UHD 60 Hz Enhanced2" having the second enhancement format, and the image data "UHD HFR Enhanced3" having the third enhancement format.

Figure 7:
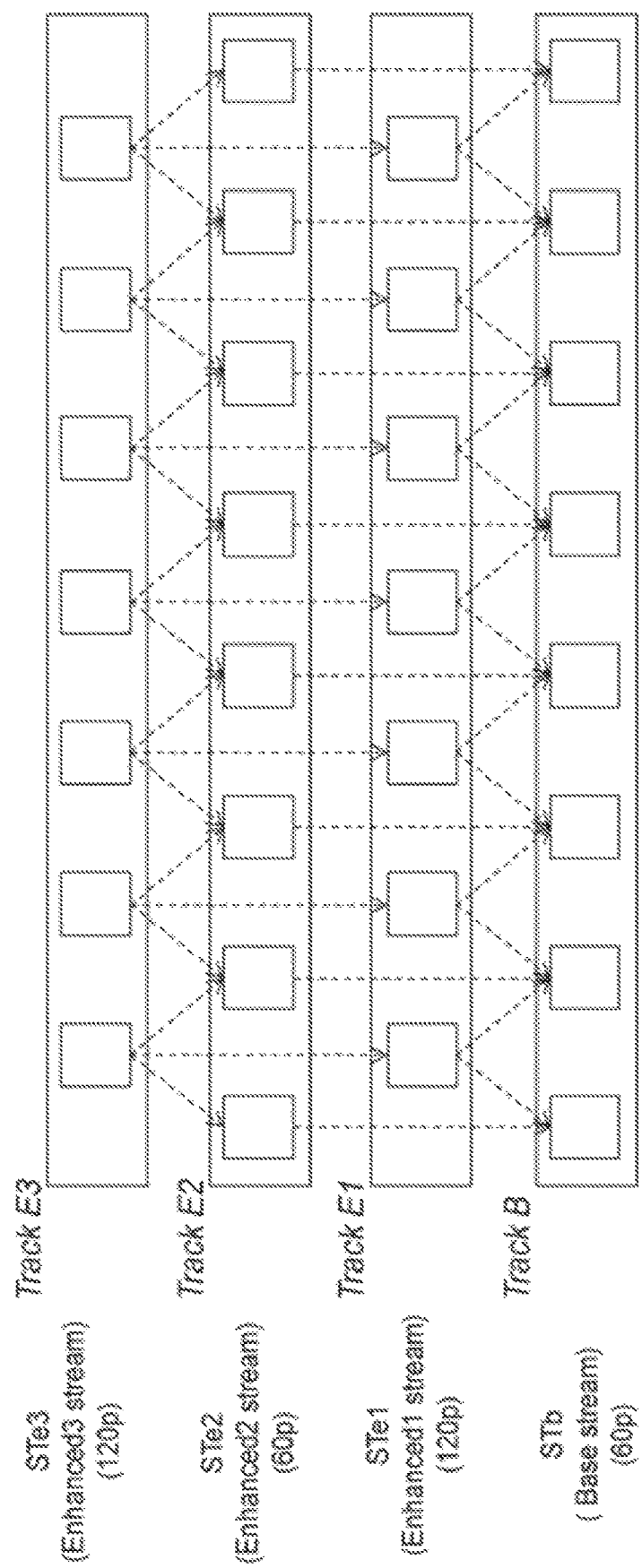
FIG. 7 is a view depicting a track structure of DASH/MP4 in case of transmission of the 4 stream structure.

FIG. 7 depicts a track structure of DASH/MP4 in case of the transmission of the 4 stream structure. In this case, there are present a track B corresponding to the basic video stream STb (Base Stream), a track E1 corresponding to the enhancement video stream STe1 (Enhanced1 stream), a track E2 corresponding to the enhancement video stream STe2 (Enhanced2 stream), and a track E3 corresponding to the enhancement video stream STe3 (Enhanced3 stream).

The rectangular frames each indicate the pictures. An arrow indicates the response of the scalability. That is to say, the image having the high definition (HD) at the high frame rate, in a word, the image data of 120 Hz HD image is obtained by the enhancement of the temporal scalable stream in which the image data having the first enhancement format contained in the track E1 is used on the image data having the basic format contained in the track B. In addition, the image having the ultra-high definition (UHD) at the basic frame rate, in a word, the image data of 60 Hz UHD image is obtained by the enhancement of the spatial scalable stream in which the image data having the second enhancement format contained in the track E2 is used on the image data having the basic format contained in the track B.

In addition, the image having the ultra-high definition (UHD) at the high frame rate, in a word, the image data of 120 Hz UHD image is obtained by the enhancement of the spatial scalable stream, the temporal scalable stream in which the image data having the first enhancement format contained in the track E1, the image data having the second enhancement format contained in the track E2, and the image data having the third enhancement format contained in the track E3 are used on the image data having the basic format contained in the track B.

Figure 8:
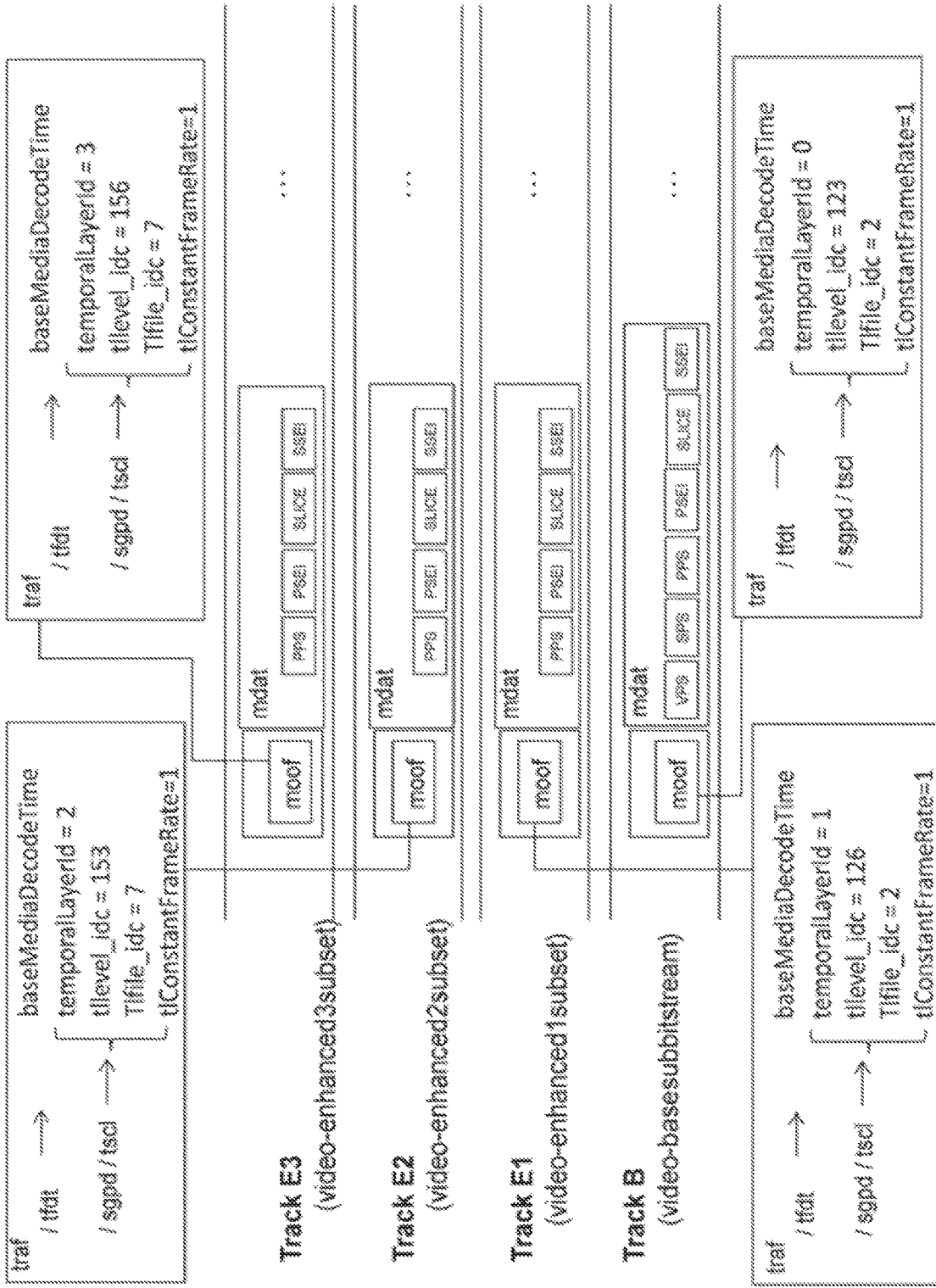
FIG. 8 is a view depicting an example of a structure of an MP4 stream (file) containing data of respective tracks including a track B, a track E1, a track E2, and a track E3.

FIG. 8 depicts an example of a structure of an MP4 stream (file) containing the data of the tracks: the track B; the track E1; the track E2; and the track E3. The illustrated example is an example in case of Fragmented MP4. A predetermined number of Movie Fragments each constituted by a "moof" box in which control information is put, and an "mdat" box in which a media data main body is put are arranged in the MP4 stream. Since fragments which are obtained by fragmenting the track data are put in the "mdat" box, the control information put in the "moof" box becomes control information associated with the fragments. It should be noted that although the detailed description is omitted herein, the estimation reference relationship straddling the tracks is defined by arranging an NAL type packet as an extractor in the track every access unit.

In the MP4 stream "video-basesubbitstream" corresponding to the track B, the encoded image data (access unit) having the basic format, for the predetermined number of pictures, for example, 1 GOP, is arranged in the "mdat" box of the respective movie fragments. Here, the access units are constituted by the NAL units such as "VPS," "SPS," "PPS,"

"PSEI," "SLICE," and "SSEI." It should be noted that "VPS," "SPS" are inserted into the head picture of GOP.

Figure 10:
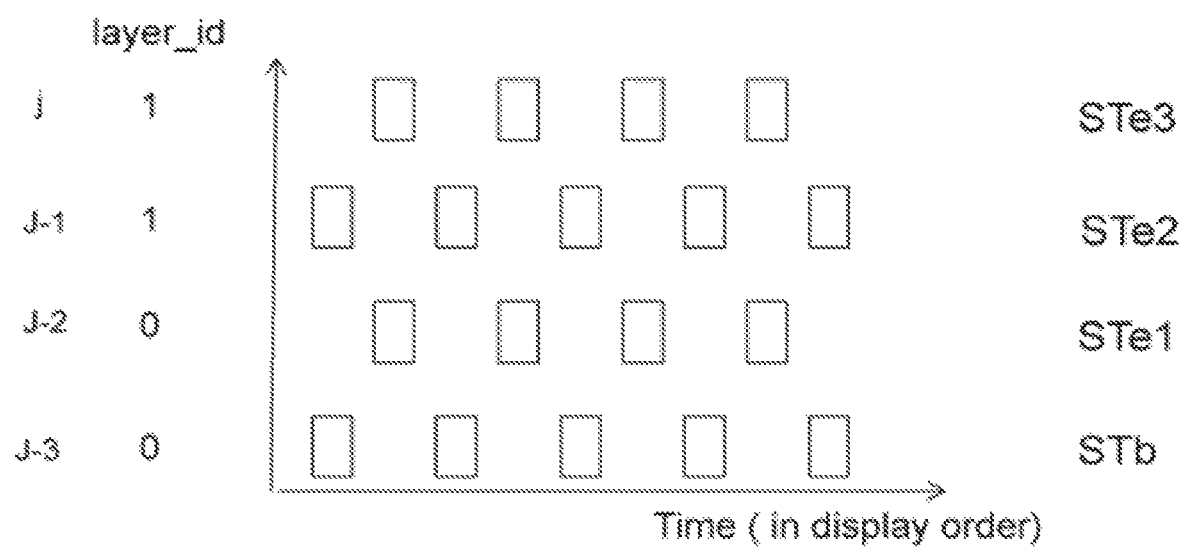
FIG. 10 is a view depicting an example of a structure of a basic video stream STb, and enhancement video streams STe1, STe2, and STe3.

FIG. 9 depicts an example of elements of SPS (VPS). This example is an example in the case where the basic video stream STb, and the enhancement video streams STe1, STe2, STe3 are structured as depicted in FIG. 10. It is represented that a value of "general_level_idc" is set to "156," and a level of the whole streams of the enhancement video streams STe3, STe2, STe1, and the basic video stream STb (the complex difference of the scalable encoded pixel rate) is "level 5.2." In addition, it is also represented that a value of "general_profile_idc" is set to "7," and the profile of the whole stream (type of scalable encoding) is "Scalable Main 10 Profile."

In addition, "sublayer_level_present_flag[j−1]" is set to "1," "sublayer_level_idc[j−1]" is set to "153," and "sublayer_profile_idc[j−1]" is set to "7." As a result, it is also represented that a level of the whole streams of the enhancement video streams STe2, STe1, and the basic video stream STb is "level 5.1" and the profile thereof is "Scalable Main 10 Profile."

In addition, "sublayer_level_present_flag[j−2]" is set to "1," "sublayer_level_idc[j−2]" is set to "126," and "sublayer_profile_idc[j−2]" is set to "2." As a result, it is also represented that a level of the whole stream of the enhancement video stream STe1, and the basic video stream STb is "level 4.2" and the profile thereof is "Main 10 Profile."

In addition, "sublayer_level_present_flag[j−3]" is set to "1," "sublayer_level_idc[j−3]" is set to "123," and "sublayer_profile_idc[j−3]" is set to "2." As a result, it is also represented that the level of the basic video stream STb is "level 4.1," and the profile thereof is "main 10 Profile."

Returning back to FIG. 8, in the MP4 stream "video-basesubbitstream" corresponding to the track B, a "traf" box is present in the "moof" boxes of the respective movie fragments, and a "tfdt" box is present in the "traf" box. The decoding time "baseMediaDecodeTime" of a first access unit after the "moof" box is described in the "tfdt" box.

In addition, a "tfdt" box is present in the "moof" box, a "sgpd" box is present in the "tfdt" box, and a "tscl" box is present in the "sgpd" box. Four parameters of "temporalLayerId," "tllevel_idc," "Tlprofile," and "tlConstantFrameRate" are described in the "tscl" box. "temporalLayerId" exhibits a temporal ID (temporal_id). "tlConstantFrameRate" is set to 1, which exhibits that the frame rate is constant.

"tllevel_idc" indicates the level of the basic video stream STb, and is made to agree with "sublayer_level_idc[j−3]" of the element of the SPS (or VPS) described above. In this case, "tllevel_idc" is set to "123." "Tlprofile" indicates the profile of the basic video stream STb, and is made to agree with "sublayer_profile_idc[j−3]" of the element of the SPS (or VPS) described above. In this case, "Tlprofile" is set to "2."

In the MP4 stream "video-enhanced1subset" corresponding to the track E1, the encoded image data (access units) for a predetermined number of pictures, for example, for 1GOP of the image data having the first enhancement format is arranged in the "mdat" boxes of the respective movie fragments. Here, the access units are constituted by the NAL units such as "PPS," "PSEI," "SLICE," and "SSEI."

In the MP4 stream "video-enhanced1subset" corresponding to the track E1, a "traf" box is present in the "moof" boxes of the respective movie fragments, and "tfdt" box is present in the "traf" box. The decode time "baseMediaDecodeTime" of the first access unit after the "moof" box is described in the "traf" box.

In addition, a "tfdt" box is present in the "moof" box, a "sgpd" box is present in the "tfdt" box, and a "tscl" box is present in the "sgpd" box. Four parameters of "temporalLayerId," "tllevel_idc," "Tlprofile," and "tlConstantFrameRate" are described in the "tscl" box. "temporalLayerId" exhibits a temporal ID (temporal_id). "tlConstantFrameRate" is set to "1," which exhibits that the frame rate is constant.

"tllevel_idc" indicates the level of the whole streams of the enhancement video stream STe1 the basic video stream STb, and is made to agree with "sublayer_level_idc[j−2]" of the element of the SPS (or VPS) described above. In this case, "tllevel_idc" is set to "126." "Tlprofile" indicates the profile of the whole streams of the enhancement video stream STe1, the basic video stream STb, and is made to agree with "sublayer_profile_idc[j−2]" of the element of the SPS (or VPS) described above. In this case, "Tlprofile" is set to "2."

In the MP4 stream "video-enhanced2subset" corresponding to the track E2, the encoded image data (access units) for a predetermined number of pictures, for example, for 1GOP of the image data having the second enhancement format is arranged in the "mdat" boxes of the respective movie fragments. Here, the respective access units are constituted by the NAL units such as "PPS," "PSEI," "SLICE," and "SSEI."

In the MP4 stream "video-enhanced2subset" corresponding to the track E2, the "traf" box is present in the "moof" boxes of the respective movie fragments, and the "tfdt" box is present in the "traf" box. The decode time "baseMediaDecodeTime" of the first access unit after the "moof" box is described in the "traf" box.

In addition, the "tfdt" box is present in the "moof" box, the "sgpd" box is present in the "tfdt" box, and a "tscl" box is present in the "sgpd" box. Four parameters of "temporalLayerId," "tllevel_idc," "Tlprofile," and "tlConstantFrameRate" are described in the "tscl" box. "temporalLayerId" exhibits a temporal ID (temporal_id). "tlConstantFrameRate" is set to 1, which exhibits that the frame rate is constant.

"tllevel_idc" exhibits the level of the whole streams of the enhancement video streams STe2, STe1, and the basic video stream STb, and is made to agree with "sublayer_level_idc [j−1" of the element of SPS (or VPS) described above. In this case, "tllevel_idc" is set to "153." "Tlprofile" exhibits the profile of the whole streams of the enhancement video streams STe2, STe1, and the basic video stream STb, and is made to agree with "sublayer_profile_idc[j−1]" of the element of SPS (or VPS) described above. In this case, "Tlprofile" is set to "7."

In the MP4 stream "video-enhanced3subset" corresponding to the track E3, the encoded image data (access units) for a predetermined number of pictures, for example, for 1 GOP of the image data having the third enhancement format is arranged in the "mdat" boxes of the respective movie fragments. Here, the respective access units are constituted by the NAP units such as "PPS," "PSEI," "SLICE," and "SSEI."

In the MP4 stream "video-enhanced3subset" corresponding to the track E3, the "traf" box is present in the "moof" boxes of the respective movie fragments, and the "tfdt" box is present in the "traf" box. The decode time "baseMediaDecodeTime" of the first access unit after the "moof" box is described in the "tfdt" box.

In addition, the "tfdt" box is present in the "moof" box, the "sgpd" box is present in the "tfdt" box, and the "tscl" box is present in the "sgpd" box. The four parameters of "temporalLayerId," "tllevel_idc," "Tlprofile," and "tlConstantFrameRate" are described in the "tscl" box. "temporalLayerId" exhibits the temporal ID (temporal_id). "tlConstantFrameRate" is set to "1," which exhibits that the frame rate is constant.

"tllevel_idc" exhibits the level of the whole streams of the enhancement video streams STe3, STe2, STe1, and the basic video stream STb, and is made to agree with "general_level_idc" of the element of SPS (or VPS) described above. In this case, "tllevel_idc" is set to "156." "Tlprofile" exhibits the profile of the whole streams of the enhancement video streams STe3, STe2, STe1, and the basic video stream STb, and is made to agree with "general_profile_idc" of the element of SPS (or VPS) described above. In this case, "Tlprofile" is set to "7."

In the MP4 stream "video-enhanced1subset" corresponding to the track E1, as described above, the access units, for the predetermined number of pictures, of the image data having the first enhancement format are arranged in the "mdat" boxes of the respective movie fragments. An SEI NAL unit having identification information exhibiting that the stream is the temporal scalable stream, identification information exhibiting that the image data having the basic format is image data obtained by executing the mixing processing, and the information associated with mixing ratios (first, second ratios) is inserted into the respective access units. In this embodiment, video scalability SEI (video_scalability_SEI) which is newly defined is inserted into a portion of "SEIs" of the access unit (AU).

In the MP4 stream "video-enhanced2subset" corresponding to the track E2, as described above, the access units, for the predetermined number of pictures, of the image data having the second enhancement format are arranged in the "mdat" box of the respective movie fragments. An SEI NAL unit having identification information exhibiting that the stream is the spatial scalable stream, and the information exhibiting a ratio of the spatial scalable stream is inserted into the respective access units. In this embodiment, video scalability SEI (video_scalability_SEI) which is newly defined is inserted into a portion of "SEIs" of the access unit (AU).

In addition, in the MP4 stream "video-enhanced3subset" corresponding to the track E3 as described above, the access units, for the predetermined number of pictures, of the image data having the third enhancement format are arranged in the "mdat" boxes of the respective movie fragments. An SEI NAL unit having the identification information exhibiting that the stream is the temporal scalable stream, the identification information exhibiting that the image data having the basic format is image data obtained by executing the mixing processing, the information associated with a mixing ratios (first, second ratios), the identification information exhibiting that the stream is the spatial scalable stream, and the information exhibiting the ratio of the spatial scalable stream is inserted into the respective access units. In this embodiment, video scalability SEI (video_scalability_SEI) which is newly defined is inserted into a portion of "SEIs" of the access unit (AU).

FIG. 11 depicts an example of a structure (Syntax) of video_scalability_SEI. FIG. 12 depicts contents (Semantics) of main information in the example of the structure. 1 bit field of "temporal scalable flag" exhibits whether or not the stream is the temporal scalable stream. For example, "1" exhibits that the stream is the temporal scalable stream, and "0" exhibits that the stream is not the temporal scalable stream.

In the video scalability SEI which is inserted into the access unit of the image data having the first enhancement format, "temporal_scalable_flag" is set to "1," and it is represented that the stream is the temporal scalable stream. In the video scalability SEI which is inserted into the access unit of the image data having the second enhancement format, "temporal_scalable_flag" is set to "0," and it is represented that the stream is not the temporal scalable stream. In addition, in the video scalability SEI which is inserted into the access unit of the image data having the third enhancement format, "temporal_scalable_flag" is set to "1," and it is represented that the stream is the temporal scalable stream.

1 bit field of "spatial scalable flag" exhibits whether or not the stream is the spatial scalable stream. For example, "1" exhibits that the stream is the spatial scalable stream, and "0" exhibits that the stream is not the spatial scalable stream.

In the video scalability SEI which is inserted into the access unit of the image data having the first enhancement format, "spatial_scalable_flag" is set to "0," and it is represented that the stream is not the spatial scalable stream. In the video scalability SEI which is inserted into the access unit of the image data having the second enhancement format, "spatial_scalable_flag" is set to "1," and it is represented that the stream is not the spatial scalable stream. In addition, in the video scalability SEI which is inserted into the access unit of the image data having the third enhancement format, "spatial_scalable_flag" is set to "1," and it is represented that the stream is the spatial scalable stream.

When "spatial_scalable_flag" is "1," 3 bit field of "scaling_ratio" is present. This field indicates a ratio of the spatial scalable, in a word, an enlargement ratio in one-dimensional direction of enlargement to basis. For example, "001" exhibits twice, "010" exhibits three times and "011" exhibits four times. For example, when the ultra-high definition (UHD) is the 4K definition, "scaling_ratio" is set to "001," and when the ultra-high definition (UHD) is the 8K definition, "scaling_ratio" is set to "011."

When "temporal_scalable_flag" is "1," a 1 bit field of "picture_blending_flag" is present. The field exhibits whether or not the mixing processing of the pictures is executed for the basic stream (the image data having the basic format). For example, "1" exhibits that the mixing processing of the pictures is executed for the basic stream, and "0" exhibits that the mixing processing of the pictures is not executed for the basic stream.

When "picture_blending_flag" is "1," a field exhibiting the mixing ratios (first, second ratios), that is, respective 3-bit fields of "blend_coef_alpha_alternatte_picture," "blend_coef_beta_alternate_picture," "blend_coef_alpha_current_picture," and "blend_coef_beta_current_picture" are present.

The field of "blend_coef_alpha_alternatte_picture" is a coefficient by which the picture of the basic layer is multiplied (corresponding to a coefficient p which will be described later). A field of "blend_coef_beta_alternate_picture" is a coefficient by which the current picture (in enhancement stream) is multiplied (corresponding to a coefficient r which will be described later). A field of "blend_coef_alpha_current_picture" is a coefficient by which the picture of the enhancement layer is multiplied (corresponding to a coefficient q which will be described later). A field of "blend_coef_beta_current_picture" is a coefficient by which the current picture (in enhancement stream) is multiplied (corresponding to a coefficient s which will be described later).

Referring back to FIG. 8, in the MP4 stream "video-enhanced1subset" corresponding to the track E1, the identification information exhibiting that the stream is the temporal scalable stream, the identification information exhibiting that the image data having the basic format is the image data obtained by executing the mixing processing, and the information associated with the mixing ratios (first, second ratios) are inserted into the "moof" boxes of the respective movie fragments. In this embodiment, a box of "udta" or "lays" is provided under the "moof" box, and a Syntax of a video scalability information descriptor (video scalability information descriptor) which is newly defined is transmitted.

In the MP4 stream "video-enhanced2subset" corresponding to the track E2, the identification information exhibiting that the stream is the spatial scalable stream, and the information exhibiting the mixing ratio of the spatial scalable stream are inserted into the "moof" boxes of the respective movie fragments. In this embodiment, a box of "udta" or "lays" is provided under the "moof" box, and a Syntax of a video scalability information descriptor (video_scalability_information_descriptor) which is newly defined is transmitted.

In addition, in the MP4 stream "video-enhanced3subset" corresponding to the track E3, the identification information exhibiting that the stream is the temporal scalable stream, the identification information exhibiting that the image data having the basic format is the image data obtained by executing the mixing processing, the information associated with the mixing ratios (first, second ratios) the identification information exhibiting that the structure is the spatial scalable stream, and the information exhibiting the ratio of the spatial scalable stream are inserted into the "moof" boxes of the respective movie fragments. In this embodiment, a box of "udta" or "lays" is provided under the "moof" box, and a Syntax of a video scalability information descriptor (video_scalability_information_descriptor) which is newly defined is transmitted.

FIG. 13 depicts an example of a structure (Syntax) of the video_scalability_information_descriptor. It should be noted that since the contents (semantics) of the main information in this example of the structure are similar to those in case of the video scalability SEI described above, a description thereof is omitted herein.

Figure 14:
FIG. 14 is a view depicting an example of a description of an MPD file in case of transmission of the 4 stream structure.

FIG. 14 depicts an example of a description of an MPD file in case of transmission of the 4 stream structure (refer to FIG. 6). Representations each corresponding to the basic video stream STb (Base stream), the enhancement video stream STe1 (Enhanced1 stream), the enhancement video stream STe2 (Enhanced2 stream), and the enhancement video stream STe3 (Enhanced3 stream) are present in the MPD file.

In the representation associated with the basic video stream STb (HD Base stream), the descriptions of "frame rate="60," "codes="hev1.A, L123, xx"," "id="tag0" are present. "framerate="60" & L123 with no dependencyid" exhibits the basic stream of 2K 60P, and ""A"" exhibits a value of 2 exhibiting "Main 10 Profile." Information associated with the level and the profile agrees with "sublayer_level_idc[j–3]," "sublayer_profile_idc[j–3]" of the elements of SPS (VPS) described above. Incidentally, "sublayer_profile_idc[j–3]"="Main 10 Profile," and "sublayer_level_idc[j–3]"="level 4.1"="123." In addition, from the description of "<BaseURL>video-basesubbitstream.mp4</BaseURL>," a location destination of the basic-video stream STb (Base stream) is indicated as "video-basesubbitstream.mp4."

In the representation associated with the enhancement video stream STe1 (Enhanced1 stream), the description of "framerate="120"," "codes="hev1.B. L126, xx"," "id="tag1"" is present. "framerate="120" & L126 with dependencyid tagged tag0" exhibits that the stream of 2K 120P is realized. ""B"" exhibits a value of 2 exhibiting "main 10 Profile." Information associated with the level and the profile agrees with "sublayer_level_idc[j–2]," "sublayer_profile_idc[j–2]" of the elements of SPS (or VPS) described above. Incidentally, "sublayer_profile_idc[j–2]"="Main 10 Profile," and "sublayer_level_idc[j–2]"="level 4.2"="126." In addition, from the description of "<BaseURL>video-enhanced1subset.mp4</BaseURL>," a location destination of the enhancement video stream STe1 (Enhanced1 stream) is indicated as "video-enhanced1subset.mp4."

In the representation associated with the enhancement video stream STe2 (Enhanced2 stream), the descriptions of "framerate="60","" ""codecs=" hev1.C.L153, xx"," "id="tag2"," and "dependencyid="tag0" are present. "Framerate="60"& L153 with dependencyid tagged tag0" exhibits that the stream of 4K 60P is realized on the basic stream by the enhancement. ""C"" exhibits a value of 7 exhibiting "Scalable Main 10 Profile." The information associated with the level and the profile agrees with "sublayer_level_idc[j–1]," "sublayer_profile_idc[j–1]" of the elements of SPS (VPS) described above. Incidentally, "sublayer_profile_idc[j–1]"="Scalable Main 10 Profile," and "sublayer_level_idc[j–1]"="level 5.1"="153." In addition, from the description of "<BaseURL>video-enhanced2subset.mp4</BaseURL>," the location destination of the enhancement video stream STe2 (Enhanced2 stream) is indicated as "video-enhanced2subset.mp4."

In the representation associated with the enhancement video stream STe3 (Enhanced3 stream), the descriptions of "framerate="120"," ""codecs=" hev1.D.L156, xx"," "id="tag3"," and "dependencyid="tag0, tag1, tag2" are present. "framerate="120"& L156 with dependencyid tagged tag0, tag1, tag2" exhibits that the stream of 2K 120P is realized on the basic stream by enhancement with 2K 120P, and the enhancement component is added thereon to realize the stream of 4K 120P. ""D"" exhibits a value of 7 exhibiting "Scalable Main 10 Profile." The information associated with the level and the profile agrees with "general_level_idc," "general_profile_idc" of the elements of SPS (VPS) described above. Incidentally, "general_level_idc"="Scalable Main 10 Profile," and "general_level_idc"=level 5.2="156." In addition, from the description of "<BaseURL>video-enhanced3subset.mp4</BaseURL>," the location destination of the enhancement video stream STe3 (Enhanced3 stream) is indicated as "video-enhanced3subset.mp4."

In such a way, the information exhibiting the response of the scalability is inserted into MPD file, and it is represented that the spatial scalability and the temporal scalability are simultaneously realized.

Figure 15:
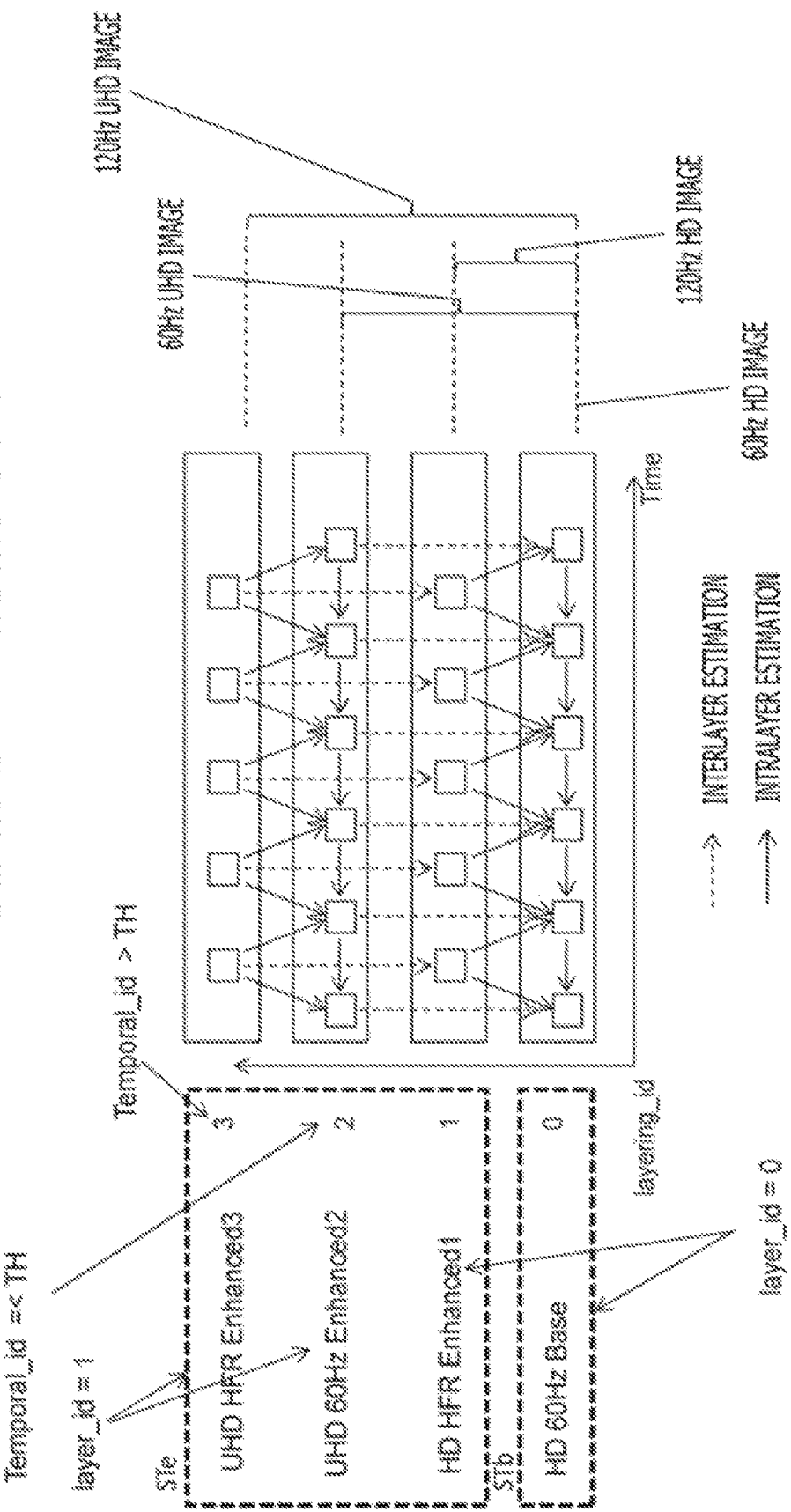
FIG. 15 is a view depicting an example of a stream structure in case of transmission of 2 stream structure: a basic video stream STb and an enhancement stream STe.

FIG. 15 depicts an example of a structure of the stream in case of the transmission of the 2 stream structures of the basic video stream STb and the enhancement stream STe. The illustrated example indicates the case where the high frame rate is 120 Hz. An axis of abscissa represents the picture order of composition (POC). The display time is temporally earlier on the left side, and the display time is temporally later on the right side. Rectangular frames each indicate the pictures and an arrow indicates an example of a reference relationship between the postures in estimation encoding processing. In both the interlayer, and the intralayer, for the estimation, the objective picture changes every block. In addition, a direction of the estimation, and the number of references are by no means limited to the illustrated example.

A sequence of the image data "HD 60 Hz Base" having the basic format and contained in the basic video stream STb in which a layering ID (layering_id) is "0" is present in the lowermost stage. The layer ID (Layer_id) of the image data "HD 60 Hz Base" is "0."

A sequence of the image data "HD HFR Enhanced1" having the first enhancement format in which the layering ID (layering_id) is "1" and contained in the enhancement video stream STe is present in the upper stage of the lowermost stage. The "HD HFR Enhanced1" is the scalability in the temporal direction for the image data "HD 60 Hz Base." The layer ID (Layer_id) of the image data "HD HFR Enhanced1" is "0."

A sequence of the image data "UHD 60 Hz Enhanced2" having the second enhancement format in which the layering ID (layering_id) is "2," and contained in the enhancement video stream STe is present in the upper stage of the above stage. "UHD 60 Hz Enhanced2" is the scalability in the spatial direction for the image data "HD 60 Hz Base." The layer ID (Layer_id) of the image data "UHD 60 Hz Enhanced2" is "1." In addition, the temporal ID (Temporal_id) of the image data "UHD 60 Hz Enhanced2" is set equal to or smaller than a predetermined threshold value TH.

A sequence of the image data "UHD HFR Enhanced3" having the third enhancement format in which the layering ID (layering_id) is "3," and contained in the enhancement video stream STe is present in the upper stage of the above stage. "UHD HFR Enhanced3" is the scalability in the temporal direction for the image data "UHD 60 Hz Enhanced2," and is also the scalability in the spatial direction for the image data "HD HFR Enhanced1." The layer ID (Layer_id) of the image data "UHD HFR Enhanced3" is "1." In addition, the temporal ID (Temporal_id) of the image data "UHD 60 Hz Enhanced3" is set larger than the predetermined threshold value TH.

As described above, the temporal ID of the image data "UHD 60 Hz Enhanced2" is set equal to or smaller than the predetermined threshold value TH. On the other hand, the temporal ID of the image data "UHD HFR Enhanced3" is set larger than the threshold value TH. As a result, the determination as to whether or not the temporal ID is equal to or smaller than the threshold value TH enables the image data "UHD 60 Hz Enhanced2" and the image data "UHD HFR Enhanced3" to be distinguished from each other.

The image (60 Hz, HD image) having the high definition (HD) can be reproduced at the basic frame rate on the basis of the image data "HD 60 Hz Base" having the basic format. In addition, the image (120 Hz, HD image) having the high definition (HD) can be reproduced at the high frame rate on the basis of the image data "HD 60 Hz Base" having the basic format, and the image data "HD HFR Enhanced1" having the first enhancement format.

In addition, the image (60 Hz, UHD image) having the ultra-high definition (UHD) can be reproduced at the basic frame rate on the basis of the image data "UHD 60 Hz Base" having the basic format, and the image data "UHD 60 Hz Enhanced2" having the second enhancement format. In addition, the image (120 Hz, UHD image) having the ultra-high definition (UHD) can be reproduced at the high frame rate on the basis of the image data "HD 60 Hz Base" having the basic format, the image data "HD HFR Enhanced1" having the first enhancement format, the image data "UHD 60 Hz Enhanced2" having the second enhancement format, and the image data "UHD HFR Enhanced3" having the third enhancement format.

Figure 16:
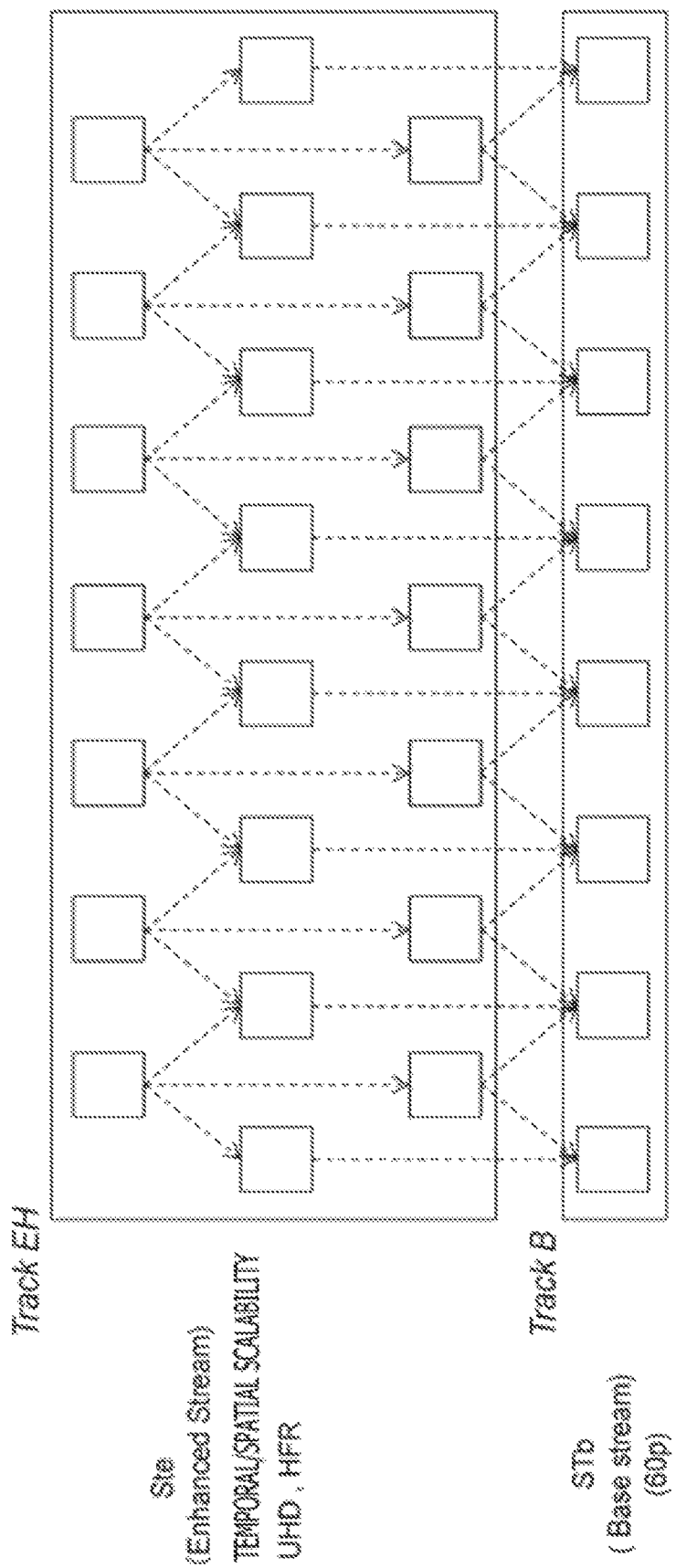
FIG. 16 is a diagram depicting a track structure of DASH/MP4 in case of transmission of 2 stream structures.

FIG. 16 depicts a track structure of DASH/MP4 in case of the transmission of the 2 stream structures. In this case, a track B corresponding to the basic video stream STb (Base stream), and a track EH corresponding to the enhancement video stream (Enhanced stream) are present.

The rectangular frames each indicate the pictures. An arrow indicates the response of the scalability. That is to say, the image having the high definition (HD) at the high frame rate, in a word, the image data of 120 Hz HD image is obtained by the enhancement of the temporal scalable stream in which the image data having the first enhancement format and contained in the track EH is used on the image data having the basic format and contained in the track B. In addition, the image having the ultra-high definition (UHD) at the basic frame rate, in a word, the image data of 60 Hz UHD image is obtained by the enhancement of the spatial scalable stream in which the image data having the second enhancement format and contained in the track EH is used on the image data having the basic format and contained in the track B.

In addition, the image having the ultra-high definition (UHD) at the high frame rate, in a word, image data of the 120 Hz UHD image is obtained by the enhancement of the spatial scalable stream, the temporal scalable stream in which the image data having the first, second and third enhancement formats and contained in the track EH are used on the image data having the basic format and contained in the track B.

Figure 17:
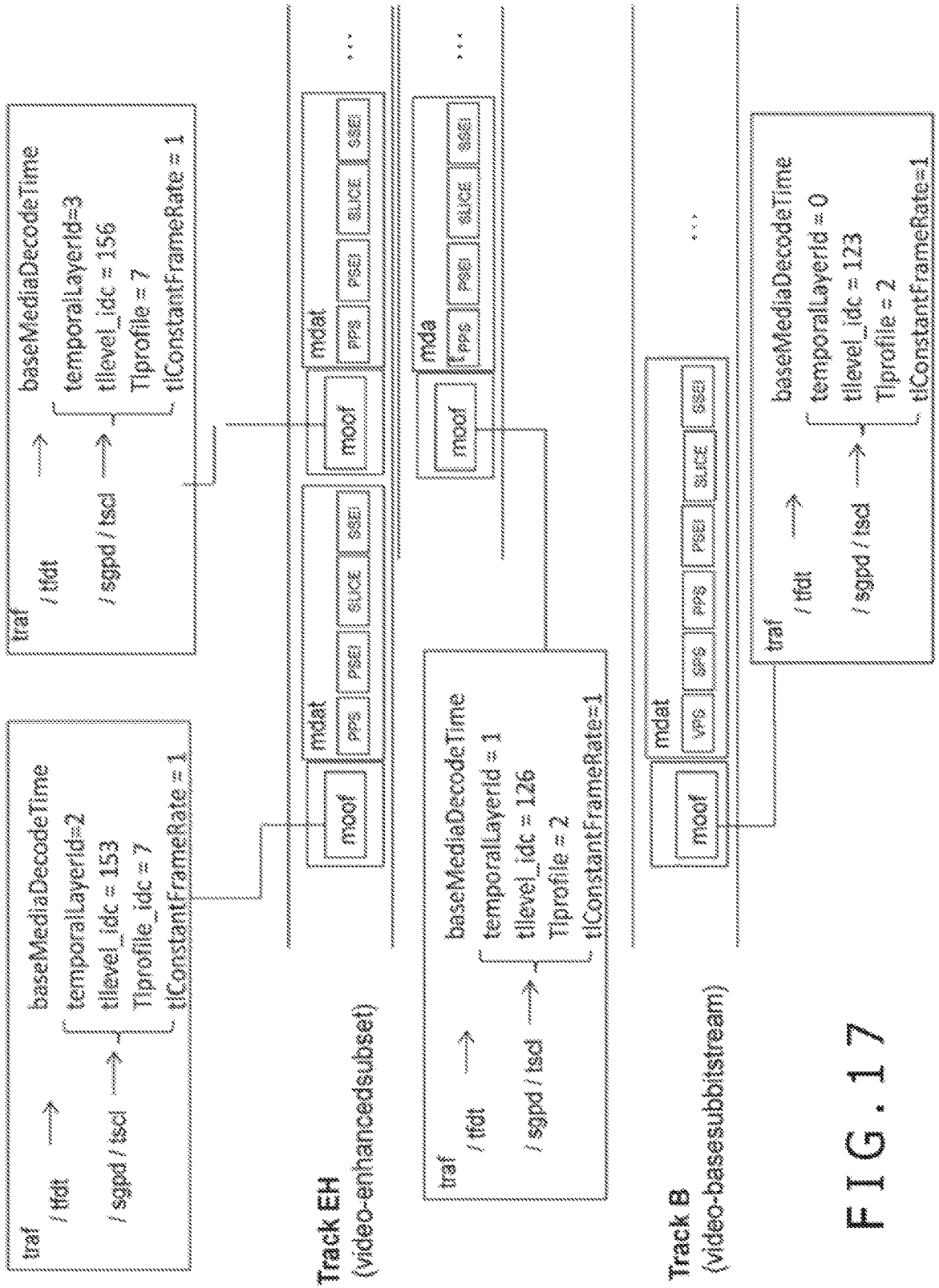
FIG. 17 is a block diagram depicting an example of a structure of an MP4 stream (file) containing data on respective tracks of a track B and a track EH.

FIG. 17 depicts an example of a structure of an MP4 stream (file) containing the data of the tracks: the track B; and the track EH. The illustrated example is an example in case of Fragmented MP4. A predetermined number of Movie Fragments each constituted by a "moof" box in which control information is put, and an "mdat" box in which a media data main body is put are arranged in the MP4 stream. Since fragments which are obtained by fragmenting the track data are put in the "mdat" box, the control information put in the "moof" box becomes control information associated with the fragments. It should be noted that although the detailed description is omitted herein, the estimation reference relationship straddling the tracks is defined by arranging an NAL type packet as an extractor in the track every access unit.

In the MP4 stream "video-based sub-bit stream" corresponding to the track B, the encoded image data (access unit), for the predetermined number of pictures, for example, 1 GOP, having the basic format is arranged in the "mdat" boxes of the respective movie fragments. Here, the respective access units are constituted by the NAC units such as "VPS," "SPS," "PPS," "PSEI," "SLICE," and "SSEI." It should be noted that "VPS," "SPS," for example, are inserted into the head picture of GOP.

In the MP4 stream "video-basesubbitstream" corresponding to the track B, a "traf" box is present in the "moof" boxes of the respective movie fragments, and a "tfdt" box is present in the "traf" box. The decoding time "baseMediaDecodeTime" of a first access unit after the "moof" box is described in the "tfdt" box.

In addition, a "tfdt" box is present in the "moof" box, a "sgpd" box is present in the "tfdt" box, and a "tscl" box is present in the "sgpd" box. Four parameters of "temporalLayerId," "tllevel_idc," "Tlprofile," and "tlConstantFrameRate" are described in the "tscl" box. "temporalLayerId"

exhibits a temporal ID (temporal_id). "tlConstantFrameRate" is set to "1," which exhibits that the frame rate is constant.

"tllevel_idc" indicates the level of the basic video stream STb, and is made to agree with "sublayer_level_idc[j−3]" of the element of the SPS (or VPS) described above. In this case, "tllevel_idc" is set to "123." "Tlprofile" indicates the profile of the basic video stream STb, and is made to agree with "sublayer_profile_idc[j−3]" of the element of the SPS (or VPS) described above. In this case, "Tlprofile" is set to "2."

In the MP4 stream "video-enhancedsubset" corresponding to the track EH, the encoded image data (access units), for a predetermined number of pictures, for example, 1 GOP, of the image data having the first enhancement format, the encoded image data (access units), for a predetermined number of pictures, for example, 1 GOP, of the image data having the second enhancement format, or the encoded image data (access units), for a predetermined number of pictures, for example, 1 GOP, of the image data having the third enhancement format is arranged in the "mdat" boxes of the respective movie fragments. Here, the respective access units are constituted by the NAL units such as "PPS," "PSEI," "SLICE," and "SSEI."

In the MP4 stream "video-enhancedsubset" corresponding to the track EH, a "traf" box is present in the "moof" boxes of the respective movie fragments, and "tfdt" box is present in the "traf" box. The decode time "baseMediaDecodeTime" of the first access unit after the "moof" box is described in the "traf" box.

In addition, a "tfdt" box is present in the "moof" box, a "sgpd" box is present in the "tfdt" box, and a "tscl" box is present in the "sgpd" box. Four parameters of "temporalLayerId," "tllevel_idc," "Tlprofile," and "tlConstantFrameRate" are described in the "tscl" box. "temporalLayerId" exhibits a temporal ID (temporal_id). "tlConstantFrameRate" is set to "1," which exhibits that the frame rate is constant.

In the "moof" box of the movie fragments each corresponding to the image data having the first enhancement format, "tllevel_idc" exhibits the level of the whole streams of the first enhancement video stream (constituted by the access unit of the image data having the first enhancement format 1), the basic video stream STb, and is made to agree with "sublayer_level_idc[j−2]" of the element of SPS (VPS). In this case, "tllevel_idc" is set to "126." "Tlprofile" indicates the profile of the whole streams of the first enhancement video stream, the basic video stream STb, and is made to agree with "sublayer_profile_idc[j−2]" of the element of the SPS (or VPS). In this case, "Tlprofile" is set to "2."

In the "moof" box of the movie fragments each corresponding to the image data having the second enhancement format, "tllevel_idc" exhibits the level of the whole streams of the second enhancement video stream (constituted by the access unit of the image data having the second enhancement format), the first enhancement video stream (constituted by the access unit of the image data having the first enhancement format), and the basic video stream STb, and is made to agree with "sublayer_level_idc[j−1]" of the element of SPS (VPS). In this case, "tllevel_idc" is set to "153." "Tlprofile" exhibits the profile of the whole streams of the second enhancement video stream, the first enhancement video stream, and the basic video stream STb, and is made to agree with "sublayer_profile_idc[j−1]" of the element of SPS (VPS). In this case, "Tlprofile" is set to "7."

In addition, in the "moof" box of the movie fragments each corresponding to the image data having the third enhancement format, "tllevel_idc" exhibits the level of the whole streams of the enhancement video stream STe, the basic video stream STb, and is made to agree with "general_level_idc" of the element of SPS (VPS). In this case, "tllevel_idc" is set to "156." "Tlprofile" exhibits the profile of the whole streams of the enhancement video stream STe, and the basic video stream STb, and is made to agree with "general_profile_idc" of the element of SPS (VPS). In this case, "Tlprofile" is set to "7."

In the MP4 stream "video-enhancedsubset" corresponding to the track EH, as described above, the access units of the image data, for a predetermined number of pictures, having the first enhancement format, the access units of the image data, for a predetermined number of pictures, having the second enhancement format, or the access units of the image data, for a predetermined number of pictures, having the third enhancement format are arranged in the "mdat" boxes of the respective movie fragments.

An SEI NAL unit having the identification information exhibiting that the stream is the temporal scalable stream, the identification information exhibiting that the image data having the basic format is the image data obtained by executing the mixing processing, and the information associated with the mixing ratios (first, second ratios) is inserted into the respective access units of the image data having the first enhancement format. In addition, an SEI NAL unit having the identification information exhibiting that the stream is the spatial scalable stream, and the information exhibiting the ratio of the spatial scalable stream is inserted into the respective access units of the image data having the second enhancement format.

In addition, an SEI NAL unit having the identification information exhibiting that the stream is the temporal scalable stream, the identification information exhibiting that the image data having the basic format is the image data obtained by executing the mixing processing, the information associated with the mixing ratios (first, second ratios), the identification information exhibiting that the stream is the spatial scalable stream, and the information exhibiting the ratio of the spatial scalable stream is inserted into the respective access units of the image data having the third enhancement format.

In this embodiment, the video scalability SEI (refer to FIG. 11) which is newly defined is inserted into the portion of "SEIs" of the access unit (AU).

In the MP4 stream "video-enhancedsubset" corresponding to the track EH, the identification information exhibiting that the stream is the temporal scalable stream, the identification information exhibiting that the image data having the basic format is the image data obtained by executing the mixing processing, and the information associated with the mixing ratios (first, second ratios) are inserted into the "moof" box corresponding to "mdat" having the access unit of the image data having the first enhancement format.

Further, in the MP4 stream "video-enhancedsubset" corresponding to the track EH, the identification information exhibiting that the stream is the spatial scalable stream, the information exhibiting the ratio of the spatial scalable stream are inserted into the "moof" box corresponding to "mdat" having the access unit of the image data having the second enhancement format.

In addition, in the MP4 stream "video-enhanced subset" corresponding to the track EH, the identification information exhibiting that the stream is the temporal scalable stream, the identification information exhibiting that the stream is the temporal stream, the identification information exhibiting that the image data having the basic format is the image data obtained by executing the mixing processing, and the information associated with the mixing ratios (first, second ratios), the information exhibiting that the stream is the spatial scalable stream, and the information exhibiting the ratio of the spatial scalable stream are inserted into the "moof" box corresponding to "mdat" having the access unit of the image data having the third enhancement format.

In this embodiment, a box of "udta" or "lays" is provided under the "moof" box, and a Syntax of a video scalability information descriptor (refer to FIG. 13) which is newly defined is transmitted.

FIG. 18 depicts an example of a description of an MPD file in case of the transmission of the 2 stream structures (refer to FIG. 15). Subrepresentations each corresponding to a basic video stream STb (Base stream), an enhancement video stream STe (Enhanced stream) are present in the MPD file. Moreover, subrepresentations each corresponding to the first, second, third enhancement video streams (constituted by the access unit of the image data having the first, second, third enhancement formats) are present in the representation of the enhancement video stream STe.

In the representation associated with the basic video stream STb (HD Base stream), the description of "frame rate="60"," "codes="hev1.A.L123, xx," "id="tag0"" are present. "framerate="60" & L123 with no dependencyid" exhibits the basic stream of 2K 60P, and ""A"" exhibits a value of 2 exhibiting "Main 10 Profile." Information associated with the level and the profile agrees with "sublayer_level_idc[j−3]," "sublayer_profile_idc[j−3]" of the elements of SPS (VPS) described above. Incidentally, "sublayer_profile_idc[j−3]"="Main 10 Profile," and "sublayer_level_idc[j−3]"="level 4.1"="123." In addition, from the description of "<BaseURL>video-basesubbitstream.mp4</BaseURL>," a location destination of the basic-video stream STb (HD Base stream) is indicated as "video-basesubbitstream.mp4."

In the representation associated with the first enhancement video stream, the description of "framerate="120"," "codes="hev1.B. L126, xx"," "id="tag1"" is present. "framerate="120" & L126 with dependencyid tagged tag0" exhibits that the stream of 2K 120P is realized. ""B"" exhibits a value of 2 exhibiting "main 10 Profile." Information associated with the level and the profile agrees with "sublayer_level_idc[j−2]," "sublayer_profile_idc[j−2]" of the elements of SPS (or VPS) described above. Incidentally, "sublayer_profile_idc[j−2]"="Main 10 Profile," and "sublayer_level_idc[j−2]"="level 4.2"="126."

In the sub-representation associated with the second enhancement video stream, the description of "framerate="60"," ""codecs=" her1.C.L153, xx"," "id="tag2"," and "dependencyid="tag0"" is present. "Framerate="60"& L153 with dependencyid tagged tag0" exhibits that the stream of 4K 60P is realized on the basic stream by enhancement. ""C"" exhibits a value of 7 exhibiting "Scalable Main 10 Profile." The information associated with the level and the profile agrees with "sublayer_level_idc[j−1]," "sublayer_profile_idc[j−1]" of the elements of SPS (VPS) described above. Incidentally, "sublayer_profile_idc[j−1]"="Scalable Main 10 Profile," and "sublayer_level_idc[j−1]"=level 5.1"="153."

In the sub-representation associated with the third enhancement video stream STb, the description of "framerate="120"," ""codecs=" her1.D.L156, xx"," "id="tag3"," and "dependencyid="tag0, tag1, tag2" is present. "framerate="120"& L156 with dependencyid tagged tag0, tag1, tag2" exhibits that the stream of 2K 120P is realized on the basic stream on the basic stream by enhancement and the enhancement component is added thereon to realize the stream of 4K 120P. ""D"" exhibits a value of 7 exhibiting "scalable Main 10 Profile." The information associated with the level and the profile agrees with "general_level_idc," "general_profile_idc" of the elements of SPS (VPS) described above. Incidentally, "general_profile_idc"="Scalable Main 10 Profile," and "general_level_idc"="level 5.2"="156."

In addition, the representation associated with the enhancement video stream STe (UHD EH stream), from the description of "<BaseURL>video-enhancedsubset.mp4</BaseURL>," the location destination of the enhancement video stream STe (UHD EH stream) is indicated as "video-enhancedsubset.mp4."

In such a way, the information exhibiting the response of the scalability is inserted into the MPD file, and it is represented that the spatial scalability, and the temporal scalability are simultaneously realized.

[Example of Configuration of Service Transmission System]

Figure 19:
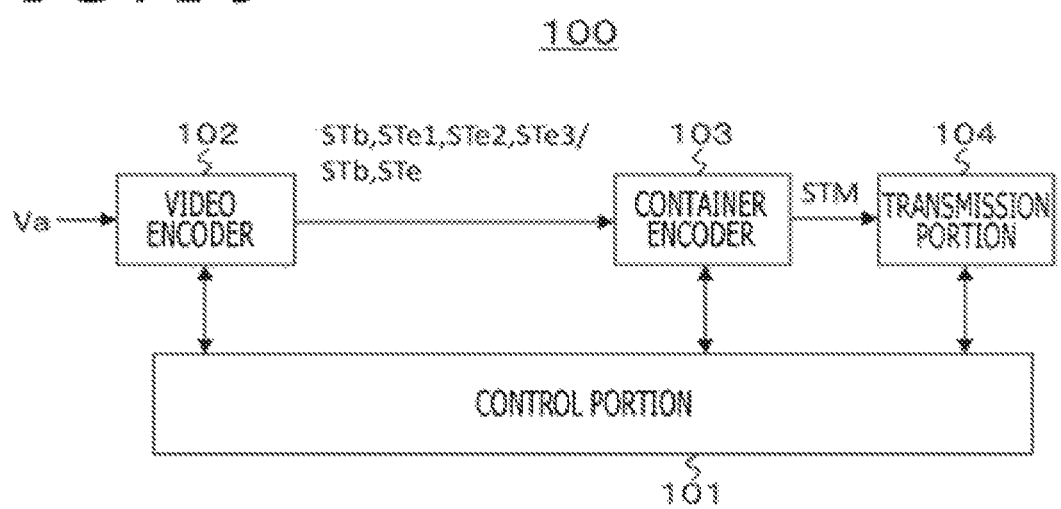
FIG. 19 is a block diagram depicting an example of a configuration of a service transmission system.

FIG. 19 depicts an example of a configuration of a service transmission system 100. The service transmission system 100 has a control portion 101, a video encoder 102, a container encoder 103, and a transmission portion 104.

The control portion 101 is configured to include a Central Processing Unit (CPU), and controls operations of the respective portions of the service transmission system 100 on the basis of a control program. The video encoder 102 receives as its input image data Va exhibiting the ultra-high definition (UHD) at the high frame rate (HFR), and outputs the basic video stream STb and the enhancement video streams STe1, STe2, STe3, or the basic video stream STb and the enhancement video stream STe.

Figure 20:
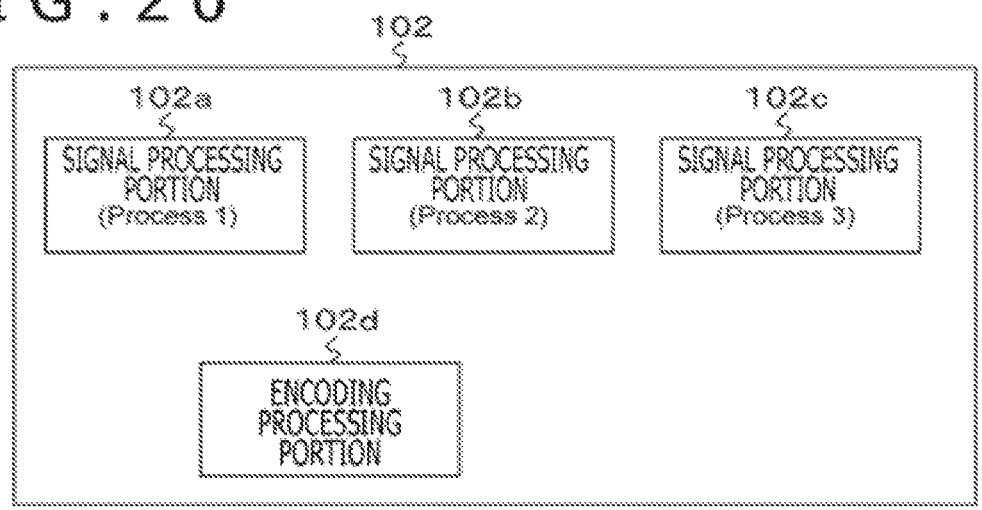
FIG. 20 is a block diagram schematically depicting a configuration of a video encoder.

FIG. 20 schematically depicts a configuration of the video encoder 102. The video encoder 102 includes a signal processing portion 102a, a signal processing portion 102b, a signal processing portion 102c, and an encoding processing portion 102d. In this case, the signal processing portion 102a executes processing of a Process 1, and the signal processing portion 102b executes processing of a Process 2. The signal processing portion 102c executes processing of a Process 3, and the encoding processing portion 102d executes general encoding processing.

Figure 21:
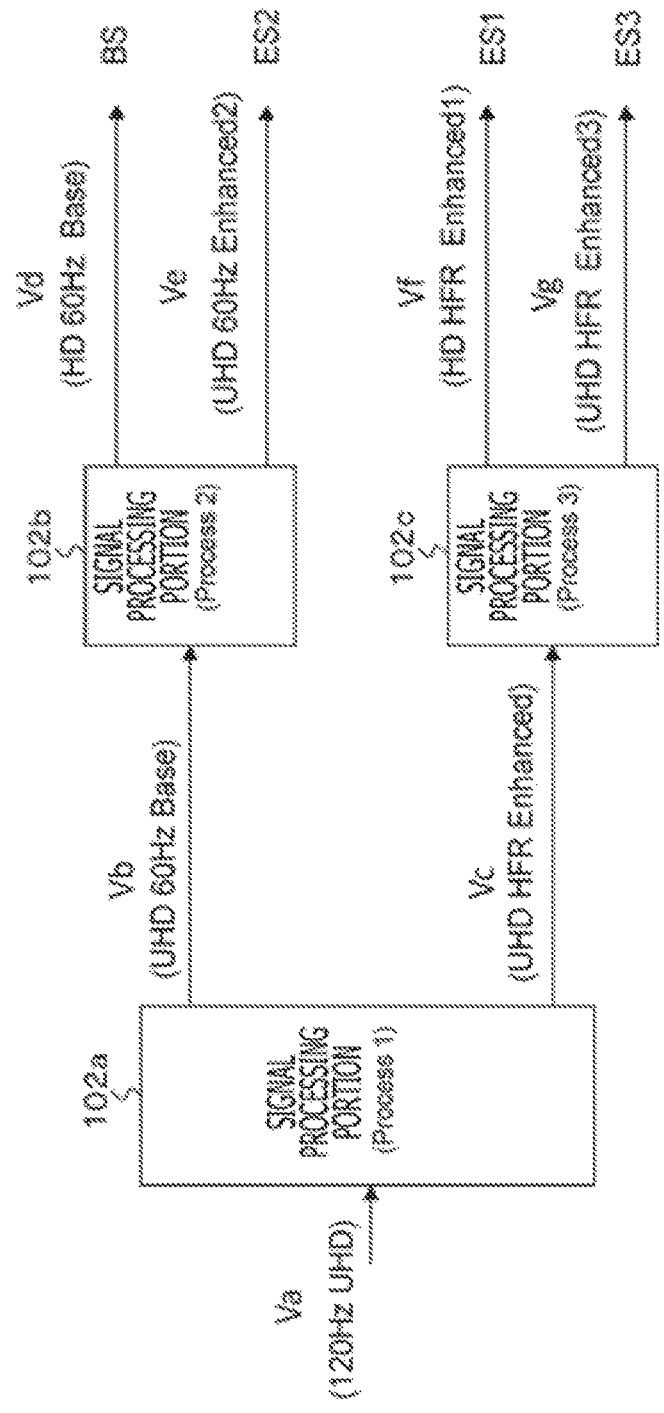
FIG. 21 is a block diagram depicting portions of respective signal processing portions for executing processes 1, 2, 3 in the video encoder.

FIG. 21 depicts portions of the signal processing portion 102a, the signal processing portion 102b, and the signal processing portion 102c in the video encoder 102. An illustrated example indicates the case where the high frame rate is 120 Hz. The signal processing portion 102a processes the image data Va (120 Hz UHD) exhibiting the ultra-high definition at the high frame rate, and obtains first image data Vb (UHD 60 Hz Base) as the image data at the basic frame rate, and second image data Vc (UHD HFR Enhanced) as the image data of the enhancement frame at the high frame rate.

The signal processing portion 102b processes the first image data Vb (UHD 60 Hz Base), and obtains the image data Vd (HD 60 Hz Base) becoming image data BS, having the basic format, from which image having high definition at the basic frame rate is to be obtained, and the image data Ve (UHD 60 Hz Enhanced2) becoming image data ES2, having the second enhancement format at the basic frame rate, from which image having ultra-high definition is to be obtained. The signal processing portion 102c processes the second image data Vc (UHD HFR Enhanced), and obtains image data Vf (HD HFR Enhanced1) becoming image data ES1, having the first enhancement format, from which image having high definition at the high frame rate is to be obtained, and image data Vg (UHD HFR Enhanced3) becoming image data ES3, having the third enhancement format at the high frame rate, from which image having ultra-high definition is to be obtained.

Figure 22:
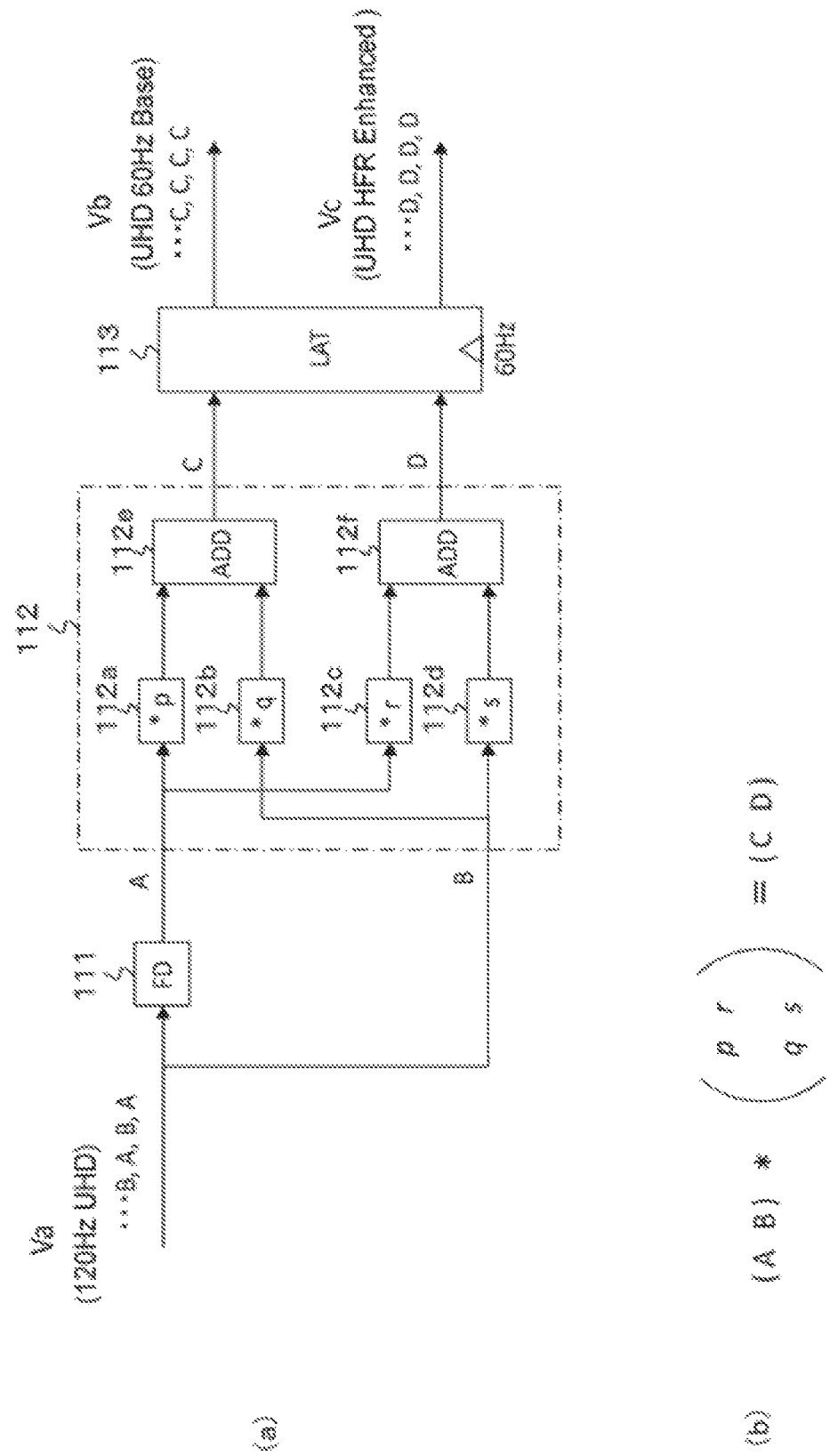
FIG. 22 is a block diagram depicting an example of a configuration of the signal processing portion for executing the processing of the process 1.

FIG. 22(a) depicts an example of a configuration of the signal processing portion 102a. The signal processing portion 102a has a delay circuit 111, an arithmetic operation circuit 112, and a latch circuit 113. In this case, the delay circuit 111 delays the image data by one frame of 120 fps. The latch circuit 113 carries out the latch by using a latch pulse having 60 Hz. In addition, the arithmetic operation circuit 112 has coefficient multiplying portions 112a, 112b, 112c, 112d, and addition portions 112e, 112f.

The coefficient multiplying portions 112a, 112b and the addition portion 112e are used to execute the mixing processing at a first ratio in units of the temporally continuous two pictures. In the coefficient multiplying portion 112a, multiplying is carried out by a coefficient p, and in the coefficient multiplying portion 112b, multiplying is carried out by a coefficient q. It should be noted that p=0 to 1, and q=1−p. In addition, the coefficient multiplying portions 112c, 112d and the addition portion 112f are used to execute the mixing processing at a second ratio in units of the temporally continuous two pictures. In the coefficient multiplying portion 112c, multiplying is carried out by a coefficient r, and in the coefficient multiplying portion 112d, multiplying is carried out by a coefficient s. It should be noted that r=0 to 1, and s=1−r.

After the image data Va (120 Hz UHD) exhibiting the ultra-high definition at the high frame rate is delayed in the delay circuit 111 by one frame, the resulting image data Va is inputted to each of the coefficient multiplying portions 112a, 112c constituting the arithmetic operation circuit 112. In addition, the image data Va is inputted to each of the coefficient multiplying portions 112b, 112d constituting the arithmetic operation circuit 112 as it is. Outputs from the coefficient multiplying portions 112a, 112b are inputted to the addition portion 112e to be added to each other. In addition, outputs from the coefficient multiplying portions 112c, 112d are inputted to the addition portion 112f to be added to each other.

Here, when the pieces of image data of the temporally continuous two pictures of the image data P are assigned A and B, at a timing at which the output from the delay circuit 111 becomes A, a mixed output of C (=p*A+q*B) is obtained as the output from the addition portion 112e, and the mixed output of D (=r*A+s*B) is obtained as the output from the addition portion 112f. FIG. 22(b) expresses an arithmetic operation for the mixing processing in the arithmetic operation circuit 112 in the form of a mathematic expression.

Outputs from the addition circuits 112e, 112f of the arithmetic operation circuit 112 are inputted to the latch circuit 113. In the latch circuit 113, the outputs from the addition circuits 112e, 112f of the arithmetic operation circuit 112 are latched by using a latch pulse having 60 Hz, thereby obtaining the first image data Vb (UHD 60 Hz Base), and the second image data Vc (UHD HFR Enhanced).

Here, the first image data Vb is obtained by executing the mixing processing at the first ratio in units of the temporally continuous two pictures in the image data Va. In addition, the second image data Vc is obtained by executing the mixing processing at the second ratio in units of the temporally continuous two pictures in the image data Va.

Figure 23:
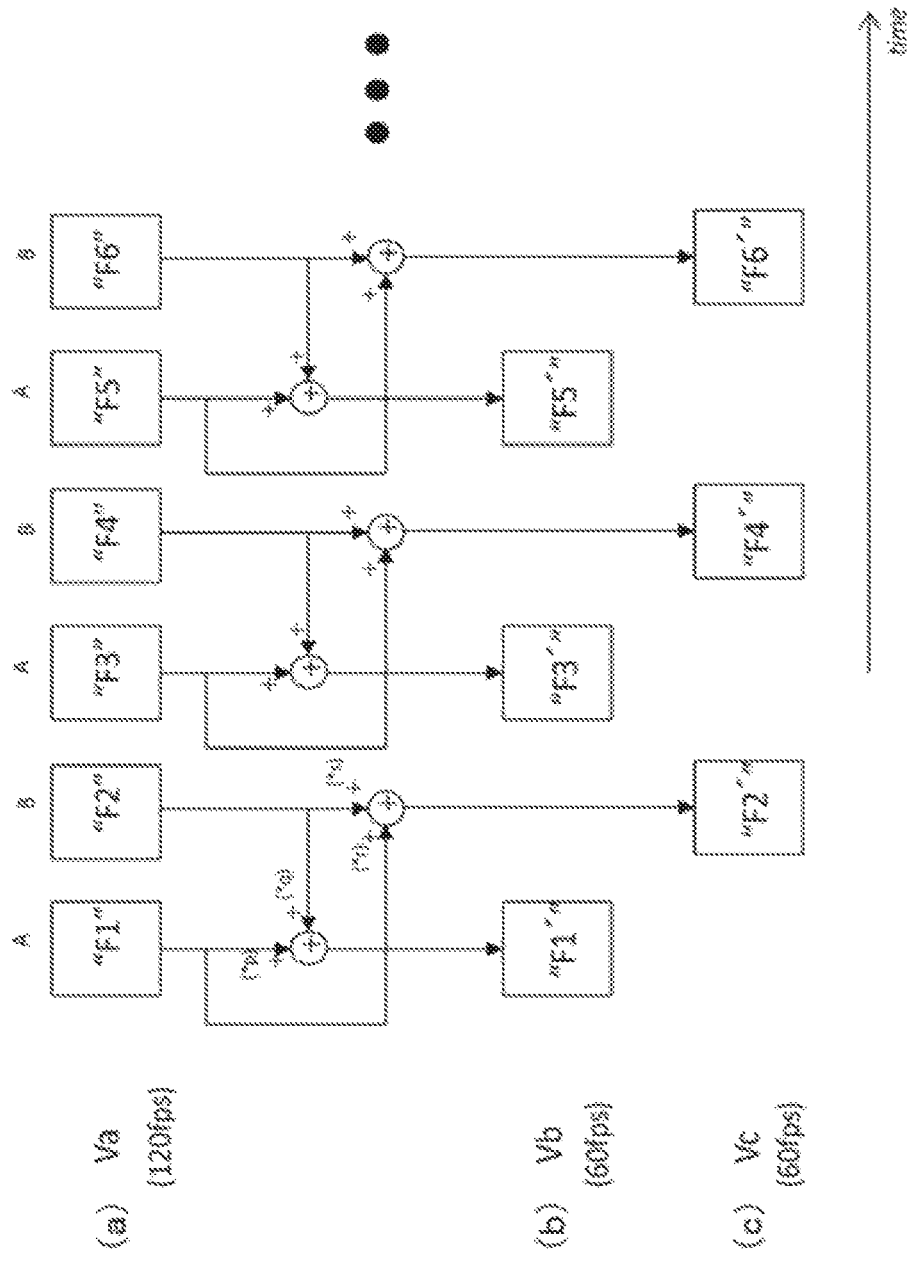
FIG. 23 is a block diagram schematically representing an example of a relationship between input data (image data Va) and output data (image data Vb, Vc) in the signal processing portion for executing the processing of the process 1.

FIG. 23 schematically depicts an example of a relationship between the input data (image data Va) to the signal processing portion 102a, and the output data (image data Vb, Vc) from the signal processing portion 102a. FIG. 23(a) depicts the image data Va, FIG. 23(b) depicts the image data Vb, and FIG. 23(c) depicts the image data Vc. Image data F1', F3', F5', . . . of the respective pictures of the image data Vb of 60 fps, and image data F2', F4', F6', . . . of the respective pictures of the image data Vc of 60 fps are obtained in response to image data F1, F2, F3, F4, F5, F6, F7, F8, . . . of the respective pictures of the image data Va of 120 fps.

Figure 24:
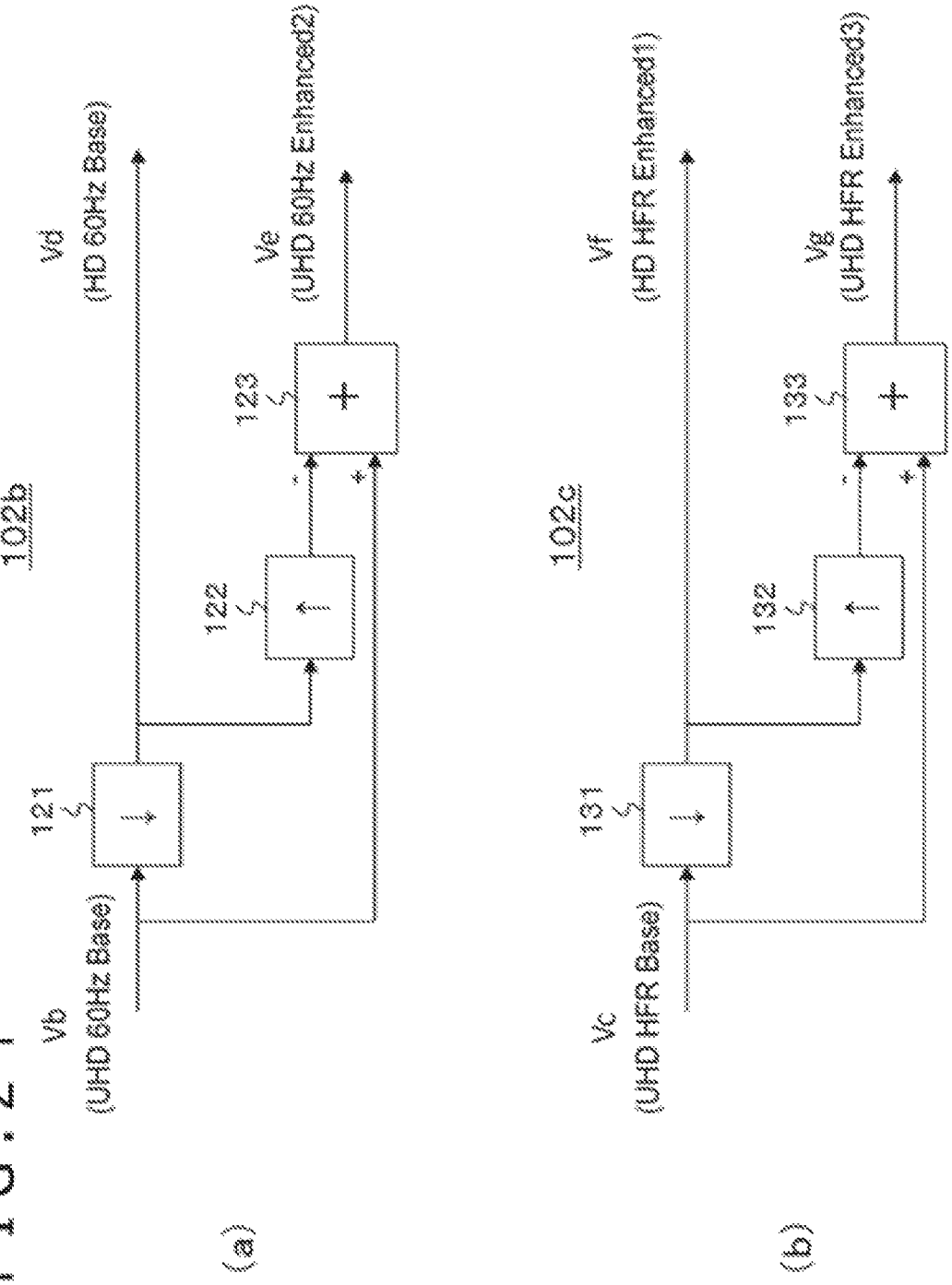
FIG. 24 is a block diagram depicting an example of a configuration of the signal processing portions for executing the processing of the processes 2, 3.

FIG. 24(a) depicts an example of a configuration of a signal processing portion 102b. The signal processing portion 102b has a down-scale circuit 121, an up-scale circuit 122, and an arithmetic operation circuit 123. The first image data Vb (UHD 60 Hz Base) is inputted to the down-scale circuit 121. The down-scale circuit 121 executes down-scale processing from the ultra-high definition to the high definition for the first image data Vb, thereby obtaining the image data Vd (HD 60 Hz Base) becoming image data BS having the basic format.

In addition, the image data Vd obtained in the down-scale circuit 121 is inputted to the up-scale circuit 122. The up-scale circuit 122 executes up-scale processing from the high definition to the ultra-high definition for the image data Vd, thereby obtaining the third image data. The third image data has the same definition as that of the first image data Vb. However, the third data is obtained by executing the down-scale processing for the first image data Vb and further by executing the up-scale processing. Thus, the information lost in the down-scale processing is not reproduced.

The first image data Vb and the third image data obtained in the up-scale circuit 122 are inputted to the arithmetic operation circuit 123. The arithmetic operation circuit 123 obtains a difference between the two pieces of image data, thereby obtaining the image data Ve (UHD 60 Hz Enhanced2) becoming image data ES2 having the second enhancement format.

FIG. 24(b) depicts an example of a configuration of the signal processing portion 102c. The signal processing portion 102c has a down-scale circuit 131, an up-scale circuit 132, and an arithmetic operation circuit 133. The second image data Vc (UHD HFR Enhanced) is inputted to the down-scale circuit 131. The down-scale circuit 131 executes down-scale processing from the ultra-high definition to the high definition for the second image data Vc, thereby obtaining image data Vf (HD HFR Enhanced1) becoming image data ES1 having the first enhancement format.

In addition, the image data Vf obtained in the down-scale circuit 131 is inputted to the up-scale circuit 132. The up-scale circuit 132 executes the up-scale processing from the high definition to the ultra-high definition for the image data Vf, thereby obtaining fourth image data. The fourth image data has the same definition as that of the second image data Vc. However, the fourth data is obtained by executing the down-scale processing for the second image data Vc and further by executing the up-scale processing. Thus, the information lost in the down-scale processing is not reproduced.

The second image data Vc and the fourth image data obtained in the up-scale circuit 132 are inputted to the arithmetic operation circuit 133. The arithmetic operation circuit 133 obtains a difference between the two pieces of image data, thereby obtaining the image data Vg (UHD HFR Enhanced3) becoming image data ES3 having the third enhancement format.

Referring back to FIG. 19, the video encoder 102 inserts the video scalability SEI (refer to FIG. 11) described above which is newly defined into portions of "SEIs" of the access units (AU) of the image data ES1, ES2, ES3 having the first, second, and third enhancement formats.

As a result, the identification information exhibiting that the stream is the temporal scalable stream, the identification information exhibiting that the image data having the basic format is the image data obtained by executing the mixing processing, and the information associated with the mixing ratios (first, second ratios) are inserted into the respective access units of the image data ES1 having the first enhancement format. In addition, the identification information exhibiting that the stream is the spatial scalable stream, and the information exhibiting the ratio of the spatial scalable stream are inserted into the respective access units of the image data ES2 having the second enhancement format.

In addition, the identification information exhibiting that the stream is the temporal scalable stream, the identification information exhibiting that the image data having the basic format is the image data obtained by executing the mixing processing, the information associated with the mixing ratios (first, second ratios), the identification information exhibiting that the stream is the spatial scalable stream, and the information exhibiting the ratio of the spatial scalable stream are inserted into the respective access units of the image data ES3 having the third enhancement format.

The container encoder 103 produces the container containing the basic video stream STb and the enhancement video streams STe1, STe2, STe3 which are obtained in the video encoder 102, or the basic video stream STb and the enhancement video stream STe which are obtained in the video encoder 102, the MP4 (refer to FIG. 8, FIG. 17) in this case, as the delivery stream STM.

In this case, the container encoder 103 provides the box of "udta" or "lays" under the "moof" box in the MP4 stream corresponding to the enhancement video streams STe1, STe2, STe3, or the enhancement video stream STe, and inserts the video scalability information descriptor described above (refer to FIG. 13).

As a result, the identification information exhibiting that the stream is the temporal scalable stream, the identification information exhibiting that the image data having the basic format is the image data obtained by executing the mixing processing, and the information associated with the mixing ratios (first, second ratios) are inserted into the "moof" box corresponding to the "mdat" box having the access unit of the image data ES1 having the first enhancement format. In addition, the identification information exhibiting that the stream is the spatial scalable stream, and the information exhibiting the ratio of the spatial scalable stream are inserted into the "moof" box corresponding to the "mdat" box having the access units of the image data ES2 having the second enhancement format.

In addition, the identification information exhibiting that the stream is the temporal scalable stream, the identification information exhibiting that the image data having the basic format is the image data obtained by executing the mixing processing, and the information associated with the mixing ratios (first, second ratios), the identification information exhibiting that the stream is the spatial scalable stream, and the information exhibiting the ratio of the spatial scalable stream are inserted into the "moof" box corresponding to the "mdat" box having the access unit of the image data ES3 having the third enhancement format.

The transmission portion 104 transmits the delivery stream STM of the MP4 obtained in the container encoder 103 to the service receiver 200 with the delivery stream STM of the MP4 being placed on the broadcasting wave or the packet of the Internet.

An operation of the service transmission system 100 depicted in FIG. 19 will be described in brief. The image data Va having the ultra-high definition (UHD) at the high frame rate (HFR) is inputted to the video encoder 102. The video encoder 102 processes the image data Va, thereby obtaining the basic video stream STb and the enhancement video streams STe1, STe2, STe3, or the basic video stream STb and the enhancement video stream STe.

Here, the access unit of the image data BS, having the basic format, from which the image having the high definition at the basic frame rate is to be obtained is contained in the basic video stream STb. The access unit of the image data ES2, having the second enhancement format, from which the image having the high definition at the high frame rate is to be obtained is contained in the enhancement video stream STb. In addition, the access unit of the image data ES2, having the second enhancement format from which the image having the high definition at the high frame rate is to be obtained is contained in the enhancement video stream STe1.

In addition, the access unit of the image data ES2, having the second enhancement format, from which the image having the ultra-high definition at the basic frame rate is to be obtained is contained in the enhancement video stream STe2. The access unit of the image data ES3, having the third enhancement format, from which the image having the ultra-high definition at the high frame rate is to be obtained is contained in the enhancement video stream STe3. The access units of the image data ES1, ES2, ES3 having the first, second, third enhancement formats, respectively, are contained in the enhancement video streams STe.

In the video encoder 102, the video scalability SEI (refer to FIG. 11) is inserted into the portion of "SEIs" of the access units (AU) of the image data ES1, ES2, SE3 having the first, second, third enhancement formats, respectively. As a result, the identification information exhibiting that the stream is the temporal scalable stream, the identification information exhibiting that the image data having the basic format is the image data obtained by executing the mixing processing, and the information associated with the mixing ratios (first, second ratios) are inserted into the access units of the image data ES1.

In addition, the identification information exhibiting that the stream is the spatial scalable stream, and the information exhibiting the mixing ratio of the spatial scalable stream are inserted into the respective access units of the image data ES2 of the image data ES2. In addition, the identification information exhibiting that the stream is the temporal scalable stream, the identification information exhibiting that the image data having the basic format is the image data obtained by executing the mixing processing, the information associated with the mixing ratios (first, second ratios), the identification information exhibiting that the stream is the spatial scalable stream, and the information exhibiting the ratio of the spatial scalable stream are inserted into the respective access units of the image data ES3.

The basic video stream STb and the enhancement video streams STe1, STe2, STe3, or the basic video stream STb and the enhancement video stream STe which are obtained in the video encoder 102 are supplied to the container encoder 103. The container encoder 103 produces the MP4 (refer to FIG. 8, FIG. 17) containing the basic video stream STb and the enhancement video streams STe1, STe2, STe3, or the basic video stream STb and the enhancement video stream STe as the delivery stream STM.

In this case, in the container encoder 103, in the MP4 stream corresponding to the enhancement video streams STe1, STe2, STe3, or the MP4 stream corresponding to the enhancement video stream STe, the box of "udta" or "lays" is provided under the "moof" box, and the video scalability information descriptor (refer to FIG. 13) is inserted.

As a result, the identification information exhibiting that the stream is the temporal scalable stream, the identification information exhibiting that the image data having the basic format is the image data obtained by executing the mixing processing, and the information associated with the mixing ratios (first, second ratios) are inserted into the "moof" box corresponding to the "mdat" box having the access unit of the image data ES1. In addition, the identification information exhibiting that the stream is the spatial scalable stream, and the information exhibiting the ratio of the spatial scalable stream are inserted into the "moof" box corresponding to the "mdat" box having the access unit of the image data ES2.

In addition, the identification information exhibiting that the stream is the temporal scalable stream, the identification information exhibiting that the image data having the basic format is the image data obtained by executing the mixing processing, the information associated with the mixing ratios (first, second ratios), the identification information exhibiting that the stream is the spatial scalable stream, and the information exhibiting the ratio of the spatial scalable stream are inserted into the "moof" box corresponding to the "mdat" box having the access unit of the image data ES3.

The delivery stream STM produced in the container encoder 103 is transmitted to the transmission portion 104. The transmission portion 104 transmits the delivery stream STM of the MP4 to the service receiver 200 with the delivery stream STM of the MP4 being placed on the broadcasting wave or the packet of the Internet.

[Example of Configuration of Service Receiver]

Figure 25:
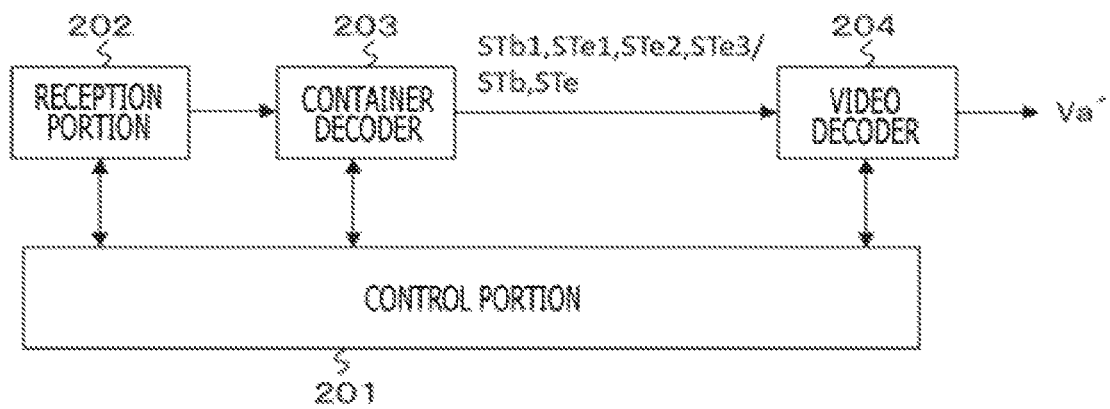
FIG. 25 is a block diagram depicting an example of a configuration of a service receiver which can process moving image data exhibiting ultra-high definition at a high frame rate.

FIG. 25 depicts an example of a configuration of a service receiver 200A which can process the moving image data exhibiting the ultra-high definition at the high frame rate. The service receiver 200A has a control portion 201, a reception portion 202, a container decoder 203, and a video decoder 204.

The control portion 201 is configured to include a Central Processing Unit (CPU), and controls operations of the respective portions of the service transmitter 200A on the basis of a control program. The reception portion 202 receives the delivery stream STM of the MP4 sent thereto with the delivery stream STM of the MP4 being placed on the broadcasting wave or the packet of the Internet from the service transmission system 100.

The container decoder 103 extracts the basic video stream STb and the enhancement video streams STe1, STe2, STe3, or the basic video stream STb and the enhancement video stream STe from the MP4. As described above, the access unit of the image data BS, having the basic format, from which the image having the high definition at the basic frame rate is to be obtained is contained in the basic video stream STb. In addition, the access unit of the image data ES1, having the first enhancement format, from which the image having the high definition at the high frame rate is to be obtained is contained in the enhancement video stream STe1.

In addition, the access unit of the image data ES2, having the second enhancement format, from which the image having the ultra-high definition at the basic frame rate is to be obtained is contained in the enhancement video stream STe2. The access unit of the image data ES3, having the third enhancement format, from which the image having the ultra-high definition at the high frame rate is to be obtained is contained in the enhancement video stream STe3. In addition, the access units of the image data ES1, ES2, ES3 having the first, second, third enhancement formats, respectively, are contained in the enhancement video stream STE.

In addition, the container decoder 203 extracts the meta information from the MP4, and sends the meta information to the control portion 201. The video scalability information descriptor (refer to FIG. 13) inserted into the box of "udta" or "lays" provided under the "moof" box in the MP4 stream corresponding to the enhancement video streams STe1, STe2, STe3, or the enhancement video stream STe is also contained in the meta information.

The control portion 201 recognizes that the enhancement by the image data ES1 having the first enhancement format is temporal scalable, the image data BS having the basic format is the image data obtained by executing the mixing processing, the mixing ratios (first, second ratios), and so forth from the video scalability information descriptor. In addition, the control portion 201 recognizes that the enhancement by the image data ES2 having the second enhancement format is spatial scalable, the ratio of the spatial scalable stream, and so forth from the video scalability information descriptor SEI.

In addition, the control portion 201 recognizes that the enhancement by the image data ES3 having the third enhancement format is temporal scalable and spatial scalable, the image data BS having the basic format is the image data obtained by executing the mixing processing, the mixing ratios (first, second ratios), the ratio of the spatial scalable stream, and so forth from the video scalability information descriptor.

The video decoder 204 processes the basic video stream STb and the enhancement video streams STe1, STe2, STe3 or the basic video stream STb and the enhancement video stream STe which are extracted in the container decoder 203, thereby obtaining image data Va' having the ultra-high definition (UHD) at the high frame rate (HFR). Here, a dash "'" of the image data Va' means that it is possible that because of through the processing of encoding, decoding, the image data Va' does not become perfectly the same value as that of the image data Va which is inputted to the video encoder 102 described above (refer to FIG. 19). This also applies the following other image data.

Here, the video decoder 204 extracts a parameter set or the SEI which is inserted into the access units constituting the video streams and sends the parameter set or the SEI to the control portion 201. The video scalability SEI (refer to FIG. 11) inserted into the access units (AU) of the image data ES1, ES2, ES3 having the first, second, third enhancement formats, respectively, is also contained in SEI.

The control portion 201 recognizes that the enhancement by the image data ES1 having the first enhancement format is temporal scalable, the image data BS having the basic format is the image data obtained by executing the mixing processing, the mixing ratios (first, second ratios), and so forth from the video scalability SEI. In addition, the control portion 201 recognizes that the enhancement by the image data ES2 having the second enhancement format is spatial scalable, the ratio of the spatial scalable stream, and so forth from the video scalability SEI.

In addition, the control portion 201 recognizes that the enhancement by the image data ES3 having the third enhancement format is temporal scalable and spatial scalable, the image data BS having the basic format is the image data obtained by executing the mixing processing, the mixing ratios (first, second ratios), the ratio of the spatial scalable stream, and so forth from the video scalability SEI.

Figure 26:
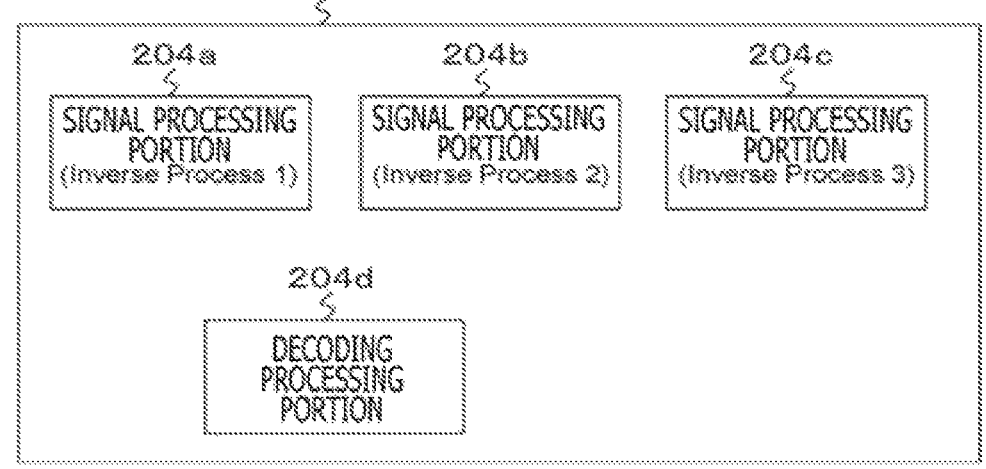
FIG. 26 is a block diagram schematically depicting a configuration of a video decoder.

FIG. 26 schematically depicts a configuration of the video decoder 204. The video decoder 204 includes a signal processing portion 204a, a signal processing portion 204b, a signal processing portion 204c, and a decoding processing portion 204d. In this case, the signal processing portion 204a executes processing of an Inverse Process 1, and the signal processing portion 204b executes processing of an inverse process 2. The signal processing portion 204c executes processing of an inverse process 3, and the decoding processing portion 204d executes general decoding processing.

Here, the processing of the inverse process 1 is inverse processing to the processing of the process 1 which is executed in the signal processing portion 102a of the video encoder 102 described above. Likewise, the processing of the inverse process 2 is inverse processing to the processing of the process 2 which is executed in the signal processing portion 102b of the video encoder 102 described above. In addition, likewise, the processing of the inverse process 3 is inverse processing to the processing of the process 3 which is executed in the signal processing portion 102c of the video encoder 102 described above.

Figure 27:
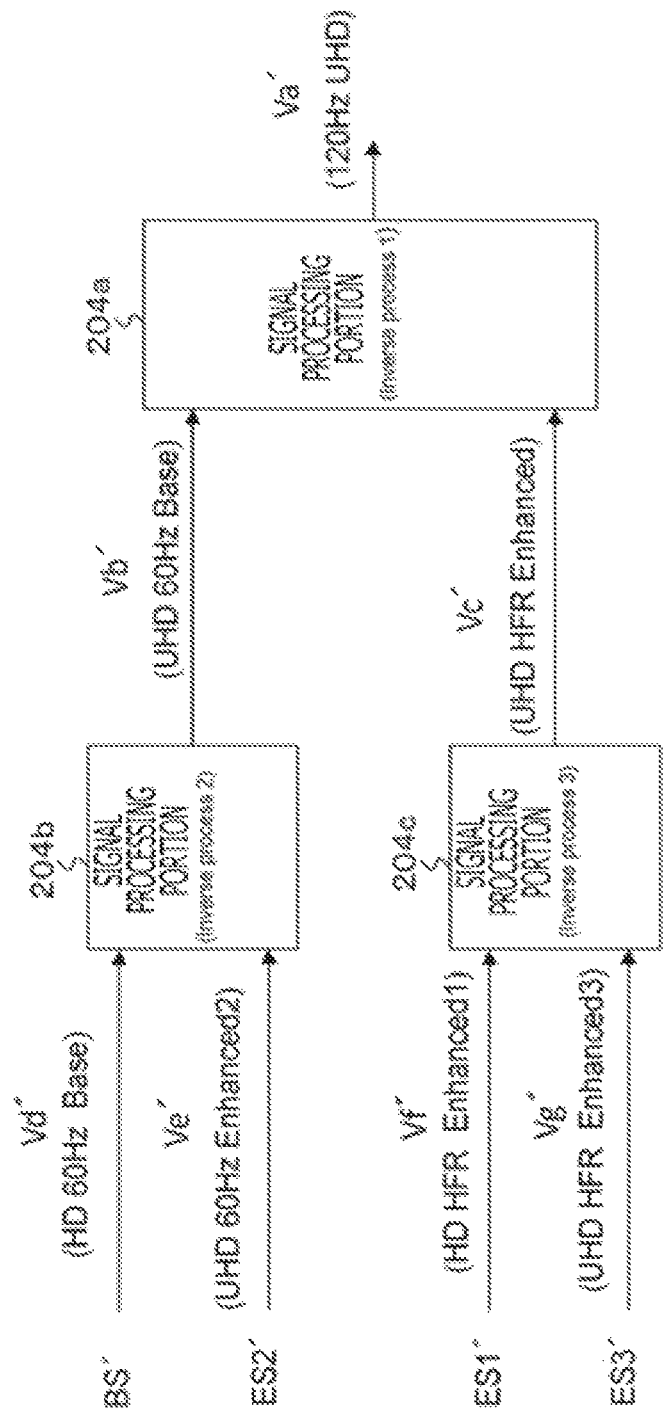
FIG. 27 is a block diagram depicting portions of respective signal processing portions for executing processing of inverse processes 1, 2, 3 in the video decoder.

FIG. 27 depicts portions of the signal processing portion 204a, the signal processing portion 204b, and the signal processing portion 204c in the video decoder 204. The illustrated example indicates the case where the high frame rate is 120 Hz. The signal processing portion 204b processes the image data Vd' (HD 60 Hz Base) as the image data BS' having the basic format, and the image data Ve' (UHD 60 Hz Enhanced2) as the image data ES2', having the second enhancement format, from which the image having the ultra-high definition at the basic frame rate is to be obtained, thereby obtaining the first image data Vb' (UHD 60 Hz Base) as the image data at the basic frame rate.

The signal processing portion 204c processes the image data Vf' (UHD HFR Enhanced1) as the image data ES1', having the first enhancement format, from which the image having the high definition and at the high frame rate is to be obtained, and the image data Vf' (UHD HFR Enhanced3) as the image data ES3', having the third enhancement format, from which the image having the ultra-high definition at the high frame rate is to be obtained, thereby obtaining the second image data Vc' (UHD HFR Enhanced) as the image data having the enhancement frame at the high frame rate. The signal processing portion 204a processes the first image data Vb' (UHD 60 Hz Base), and the second image data Vc' (UHD HFR Enhanced), thereby obtaining the image data Va' (120 Hz UHD) exhibiting the ultra-high definition at the high frame rate.

FIG. 28(a) depicts an example of a configuration of the signal processing portion 204b. The signal processing portion 204b has an up-scale circuit 211 and an arithmetic operation circuit 212. The image data Vd' (HD 60 Hz Base) as the image data BS' having the basic format is inputted to the up-scale circuit 211. The up-scale circuit 211 executes the up-scale processing from the high definition to the ultra-high definition for the image data Vd', thereby obtaining the third image data. Here, the up-scale circuit 211, as described above, executes the suitable up-scale processing by using the information exhibiting the ratio of the spatial scalable stream which is inserted into the video scalability SEI (refer to FIG. 11), or the video scalability information descriptor (refer to FIG. 13).

The image data Ve' (UHD 60 Hz Enhanced2) as the image data ES2' having the second enhancement format, and the third image data obtained in the up-scale circuit 211 are inputted to the arithmetic operation circuit 212. The arithmetic operation circuit 212 adds the two pieces of image data to each other to obtain the first image data Vb' (UHD 60 Hz Base) as the image data at the basic frame rate.

FIG. 28(b) depicts an example of a configuration of the signal processing portion 204c. The signal processing portion 204c has an up-scale circuit 221 and an arithmetic operation circuit 222. The image data Vf' (HD HFR Enhanced1) as the image data ES1' having the first enhancement format is inputted to the up-scale circuit 221. The up-scale circuit 221 executes the up-scale processing from the high definition to the ultra-high definition for the image data Vf', thereby obtaining the fourth image data. Here, the up-scale circuit 221, as described above, executes the suitable up-scale processing by using the information exhibiting the ratio of the spatial scalable stream which is inserted into the video scalability SEI (refer to FIG. 11), or the video scalability information descriptor (refer to FIG. 13).

The image data Vg' (UHD 60 Hz Enhanced2) as the image data ES3' having the third enhancement format, and the fourth image data obtained in the up-scale circuit 221 are inputted to the arithmetic operation circuit 222. The arithmetic operation circuit 222 adds the two pieces of image data to each other to obtain the second image data Vc' (UHD HFR Enhanced) as the image data having the enhancement frame at the high frame rate.

Figure 29:
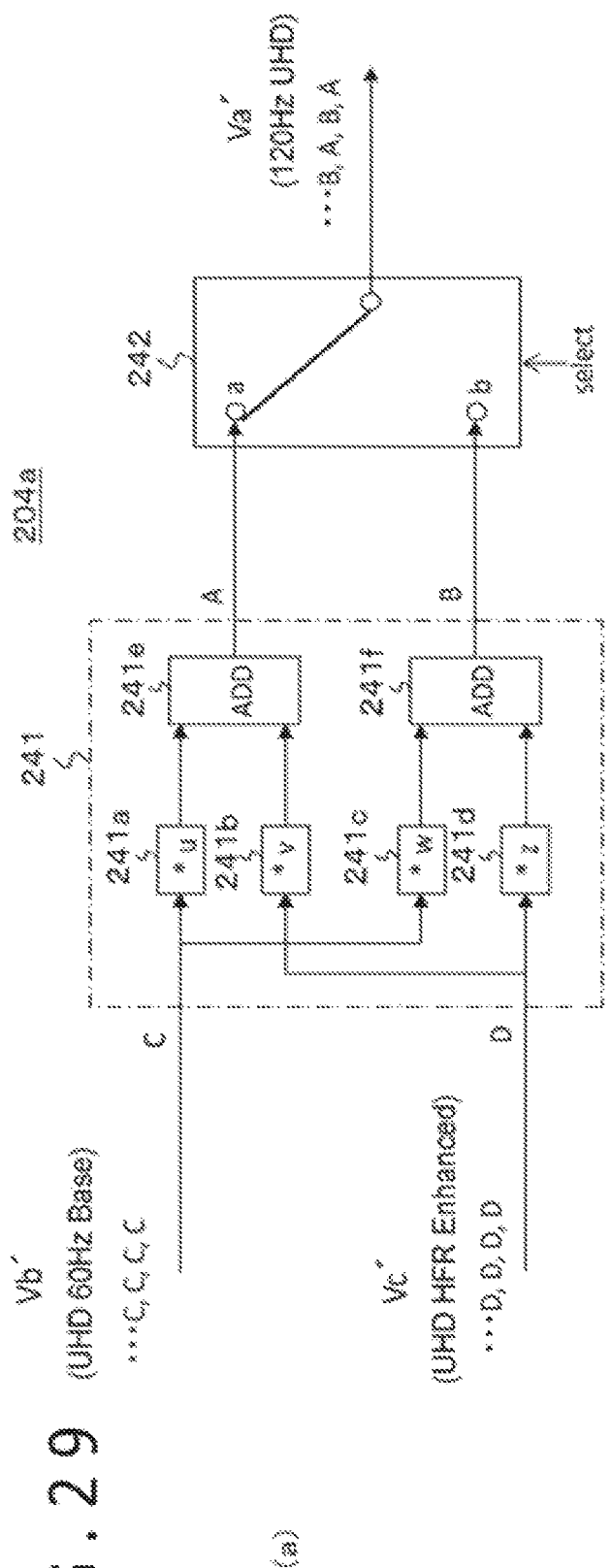
FIG. 29 is a block diagram depicting an example of a configuration of the signal processing portion for executing the processing of the inverse process 1.

FIG. 29(a) depicts an example of a configuration of the signal processing portion 204a. The signal processing portion 204a has an arithmetic operation circuit 241, and a switch circuit 242. In addition, the arithmetic operation circuit 241 has coefficient multiplying portions 241a, 241b, 241c, 241d, and addition portions 241e, 241f. The arithmetic operation circuit 241 executes processing (inverse mixing processing) inverse to the mixing processing in the arithmetic operation circuit 112 in the signal processing portion 102a of FIG. 22(a).

The coefficient multiplying portions 241a, 241b and the addition portions 241e are used in order to obtain the image data of the first picture in units of the temporally continuous two pictures described above from the first image data Vb' and the second image data Vc'. The coefficient multiplying portion 241a multiplies the picture by a coefficient u, and the coefficient multiplying portion 241b multiplies the picture by a coefficient v. In addition, the coefficient multiplying portions 241c, 241d and the addition portion 241f are used in order to obtain the image data of the second picture in units of the temporally continuous two pictures described above from the first image data Vb' and the second image data Vc'. The coefficient multiplying portion 241c multiplies the picture by a coefficient w, and the coefficient multiplying portion 241d multiplies the picture by a coefficient z.

The first image data Vb' (UHD 60 Hz Base) is inputted to the coefficient multiplying portions 241a, 241c constituting the arithmetic operation circuit 241. In addition, the second image data Vc' (UHD HFR Enhanced) is inputted to the coefficient multiplying portions 241b, 241d constituting the arithmetic operation circuit 241. Outputs from the coefficient multiplying portions 241a, 241b are inputted to the addition portion 241e to be added to each other. In addition, outputs from the coefficient multiplying portions 241c, 241d are inputted to the addition portion 241f to be added to each other.

In this case, the image data A of the first picture is obtained in units of the temporally continuous two pictures as the output from the addition portion 241e. The image data B of the second picture is obtained in units of the temporally continuous two pictures as the output from the addition portion 241f. FIG. 29(b) expresses the arithmetic operation for the inverse mixing processing in the arithmetic operation circuit 241 in the form of a mathematical expression. In addition, FIG. 29(c) depicts a correspondence relationship between the coefficients u, v, w, z, and the coefficients p, q, r, s in the form of a matrix.

Outputs from the addition portions 241e, 241f of the arithmetic operation circuit 241 are respectively inputted to fixed terminals on a side a, a side b of the switch circuit 242. The switch circuit 242 alternately switches the side a, the side b in a cycle of 120 Hz. The image data Va' (120 Hz UHD), exhibiting the ultra-high definition at the high frame rate, in which the two pieces of image data A, B are synthesized is obtained from the switch circuit 242.

Here, the arithmetic operation circuit 241, as described above, executes the suitable inverse mixing processing by using the information exhibiting the mixing ratios (first, second ratios) which is inserted into the video scalability SEI (refer to FIG. 11), or the video scalability information descriptor (refer to FIG. 13), in a word, the information associated with p, q, r, s.

An operation of the service receiver 200A depicted in FIG. 25 will be described in brief. The reception portion 202 receives the delivery stream STM of the MP4 sent thereto with the delivery stream STM of the broadcasting wave or the MP4 being placed on the broadcasting wave or the packet of the Internet from the service transmission system 100. The delivery stream STM is supplied to the container encoder 203. The container decoder 203 extracts the basic video stream STb and the enhancement video streams STe1, STe2, STe3 or the basic video stream STb and the enhancement video stream STe from the MP4.

The access unit of the image data BS, having the basic format, from which the image having the high definition at the basic frame rate is to be obtained is contained in the basic video stream STb. In addition, the access unit of the image data ES1, having the first enhancement format, from which the image having the high definition at the high frame rate is to be obtained is contained in the enhancement video stream STe1. In addition, the access unit of the image data ES2, having the second enhancement format, from which the image having the ultra-high definition at the basic frame rate is to be obtained is contained in the enhancement video stream STe2. In addition, the access unit of the image data ES3, having the third enhancement format, from which the image having the ultra-high definition at the high frame rate is to be obtained is contained in the enhancement video stream STe3. In addition, the access units of the image data ES1, ES2, ES3 having the first, second, third enhancement formats, respectively, are contained in the enhancement video stream STe.

In addition, the container decode 203 extracts the meta information from the MP4, and sends the meta information to the control portion 201. The video scalability information descriptor (refer to FIG. 13) which is inserted into the box of "udta" or "lays" provided under the "moof" box in the enhancement video streams STe1, STe2, STe3 or the MP4 stream corresponding to the enhancement video stream STe is also contained in the meta information.

The control portion 201 recognizes that the enhancement by the image data ES1 having the first enhancement format is temporal scalable, the image data BS having the basic format is the image data obtained by executing the mixing processing, the mixing ratios (first, second ratios), and so forth from the video scalability information descriptor. In addition, the control portion 201 also recognizes that the enhancement by the image data ES2 having the second enhancement format is spatial scalable, the ratio of the spatial scalable stream, and so forth from the video scalability information descriptor SEI.

In addition, the control portion 201 recognizes that the enhancement by the image data ES3 having the third enhancement format is temporal scalable and spatial scalable, the image data BS having the basic format is the image data obtained by executing the mixing processing, the mixing ratios (first, second ratios), the ratio of the spatial scalable stream, and so forth from the video scalability information descriptor.

The basic video stream STb and the enhancement video streams STe1, STe2, STe3, or the basic video stream STb and the enhancement video stream STe which are extracted in the container decoder 203 are supplied to the video decoder 204. The video decoder 204 processes the basic video stream STb and the enhancement video streams STe1, STe2, STe3, or the basic video stream STb and the enhancement video stream STe, thereby obtaining the image data Va' exhibiting the ultra-high definition (UHD) at the high frame rate (HFR).

Here, the video decoder 204 extracts the parameter set or the SEI which is inserted into the access unit constituting the video streams, and sends the parameter set or the SEI to the control portion 201. The video scalability SEI (refer to FIG. 11) which is inserted into the access unit (AU) of the two pieces of image data ES1, ES2 having the first, second enhancement formats, respectively, is also contained in the SEI.

The control portion 201 recognizes that the enhancement by the image data ES1 having the first enhancement format is temporal scalable, the image data BS having the basic format is the image data obtained by executing the mixing processing, the mixing ratios (first, second ratios), and so forth from the video scalability SEI. In addition, the control portion 201 also recognizes that the enhancement by the image data ES2 having the second enhancement format is spatial scalable, the ratio of the spatial scalable stream, and so forth from the video scalability information descriptor.

In addition, the control portion 201 also recognizes that the enhancement by the image data ES3 having the third enhancement format is temporal scalable and spatial scalable, the image data BS having the basic format is the image data obtained by executing the mixing processing, the mixing ratios (first, second ratios), the ratio of the spatial scalable stream, and so forth from the video scalability information descriptor.

Figure 30:
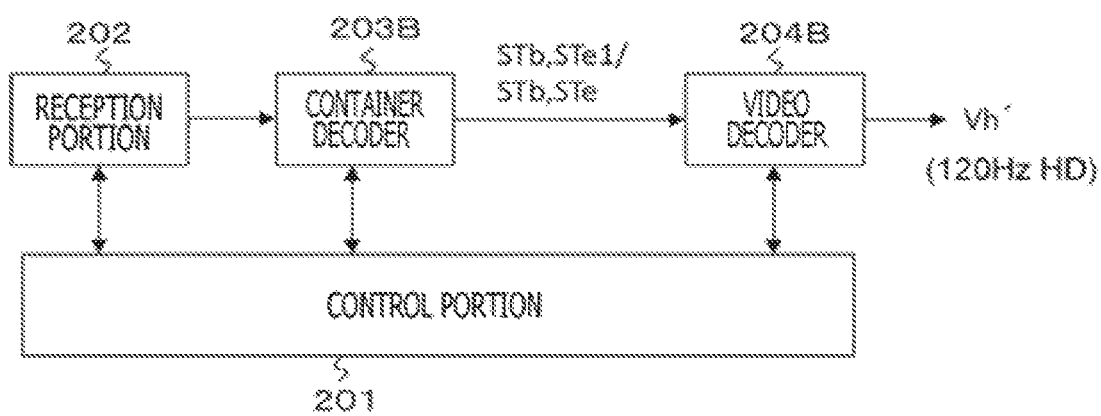
FIG. 30 is a block diagram depicting an example of a configuration of a service receiver which can process moving image data having high definition at a high frame rate.

FIG. 30 depicts an example of a configuration of a service receiver 200B which can process the moving image data exhibiting the high definition at the high frame rate. In FIG. 30, portions corresponding to those in FIG. 25 are assigned the same reference numerals, or reference numerals each having "B" added thereto and a description will be suitably omitted herein. The service receiver 200B has a reception portion 201, a container decoder 203B, and a video decoder 204B.

The reception portion 201 receives the delivery stream STM of the MP4 sent with the delivery stream STM being placed on the delivery stream STM the packet of the Internet from the service transmission system 100. The delivery stream STM is supplied to the container encoder 203. The container decoder 203 extracts the basic video stream STb and the enhancement video stream STe1 or the basic video stream STb and the enhancement video stream STe from the MP4.

The basic video stream STb and the enhancement video stream STe1, or the basic video stream STb and the enhancement video stream STe which are extracted in the container decoder 203B are supplied to the video decoder 204B. The video decoder 204B processes the basic video stream STb and the enhancement video stream STe1, or the basic video stream STb and the enhancement video stream STe to obtain the image data Vh' exhibiting the high definition at the high frame rate.

In this case, in the video decoder 204B, the image data Vd' (HD 60 Hz Base) as the image data BS' having the basic format, and the image data Vf' (HD HFR Enhanced1) as the image data ES1', having the first enhancement format, from which the image having the high definition at the high frame rate is to be obtained are inputted to the similar signal processing portion as the signal processing portion 204a (refer to FIG. 27, FIG. 29) described above. Then, the image data Vh' having the high definition at the high frame rate is obtained as an output from the signal processing portion.

Figure 31:
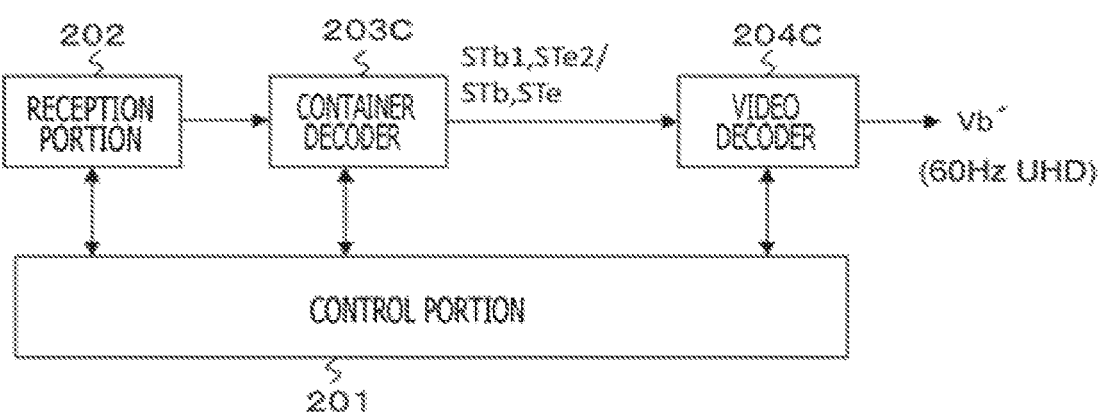
FIG. 31 is a block diagram depicting an example of a configuration of a service receiver which can process moving image data having ultra-high definition at a basic frame rate.

FIG. 31 depicts an example of a configuration of a service receiver 200C which can process the moving image data exhibiting the ultra-high definition at the basic frame rate. In FIG. 31, portions corresponding to those in FIG. 25 are assigned the same reference numerals, or reference numerals each having "C" added thereto and a description will be suitably omitted herein. The service receiver 200C has a reception portion 201, a container decoder 203C, and a video decoder 204C.

The reception portion 201 receives the delivery stream STM of the MP4 sent thereto with the delivery stream STM being placed on the broadcasting wave or the packet of the Internet from the service transmission system 100. The delivery stream STM is supplied to the container encoder 203. The container decoder 203 extracts the basic video stream STb and the enhancement video stream STe2 or the basic video stream STb and the enhancement video stream STe from the MP4.

The basic video stream STb and the enhancement video stream STe2, or the basic video stream STb and the enhancement video stream STe which are extracted in the container decoder 203C are supplied to the video decoder 204C. The video decoder 204C processes the basic video stream STb and the enhancement video stream STe2, or the basic video stream STb and the enhancement video stream STe to obtain the image data Vb' exhibiting the ultra-high definition at the basic frame rate.

In this case, in the video decoder 204C, the image data Vd' (HD 60 Hz Base) as the image data BS' having the basic format, and the image data Ve' (UHD 60 Hz Enhanced2) as the image data ES2', having the second enhancement format, from which the image having the ultra-high definition at the basic frame rate is to be obtained are inputted to the similar signal processing portion as the signal processing portion 204b (refer to FIG. 27, FIG. 28(a)) described above. Then, the image data Vb' having the ultra-high definition at the basic frame rate is obtained as an output from the signal processing portion 204a.

Figure 32:
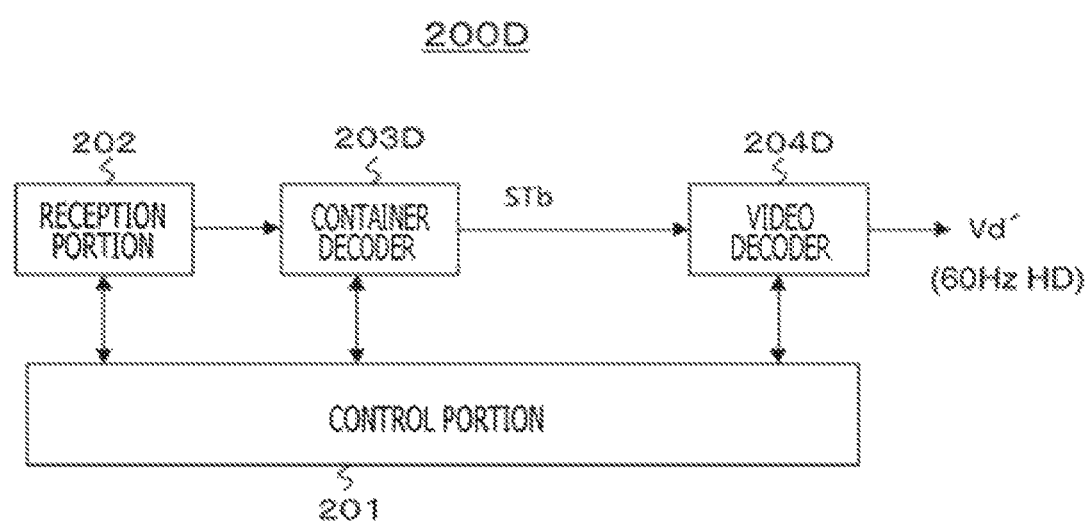
FIG. 32 is a block diagram depicting an example of a configuration of a service receiver which can process moving image data having high definition at a basic frame rate.

FIG. 32 depicts an example of a configuration of a service receiver 200D which can process the moving image data exhibiting the high definition at the basic frame rate. In FIG. 32, portions corresponding to those in FIG. 25 are assigned the same reference numerals, or reference numerals each having "D" added thereto and a description will be suitably omitted herein. The service receiver 200D has a reception portion 201, a container decoder 203D, and a video decoder 204D.

The reception portion 201 receives the delivery stream STM of the MP4 sent thereto with the delivery stream STM being placed on the broadcasting wave or the packet of the Internet from the service transmission system 100. The delivery stream STM is supplied to the container encoder 203D. The container decoder 203D extracts only the basic video stream STb from the MP4.

The basic video stream STb extracted in the container decoder 203D is supplied to the video decoder 204D. The video decoder 204D processes only the basic video stream STb, thereby obtaining the image data Vd' exhibiting the high definition at the basic frame rate. In this case, such respective signal processing portions (refer to FIG. 26) that the video decoder 205 described above has are unnecessary for the video decoder 204D.

As described above, in the transmission/reception system 10 depicted in FIG. 3, the basic video stream, and a predetermined number of enhancement video streams are transmitted. In this case, the basic video stream contains the encoded image data of the image data, having the basic format, from which the image having the high definition at the basic frame rate is to be obtained. A predetermined number of enhancement video streams contain the encoded image data of the image data, having the first enhancement format, from which the image having the high definition at the high frame rate is to be obtained, the image data, having the second enhancement format, from which the image having the ultra-high definition at the basic frame rate is to be obtained, and the image data, having the third enhancement format, from which the image having the ultra-high definition at the high frame rate is to be obtained. For this reason, the image data having the ultra-high definition at the high frame rate is transmitted on the reception side in such a way that the backward compatibility can be satisfactorily realized.

For example, in case of the receiver which has the decoding ability to be able to process the image data exhibiting the high definition at the basic frame rate, only the basic video stream is processed, so that the display of the image having the high definition at the basic frame rate can be carried out. In addition, for example, in case of the receiver which has the decoding ability to be able to process the image data existing the ultra-high definition at the high frame rate, both the basic video stream and the enhancement stream are processed, so that the display of the image having the high definition at the high frame rate can be carried out.

In addition, for example, in case of the receiver which has the decoding ability to be able to process the image data existing the ultra-high definition at the basic frame rate, both the basic video stream and the enhancement stream are processed, so that the display of the image having the ultra-high definition at the basic frame rate can be carried out. In addition, for example, in case of the receiver which has the decoding ability to be able to process the image data existing the ultra-high definition at the high frame rate, both the basic video stream and the enhancement stream are processed, so that the display of the image having the ultra-high definition at the high frame rate can be carried out.

In addition, in the transmission/reception system 10 depicted in FIG. 3, the image data having the basic format is obtained by executing the down-scale processing for the first image data obtained by executing the mixing processing at the first ratio in units of temporally continuous two pictures for the image data existing the ultra-high definition at the high frame rate. For this reason, the image, having the high definition at the basic frame rate, which is displayed by processing only the basic video stream on the reception side becomes the smooth image in which the strobing effect is suppressed.

2. Modified Changes

It should be noted that in the embodiment described above, the example in which the container is the MP4 (ISOBMFF). However, the present technique is by no means limited to the case where the container is the MP4, and can be similarly applied to the containers having other formats such as MPEG-2 TS and MMT.

For example, in case of MPEG-2 TS, in the container encoder 103 of the service transmission system 100 depicted in FIG. 19, a transport stream containing the basic video stream STb and the enhancement video streams STe1, STe2, STe3, or the basic video stream STb and the enhancement video stream STe is produced.

In this case, in the container encoder 103, the video scalability information descriptor (refer to FIG. 13) is inserted into a video elementary stream loop corresponding to the enhancement video stream under the control of a Program Map Table (PMT).

FIG. 33 depicts an example of a structure of the transport stream in case of the transmission of the 4 stream structure. In this example of the structure, there are present a PES packet "video PEST" of the video stream identified by PID1, a PES packet "video PES2" of the video stream identified by PIPD2, a PES packet "video PES3" of the video stream identified by PID3, and a PES packet "video PES4" of the video stream identified by PIPD4.

The access unit (encoded image data) of the basic video stream STb is contained in a payload of the PES packet "video PEST." The access unit (encoded image data) of the enhancement video stream STe1 is contained in a payload of the PES packet "video PES2." The access unit (encoded image data) of the enhancement video stream STe2 is contained in a payload of the PES packet "video PES3." The access unit (encoded image data) of the enhancement video stream STe3 is contained in a payload of the PES packet "video PES4." The video scalability SEI (refer to FIG. 11) is inserted into the access units (encoded image data) of the respective pictures contained in the PES packet "video PES2," the PES packet "video PES3," and the PES packet "video PES4."

In addition, a Program Map Table (PMT) is contained as Program Specific Information (PSI) in the transport stream. PSI is information describing which of programs the respective elementary streams contained in the transport stream belong to.

A video elementary stream loop (video ES loop) corresponding to the respective video streams is present in PMT. Information associated with a stream type, a packet identifier (PID) and the like is arranged in the video elementary stream loop "video ES loop" so as to correspond to the video stream, and a descriptor describing information associated with the video stream is also arranged in the video elementary stream loop "video ES loop."

Information associated with a stream type, a packet identifier (PID) and the like is arranged in the video "video ES1 loop" so as to correspond to the basic video stream (video PEST), and a descriptor describing information associated with the video stream is also arranged in "video ES loop." The stream type is assigned "0×24" indicating the basic video stream.

In addition, information associated with a stream type, a packet identifier (PID) and the like is arranged in "video ES2 loop," "video ES3 loop," and "video ES4 loop" so as to correspond to the enhancement video stream (video PES2), the enhancement video stream (video PES3), and the enhancement video stream (video PES4), respectively, and a descriptor describing information associated with these video streams is also arranged therein. The stream type is assigned "0×2×" indicating the enhancement video stream. In addition, a video scalability information descriptor (refer to FIG. 13) is inserted as one of descriptors.

FIG. 34 depicts an example of a stream of a transport stream in case of the transmission of a 2 stream structure. In the example of the structure, there are present the PES packet "video PES1" of the video stream identified by PID1, and the PES packet "video PES2" of the video stream identified by PID2.

The access unit (encoded image data) of the basic video stream STb is contained in the payload of the PES packet "video PES1." The access unit (encoded image data) of the enhancement video stream STe is contained in the payload of the PES packet "video PES2." The video scalability SEI (refer to FIG. 11) is inserted into the access unit (encoded image data) of the respective pictures contained in the PES packet "video PES2."

In addition, the video elementary stream loop (video ES loop) corresponding to the basic video stream "video PES1," and the enhancement video stream "video PES2" are present under the control of the PMT. Information associated with a stream type, a packet identifier (PID) and the like is arranged in the video elementary stream loop "video ES loop" so as to correspond to the video stream, and a descriptor describing information associated with the video stream is also arranged in the video elementary stream loop "video ES loop."

Information associated with a stream type, a packet identifier (PID) and the like is arranged in "video ES1 loop" so as to correspond to the basic video stream (video PEST), and a descriptor describing information associated with the video stream is also arranged in the video "video ES loop." The stream type is assigned "0×24" indicating the basic video stream.

In addition, information associated with a stream type, a packet identifier (PID) and the like is arranged in "video ES2 loop" so as to correspond to the enhancement video stream (video PES2) and a descriptor describing information associated with the video streams is also arranged therein. The stream type is assigned "0×2×" indicating the enhancement video stream. In addition, a video scalability information descriptor (refer to FIG. 13) is inserted as one of descriptors.

In addition, for example, in case of MMT, the container encoder 103 of the service transmission system 100 depicted in FIG. 19 produces an MMT stream containing the basic video stream STb and the enhancement video streams STe1, STe2, STe3, or the basic video stream STb and the enhancement stream STe.

In this case, in the container encoder 103, the video scalability information descriptor (refer to FIG. 13) is inserted into a video asset loop corresponding to the enhancement video stream under the control of the MMT Package Table (MPT).

Figure 35:
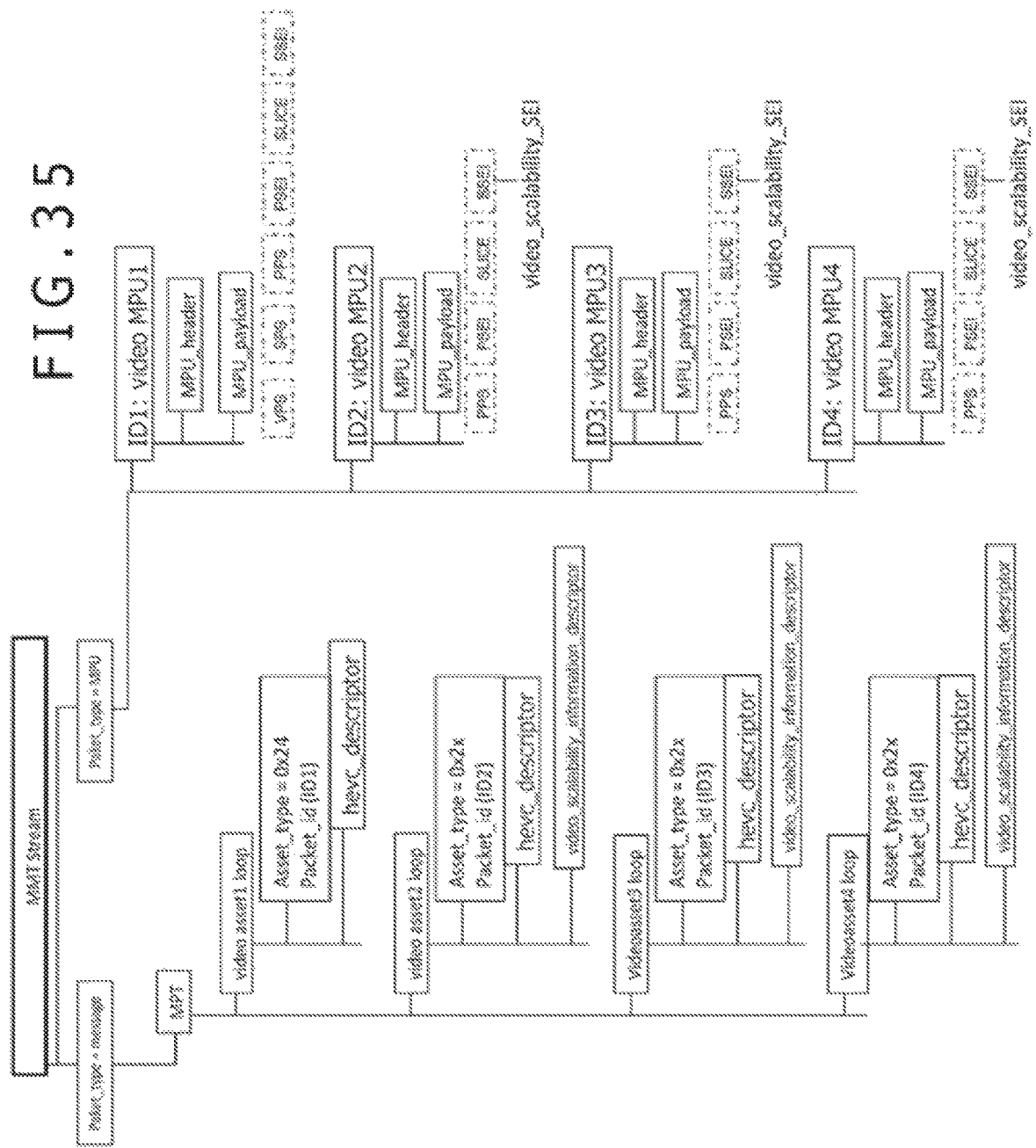
FIG. 35 is a diagram depicting an example of a structure of an MMT stream in case of transmission of 4 stream structures.

FIG. 35 depicts an example of a structure of an MMT stream in case of the transmission of a 4 stream structure. In the example of the structure, there are present an MPU packet "video MPU1" of the video stream, an MPU packet "video MPU2" of the video stream, an MPU packet "video MPU3 of the video stream, and an MPU packet "video MPU4" of the video stream. In this case, the MPU packet "video MPU1" of the video stream has a packet type of MPU, and is identified by ID1. The MPU packet "video MPU2" of the video stream has a packet type of MPU, and is identified by ID2. The MPU packet "video MPU3" of the video stream has a packet type of MPU, and is identified by ID3. In addition, the MPU packet "video MPU4" of the video stream has a packet type of MPU, and is identified by ID4.

The access unit (encoded image data) of the basic video stream STb is contained in the payload of the MPU packet "video MPU1." The access unit (encoded image data) of the enhancement video stream STe1 is contained in the payload of the MPU packet "video MPU2." The access unit (encoded image data) of the enhancement video stream STe2 is contained in the payload of the MPU packet "video MPU3." The access unit (encoded image data) of the enhancement video stream STe3 is contained in the payload of the MPU packet "video MPU4." The video scalability SEI (refer to FIG. 11) is inserted into the access unit (encoded image data) of the respective pictures contained in the MPU packet "video MPU2," the MPU packet "video MPU3," and the MPU packet "video MPU4."

In addition, in the case where the packet type is a message, various message packets are arranged in the MMT stream. One of the various message packets includes a Packet Access (PA) message packet. A table such as the MPT is contained in the PA message packet. A video asset loop corresponding to the respective assets (video stream) is present in the MPT. Pieces of information associated with an asset type (Asset_type), a packet ID (Packet_id) and the like are arranged in the video asset loop so as to correspond to the assets (video stream), and a descriptor describing the information associated with the video stream concerned is also arranged in the video asset loop.

The pieces of information associated with the asset type, the asset ID, and the like are arranged in "video asset1 loop" so as to correspond to the basic video stream (video MPU1), and the descriptor describing the information associated with the video stream concerned is also arranged in "video asset1 loop." This asset type is assigned "0×24" indicating the basic video stream.

In addition, the pieces of information associated with the asset type, the asset ID and the like are arranged in "video asset1 loop," "video asset3 loop," "video asset4 loop" so as to correspond to the enhancement video stream (video MPU2), the enhancement video stream (video MPU3), the enhancement video stream (video MPU4), respectively. In addition thereto, the descriptor describing the information associated with the video streams is also arranged in "video asset2 loop," "video asset3 loop," "video asset4 loop." This asset type is assigned "0×2×" indicating the enhancement video stream. In addition, a video scalability information descriptor (refer to FIG. 13) is inserted as one of the descriptors.

Figure 36:
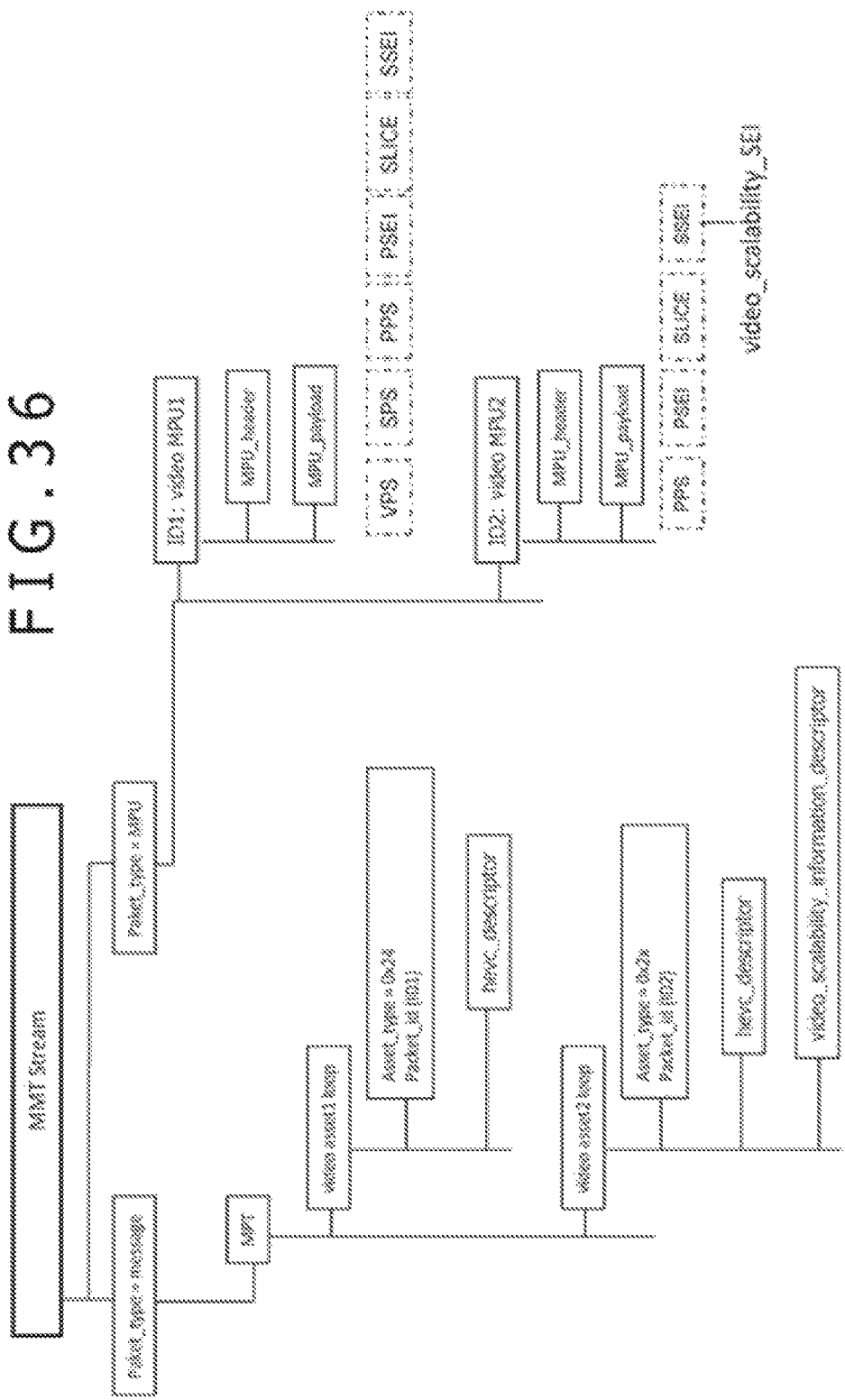
FIG. 36 is a diagram depicting an example of a structure of an MMT stream in case of transmission of 2 stream structures.

FIG. 36 depicts an example of a structure of the MMT stream in case of the transmission of the 2 stream structure. In the example of the structure, there are present the MPU packet "video MPU1" of the video stream identified by ID1, and the MPU packet "video MPU2" of the stream identified by ID2.

The access unit (encoded image data) of the basic video stream STb is contained in the payload of the MPU packet "video MPU1." The access unit (encoded image data) of the enhancement video stream STe is contained in the payload of the MPU packet "video MPU2." The video scalability SEI (refer to FIG. 11) is inserted into the access unit (encoded image data) of the respective pictures contained in the MPU packet "video PES2."

In addition, the video asset loop corresponding to the basic video stream "video MPU1," and the enhancement video stream "video MPU2" is present under the control of the MPT. The pieces of information associated with the asset type, the asset ID and the like are arranged in the video asset loop so as to correspond to the video stream, and the descriptor describing the information associated with the video stream concerned is also arranged in the video asset loop.

The pieces of information associated with the stream type, the packet identifier (PID) and the like are arranged in "video asset1 loop" so as to correspond to the basic video stream (video MPU1). Also, the descriptor for describing the information associated with the video stream is arranged in "video asset loop." This asset type is assigned "0×24" indicating the basic video stream.

In addition, the pieces of information associated with the asset type, the asset ID and the like are arranged in "video ES2 loop" so as to correspond to the enhancement video stream (video PES2), and the descriptor describing the information associated with the video stream concerned is also arranged in "video ES2 loop." This asset type is assigned "0×2×" indicating the enhancement video stream. In addition, a video scalability information descriptor (refer to FIG. 13) is inserted as one of the descriptors.

In addition, the embodiment described above indicates the example in which the number of enhancement video streams is three or one. However, there is considered an example in which the number of enhancement video streams is two. In this case, for example, the access unit of the image data ES1, having the first enhancement format, from which the image having the high definition at the high frame rate is to be obtained is contained in the enhancement video stream STe1. Then, the access unit of the image data ES2, having the second enhancement format, from which the image having the ultra-high definition at the basic frame rate is to be obtained, and the access unit of the image data ES3, having the third enhancement format, from which the image having the ultra-high definition at the high frame rate is to be obtained are contained in the enhancement video stream STe2.

In addition, the present technique can also adopt the following constitutions.

(1) A transmission apparatus, including:

an image processing portion for obtaining image data, having a basic format, from which an image having high definition at a basic frame rate is to be obtained, image data, having a first enhancement format, from which an image having high definition at a high frame rate is to be obtained, image data, having a second enhancement format, from which an image having ultra-high definition at a basic frame rate is to be obtained, and image data, having a third enhancement format, from which an image having ultra-high definition at a high frame rate is to be obtained by processing image data having ultra-high definition at a high frame rate;

an image encoding portion for producing a basic video stream containing encoded image data of the image data having the basic format, and a predetermined number of enhancement video streams containing encoded image data of the image data having the first to third enhancement formats; and a transmission portion for transmitting a container having a predetermined format and containing the basic stream and the predetermined number of enhancement video streams, in which the image processing portion executes mixing processing at a first ratio in units of temporally continuous two pictures in the image data having the ultra-high definition at the high frame rate to obtain first image data as image data at a basic frame rate, and executes mixing processing at a second ratio in units of the temporally continuous two pictures to obtain second image data as image data having an enhancement frame at a high frame rate, executes down-scale processing for the first image data to obtain image data having the basic format, and obtains a difference between third image data obtained by executing up-scale processing for the image data having the basic format, and the first image data to obtain image data having the second enhancement format, and executes down-scale processing for the second image data to obtain image data having the first enhancement format, and obtains a difference between fourth image data obtained by executing up-scale processing for image data having the first enhancement format, and the second image data to obtain image data having the third enhancement format.

(2) The transmission apparatus according to (1) described above, in which the image encoding portion produces the basic video stream containing encoded image data of the image data having the basic format, three enhancement video streams containing each piece of encoded image data of the image data having the first to third enhancement formats or one enhancement video stream containing the whole of encoded image data of the image data having the first to third enhancement format.

(3) The transmission apparatus according to (1) or (2) described above, further including:

an information inserting portion for inserting identification information exhibiting temporal scalable into the encoded image data of the image data having the first enhancement format, inserting identification information exhibiting spatial scalable into the encoded image data of the image data having the second enhancement format, and inserting identification information exhibiting temporal scalable and spatial scalable into the encoded image data of the image data having the third enhancement format.

(4) The transmission apparatus according to (3) described above, in which the information inserting portion further inserts information exhibiting a ratio of spatial scalable into the encoded image data of the image data having the second and third enhancement formats.

(5) The transmission apparatus according to (3) or (4) described above, in which the information inserting portion further inserts identification information exhibiting that the image data having the basic format is image data obtained by executing the mixing processing into the encoded image data of the image data having the first and third enhancement formats.

(6) The transmission apparatus according to any one of (3) to (5) described above, in which the information inserting portion further inserts information associated with the first ratio and information associated with the second ratio into the encoded image data of the image data having the first and third enhancement formats.

(7) The transmission apparatus according to any one of (1) to (6) described above, further including:

an information inserting portion for inserting identification information exhibiting temporal scalable so as to correspond to the encoded image data of the image data having the first enhancement format into a layer of the container, inserting identification information exhibiting spatial scalable so as to correspond to the encoded image data of the image data having the second enhancement format into the layer of the container, and inserting identification information exhibiting temporal scalable and spatial scalable so as to correspond to the encoded image data of the image data having the third enhancement format into the layer of the container.

(8) The transmission apparatus according to (7), in which the information inserting portion further inserts information exhibiting a ratio of spatial scalable into the layer of the container so as to correspond to each piece of the encoded image data of the image data having the second and third enhancement formats.

(9) The transmission apparatus according to (7) or (8) described above, in which the information inserting portion further inserts identification information exhibiting that the image data having the basic format is image data obtained by executing the mixing processing into the layer of the container so as to correspond to each pieces of the encoded image data of the image data having the first and third enhancement format.

(10) The transmission apparatus according to any one of (7) to (9) described above, in which the information inserting portion further inserts into the layer of the container information associated with the first ratio and information associated with the second ratio so as to correspond to the encoded image data of the image data having the first and third enhancement formats, respectively.

(11) The transmission apparatus according to any one of (1) to (10) described above, further including:

a transmission portion for transmitting a metafile having meta information used to cause a reception apparatus to acquire the basic video stream and the predetermined number of enhancement video streams, in which information exhibiting response of scalability is inserted into the metafile.

(12) A transmission method, including:

an image processing step of obtaining image data, having a basic format, from which an image having high definition at a basic frame rate is to be obtained, image data, having a first enhancement format, from which an image having high definition at a high frame rate is to be obtained, image data, having a second enhancement format, from which an image having ultra-high definition at a basic frame rate is to be obtained, and image data, having a third enhancement format, from which an image having ultra-high definition at a high frame rate is to be obtained by processing image data having ultra-high definition at a high frame rate;

an image encoding step of producing a basic video stream containing encoded image data of the image data having the basic format, and a predetermined number of enhancement video streams containing encoded image data of the image data having the first to third enhancement formats; and a transmission step of, by a transmission portion, transmitting a container having a predetermined format and containing the basic stream and the predetermined number of enhancement video stream, in which in the image processing step, mixing processing at a first ratio in units of temporally continuous two pictures in the image data having the ultra-high definition at the high frame rate is executed to obtain first image data as image data at a basic frame rate, and mixing processing at a second ratio in units of the temporally continuous two pictures is executed to obtain second image data as image data having an enhancement frame at a high frame rate, down-scale processing is executed for the first image data to obtain image data having the basic format, and a difference between third image data obtained by executing up-scale processing for the image data having the basic format, and the first image data is obtained to obtain image data having the second enhancement format, and down-scale processing is executed for the second image data to obtain image data having the first enhancement format, and a difference between fourth image data obtained by executing up-scale processing for image data having the first enhancement format, and the second image data is obtained to obtain image data having the third enhancement format.

(13) A reception apparatus, including:

a reception portion for receiving a container having a predetermined format and containing a basic video stream, having encoded image data of image data, having a basic format, from which an image having high definition at a basic frame rate is to be obtained, and a predetermined number of enhancement video streams containing encoded image data of image data, having a first enhancement format, from which image having high definition at a high frame rate is to be obtained, image data, having a second enhancement format, from which image having ultra-high definition at a basic frame rate is to be obtained, and image data, having a third enhancement format, from which image having ultra-high definition at a high frame rate is to be obtained, the image data having the basic format being obtained by executing down-scale processing for first image data obtained by executing mixing processing at a first ratio in units of temporally continuous two pictures in image data having ultra-high definition at a high frame rate, the image data having the second enhancement format being obtained by obtaining a difference between third image data obtained by executing up-scale processing for the image data having the basic format, and the first image data, the image data having the first enhancement format being obtained by executing down-scale processing for second image data obtained by executing mixing processing at a second ratio in units of the temporally continuous two pictures, the image data having the third enhancement format being obtained by obtaining a difference between fourth image data obtained by executing up-scale processing for the image data having the first enhancement format, and the second image data, the reception apparatus further including:

a processing portion for processing only the basic video stream to obtain image data having high deformation at a basic frame rate, or processing a part of or a whole of the predetermined number of enhancement video streams to obtain image data having high definition at a high frame rate, image data having ultra-high definition at a basic frame rate, or image data having ultra-high definition at a high frame rate.

(14) The reception apparatus according to (13) described above, in which information exhibiting a ratio of spatial scalable is inserted into encoded image data of image data having the second and third enhancement formats, and/or a container position corresponding to the encoded image data, and when the processing portion obtains the image data having the ultra-high definition at the basic frame rate, or the image data having the ultra-high definition at the high frame rate, the processing portion uses the inserted information exhibiting the ratio of the spatial scalable.

(15) The reception apparatus according to (13) or (14) described above, in which the information at the first ratio, and the information at the second ratio are inserted into the encoded image data of the image data having the first and third enhancement formats, and/or the container position corresponding to the encoded image data, and when the processing portion obtains the image data having the high definition at the high frame rate, or the image data having the ultra-high definition at the high frame rate, the processing portion uses the inserted information at the first ratio and the inserted information at the second ratio.

(16) A reception method, including:

a reception step of, by a reception portion, receiving a container, having a predetermined format and containing a basic video stream, having encoded image data of image data, having a basic format, from which an image having high definition at a basic frame rate is to be obtained, and a predetermined number of enhancement video streams containing encoded image data of image data, having a first enhancement format, from which image having high definition at a high frame rate is to be obtained, image data, having a second enhancement format, from which image having ultra-high definition at a basic frame rate is to be obtained, and image data, having a third enhancement format, from which image having ultra-high definition at a high frame rate is to be obtained, the image data having the basic format being obtained by executing down-scale processing for first image data obtained by executing mixing processing at a first ratio in units of temporally continuous two pictures in image data having ultra-high definition at a high frame rate, the image data having the second enhancement format being obtained by obtaining a difference between third image data obtained by executing up-scale processing for the image data having the basic format, and the first image data, the image data having the first enhancement format being obtained by executing down-scale processing for second image data obtained by executing mixing processing at a second ratio in units of the temporally continuous two pictures, the image data having the third enhancement format being obtained by obtaining a difference between fourth image data obtained by executing up-scale processing for the image data having the first enhancement format, and the second image data, the reception method further including:

a processing step of processing only the basic video stream to obtain image data having high deformation at a basic frame rate, or processing a part of or a whole of the predetermined number of enhancement video streams to obtain image data having high definition at a high frame rate, image data having ultra-high definition at a basic frame rate, or image data having ultra-high definition at a high frame rate.

(17) A transmission apparatus, including:

an image processing portion for obtaining image data, having a basic format, from which an image having high definition at a basic frame rate is to be obtained, image data, having a first enhancement format, from which an image having high definition at a high frame rate is to be obtained, image data, having a second enhancement format, from which an image having ultra-high definition at a basic frame rate is to be obtained, and image data, having a third enhancement format, from which an image having ultra-high definition at a high frame rate is to be obtained by processing image data having ultra-high definition at a high frame rate;

an image encoding portion for producing a basic video stream containing encoded image data of the image data having the basic format, and a predetermined number of enhancement video streams containing encoded image data of the image data having the first to third enhancement formats; and a transmission portion for transmitting a container having a predetermined format and containing the basic stream and the predetermined number of enhancement video streams.

(18) The transmission apparatus according to (17), further including:

an information inserting portion for inserting identification information exhibiting spatial scalable into the encoded image data of the image data having the second and the third enhancement formats, and/or a container position corresponding to the encoded image data, and inserting identification information exhibiting temporal scalable into the encoded image data of the image data having the first and the third enhancement formats, and/or the container position corresponding to the encoded image data.

(19) The transmission apparatus according to (17) or (18) described above, further including:

a transmission portion for transmitting a metafile having meta information used to cause a reception apparatus to acquire the basic video stream and the predetermined number of enhancement video streams, in which information exhibiting response of scalability is inserted into the metafile.

(20) A reception apparatus, including:

a reception portion for receiving a container having a predetermined format and containing a basic video stream, having encoded image data of image data, having a basic format, from which an image having high definition at a basic frame rate is to be obtained, and a predetermined number of enhancement video streams containing encoded image data of image data, having a first enhancement format, from which image having high definition at a high frame rate is to be obtained, image data, having a second enhancement format, from which image having ultra-high definition at a basic frame rate is to be obtained, and image data, having a third enhancement format, from which image having ultra-high definition at a high frame rate is to be obtained; and a processing portion for processing only the basic video stream to obtain image data having high deformation at a basic frame rate, or processing a part of or a whole of the predetermined number of enhancement video streams to obtain image data having high definition at a high frame rate, image data having ultra-high definition at a basic frame rate, or image data having ultra-high definition at a high frame rate.

The main feature of the present technique is that the transmitting the basic video stream containing the encoded image data of the image data, having the basic format, from which the image having the high definition at the basic frame rate is to be obtained, and a predetermined number of enhancement video streams containing encoded image data of the image data, having the first enhancement format, from which the image having the high definition at the high frame rate is to be obtained, the image data, having the second enhancement format, from which the image having the ultra-high definition at the basic frame rate is to be obtained, and the image data, having the third enhancement format, from which the image having the ultra-high definition at the high frame rate is to be obtained enables the image data having the ultra-high definition at the high frame rate to be transmitted, so that the backward compatibility is satisfactorily feasible on the reception side (refer to FIG. 5, FIG. 6, FIG. 15).

In addition, the main feature of the present technique is that the image data having the basic format can be obtained by executing the down-scale processing for the first image data obtained by executing the mixing processing at the first ratio in units of the temporally continuous two pictures in the image data having the ultra-high definition and the high frame rate. As a result, the image having the high definition at the basic frame rate displayed by processing only the basic video stream can be made the smooth image in which the strobing effect is suppressed (refer to FIG. 21, FIG. 22).

REFERENCE SIGNS LIST

10 Transmission/reception system
30A, 30B MPEG-DASH based stream delivery system
31 DASH stream file server
32 DASH MPD server
33, 33-1 to 33-N Service receiver
34 CDN
35, 35-1, 35-M Service receiver
36 Broadcasting sending system
100 Service transmission system
101 Control portion
102 Video encoder
102*a*, 102*b*, 102*c* Signal processing portion
102*d* Encoded processing portion
103 Container encoder
104 Transmission portion
111 Delay circuit
112 Arithmetic operation circuit
112*a*, 112*b*, 112*c*, 112*d* Coefficient multiplying portion
112*e*, 112*f* Addition circuit
113 Latch circuit
121, 131 Down-scale circuit
122, 132 Up-scale circuit
123, 133 Arithmetic operation circuit
200, 200A, 200B, 200C, 200D Service receiver
201 Control portion
202 Reception portion
203, 203B, 203C, 203D Container decoder
204, 204B, 204C, 204D Video decoder
204*a*, 204*b*, 204*c* Signal processing portion
204*d* Decoding processing portion
211, 221 Up-scale circuit
212, 222 Arithmetic operation circuit
241 Arithmetic operation circuit
241*a*, 241*b*, 241*c*, 241*d* Coefficient multiplying portion
241*e*, 241*f* Addition portion
242 Switch circuit

The invention claimed is:

1. A transmission apparatus, comprising:
processing circuitry configured to:
  obtain image data, having a basic format, from which an image having a high definition at a basic frame rate is to be obtained, the image data having the basic format obtained by the processing circuitry being configured to:
    (i) execute mixing processing at a first ratio in units of two temporally consecutive pictures in image data having an ultra-high definition at a high frame rate to obtain first image data as image data at the basic frame rate, and
    (ii) execute down-scale processing for the first image data to obtain the image data having the basic format,
  obtain image data, having a first enhancement format, from which an image having the high definition at the high frame rate is to be obtained, the image data having the first enhancement format obtained by the processing circuitry being configured to:
- (i) execute mixing processing at a second ratio in units of two temporally consecutive pictures to obtain second image data as image data having an enhancement frame at the high frame rate, and
- (ii) execute down-scale processing for the second image data to obtain the image data having the first enhancement format, obtain, based on at least the image data having the basic format, image data, having a second enhancement format, from which an image having the ultra-high definition at the basic frame rate is to be obtained, and obtain, based on at least the image data having the first enhancement format, image data, having a third enhancement format, from which an image having the ultra-high definition at the high frame rate is to be obtained, producing a basic video stream containing encoded image data of the image data having the basic format, and a predetermined number of enhancement video streams containing encoded image data of the image data having the first to third enhancement formats; and transmission circuitry configured to transmit a container having a predetermined format containing the basic video stream and the predetermined number of enhancement video streams.

2. The transmission apparatus according to claim 1, wherein the processing circuitry is further configured to:
obtain a difference between third image data obtained by execution of up-scale processing for the image data having the basic format, and the first image data to obtain the image data having the second enhancement format, and
obtain a difference between fourth image data obtained by execution of up-scale processing for the image data having the first enhancement format, and the second image data to obtain the image data having the third enhancement format.

3. The transmission apparatus according to claim 2, wherein the processing circuitry is further configured to produce the basic video stream containing encoded image data of the image data having the basic format, three enhancement video streams containing each pieces of encoded image data of the image data having the first to third enhancement formats or one enhancement video stream containing the whole of encoded image data of the image data having the first to third enhancement formats.

4. The transmission apparatus according to claim 2, wherein the processing circuitry is further configured to insert identification information exhibiting temporal scalability into the encoded image data of the image data having the first enhancement format, insert identification information exhibiting spatial scalability into the encoded image data of the image data having the second enhancement format, and insert identification information exhibiting temporal scalability and spatial scalability into the encoded image data of the image data having the third enhancement format.

5. The transmission apparatus according to claim 4, wherein the processing circuitry is further configured to insert information exhibiting a ratio of spatial scalability into the encoded image data of the image data having the second and third enhancement formats.

6. The transmission apparatus according to claim 4, wherein the processing circuitry further inserts identification information exhibiting that the image data having the basic format is image data obtained by executing the mixing processing into the encoded image data of the image data having the first and third enhancement formats.

7. The transmission apparatus according to claim 4, wherein the processing circuitry is further configured to insert information associated with the first ratio and information associated with the second ratio into the encoded image data of the image data having the first and third enhancement formats.

8. The transmission apparatus according to claim 2, wherein the processing circuitry is further configured to insert identification information exhibiting temporal scalability to correspond to the encoded image data of the image data having the first enhancement format into a layer of the container, insert identification information exhibiting spatial scalability to correspond to the encoded image data of the image data having the second enhancement format into the layer of the container, and insert identification information exhibiting temporal scalability and spatial scalability to correspond to the encoded image data of the image data having the third enhancement format into the layer of the container.

9. The transmission apparatus according to claim 8, wherein the processing circuitry is fluffier configured to insert information exhibiting a ratio of spatial scalability into the layer of the container to correspond to each piece of the encoded image data of the image data having the second and third enhancement formats.

10. The transmission apparatus according to claim 8, wherein the processing circuitry is further configured to insert identification information exhibiting that the image data having the basic format is image data obtained by execution of the mixing processing into the layer of the container to correspond to each piece of the encoded image data of the image data having the first and third enhancement foil lat.

11. The transmission apparatus according to claim 8, wherein the processing circuitry is further configured to insert, into the layer of the container, information associated with the first ratio and information associated with the second ratio to correspond to the encoded image data of the image data having the first and third enhancement formats, respectively.

12. The transmission apparatus according to claim 2, wherein the processing circuitry is further configured to transmit a metafile having meta information used to cause a reception apparatus to acquire the basic video stream and the predetermined number of enhancement video streams,
wherein information exhibiting response of scalability is inserted into the metafile.

13. The transmission apparatus according to claim 1, wherein the processing circuitry is further configured to insert identification information exhibiting spatial scalability into the encoded image data of the image data having the second and the third enhancement formats, and/or a container position corresponding to the encoded image data, and insert identification information exhibiting temporal scalability into the encoded image data of the image data having the first and the third enhancement formats, and/or the container position corresponding to the encoded image data.

14. The transmission apparatus according to claim 1, wherein the transmission circuitry is further configured to transmit a metafile having meta information used to cause a reception apparatus to acquire the basic video stream and the predetermined number of enhancement video streams, wherein information exhibiting response of scalability is inserted into the metafile.

15. A transmission method, comprising:

obtaining image data, having a basic format, from which an image having a high definition at a basic frame rate is to be obtained, the image data having the basic format obtained by:
   (i) executing mixing processing at a first ratio in units of two temporally consecutive pictures in image data having an ultra-high definition at a high frame rate to obtain first image data as image data at the basic frame rate; and
   (ii) executing down-scale processing for the first image data to obtain the image data having the basic format;

obtaining image data, having a first enhancement format, from which an image having high definition at the high frame rate is to be obtained, the image data having the first enhancement format obtained by:
   (i) executing mixing processing at a second ratio in units of two temporally consecutive pictures to obtain second image data as image data having an enhancement frame at the high frame rate; and
   (ii) executing down-scale processing for the second image data to obtain the image data having the first enhancement format;

obtaining, based on at least the image data having the basic format, image data, having a second enhancement format, from which an image having the ultra-high definition at the basic frame rate is to be obtained;

obtaining, based on at least the image data having the first enhancement format, image data, having a third enhancement format, from which an image having the ultra-high definition at the high frame rate is to be obtained;

producing a basic video stream containing encoded image data of the image data having the basic format, and a predetermined number of enhancement video streams containing encoded image data of the image data having the first to third enhancement formats; and transmitting a container having a predetermined format containing the basic video stream and the predetermined number of enhancement video streams.

16. A reception apparatus, comprising:

receiving circuitry configured to receive a container, having a predetermined format and containing a basic video stream, having encoded image data of image data, having a basic format, from which an image having a high definition at a basic frame rate is to be obtained, and a predetermined number of enhancement video streams containing encoded image data of: (i) image data, having a first enhancement format, from which image having the high definition at a high frame rate is to be obtained, (ii) image data, having a second enhancement format obtained based on at least the image data having the basic format, from which an image having an ultra-high definition at the basic frame rate is to be obtained, and (iii) image data, having a third enhancement format obtained based on at least the image data having the first enhancement format, from which an image having the ultra-high definition at the high frame rate is to be obtained; and processing circuitry configured to process only the basic video stream to obtain image data having the high definition at the basic frame rate, or process a part of or a whole of the predetermined number of enhancement video streams to obtain image data having the high definition at the high frame rate, image data having the ultra-high definition at the basic frame rate, or image data having the ultra-high definition at the high frame rate, wherein the image data having the basic format is obtained by:
   (i) mixing processing at a first ratio in units of two temporally consecutive pictures in image data having the ultra-high definition at the high frame rate to obtain first image data as image data at the basic frame rate, and
   (ii) down-scale processing for the first image data to obtain the image data having the basic format, and wherein the image data having the first enhancement format is obtained by:
   (i) executing mixing processing at a second ratio in units of two temporally consecutive pictures to obtain second image data as image data having an enhancement frame at the high frame rate, and
   (ii) executing down-scale processing for the second image data to obtain the image data having the first enhancement format.

17. The reception apparatus according to claim 16, wherein the image data having the second enhancement format being obtained by obtaining a difference between third image data obtained by executing up-scale processing for the image data having the basic format, and the first image data, and the image data having the third enhancement format being obtained by obtaining a difference between fourth image data obtained by execution of up-scale processing for the image data having the first enhancement format, and the second image data.

18. The reception apparatus according to claim 17, wherein information exhibiting a ratio of spatial scalability is inserted into encoded image data of image data having the second and third enhancement formats, and/or a container position corresponding to the encoded image data, and when the processing circuitry is configured to obtain the image data having the ultra-high definition at the basic frame rate, or the image data having the ultra-high definition at the high frame rate, the processing circuitry uses the inserted information exhibiting the ratio of the spatial scalability.

19. The reception apparatus according to claim 17, wherein information at the first ratio and information at the second ratio are inserted into the encoded image data of the image data having the first and third enhancement formats, and/or the container position corresponding to the encoded image data, and when the processing circuitry obtains the image data having the high definition at the high frame rate, or the image data having the ultra-high definition at the high frame rate, the processing circuitry is configured to use the inserted information at the first ratio and the inserted information at the second ratio.

20. A reception method, comprising:

receiving, by receiving circuitry of a reception apparatus, a container, having a predetermined format and containing a basic video stream, having encoded image data of image data, having a basic format, from which an image having a high definition at a basic frame rate is to be obtained, and a predetermined number of enhancement video streams containing encoded image data of (i) image data, having a first enhancement format, from which image having the high definition at a high frame rate is to be obtained, (ii) image data, having a second enhancement format obtained based on at least the image data having the basic format, from which an image having an ultra-high definition at the basic frame rate is to be obtained, and (iii) image data, having a third enhancement format obtained based on at least the image data having the first enhancement format, from which an image having the ultra-high definition at the high frame rate is to be obtained; and processing, by processing circuitry of the reception apparatus, only the basic video stream to obtain image data having the high definition deformation at the basic frame rate, or processing a part of or a whole of the predetermined number of enhancement video streams to obtain image data having the high definition at the high frame rate, image data having the ultra-high definition at the basic frame rate, or image data having the ultra-high definition at the high frame rate, wherein the image data having the basic format is obtained by:
 (i) mixing processing at a first ratio in units of two temporally consecutive pictures in image data having the ultra-high definition at the high frame rate to obtain first image data as image data at the basic frame rate, and
 (ii) down-scale processing for the first image data to obtain the image data having the basic format, and wherein the image data having the first enhancement format is obtained by:
 (i) executing mixing processing at a second ratio in units of two temporally consecutive pictures to obtain second image data as image data having an enhancement frame at the high frame rate, and
 (ii) executing down-scale processing for the second image data to obtain the image data having the first enhancement format.

* * * * *